(12) United States Patent
Rathnavelu et al.

(10) Patent No.: US 7,382,637 B1
(45) Date of Patent: *Jun. 3, 2008

(54) BLOCK-WRITABLE CONTENT ADDRESSABLE MEMORY DEVICE

(75) Inventors: Sunder R. Rathnavelu, Marlboro, NJ (US); David W. Ng, Redwood City, CA (US); Jose P. Pereira, Cupertino, CA (US)

(73) Assignee: NetLogic Microsystems, Inc., Mountain View, CA (US)

( * ) Notice: Subject to any disclaimer, the term of this patent is extended or adjusted under 35 U.S.C. 154(b) by 493 days.

This patent is subject to a terminal disclaimer.

(21) Appl. No.: 11/022,267

(22) Filed: Dec. 24, 2004

Related U.S. Application Data

(63) Continuation of application No. 10/300,653, filed on Nov. 19, 2002, now Pat. No. 6,876,559, which is a continuation-in-part of application No. 10/062,307, filed on Feb. 1, 2002, now Pat. No. 6,697,276, and a continuation-in-part of application No. 10/061,941, filed on Feb. 1, 2002, now Pat. No. 6,934,796.

(51) Int. Cl.
*G11C 15/00* (2006.01)
(52) U.S. Cl. ............... 365/49; 365/189.05; 365/221
(58) Field of Classification Search ............... 365/49, 365/189.05, 221
See application file for complete search history.

(56) References Cited

U.S. PATENT DOCUMENTS

| | | |
|---|---|---|
| 4,152,762 A | 5/1979 | Bird et al. |
| 4,813,002 A | 3/1989 | Joyce et al. |
| 4,958,377 A | 9/1990 | Takahashi |
| 5,129,074 A | 7/1992 | Kikuchi et al. |
| 5,359,720 A | 10/1994 | Tamura et al. |
| 5,386,413 A | 1/1995 | McAuley et al. |
| 5,414,704 A | 5/1995 | Spinney |
| 5,440,715 A | 8/1995 | Wyland |
| 5,485,418 A | 1/1996 | Hiraki et al. |
| 5,515,370 A | 5/1996 | Rau |
| 5,530,958 A | 6/1996 | Agarwal et al. |
| 5,574,871 A | 11/1996 | Hoyt et al. |
| 5,642,322 A | 6/1997 | Yoneda |
| 5,706,492 A | 1/1998 | Hoyt et al. |
| 5,724,538 A | 3/1998 | Morris et al. |

(Continued)

FOREIGN PATENT DOCUMENTS

WO  WO 01/11630 A1  2/2001

OTHER PUBLICATIONS

Shah, D. and Gupta, P., "Fast Incremental Updates on Ternary-CAMs for Routing Lookups and Packet Classification," IEEE Micro, 21(1), Jan. 2001, pp. 1-9.

(Continued)

*Primary Examiner*—Son Dinh
(74) *Attorney, Agent, or Firm*—Shemwell Mahamedi LLP

(57) ABSTRACT

A content addressable memory device including a memory to store a searchable database, a search circuit, and a first-in-first-out storage circuit. The search circuit generates a plurality of address values that correspond to unoccupied storage locations within the memory, and the plurality of address values are queued within the first-in-first-out storage circuit to enable the address values to be read in succession by an external device.

20 Claims, 48 Drawing Sheets

U.S. PATENT DOCUMENTS

| | | | |
|---|---|---|---|
| 5,818,786 | A | 10/1998 | Yoneda |
| 5,870,324 | A | 2/1999 | Helwig et al. |
| 5,903,751 | A | 5/1999 | Hoyt et al. |
| 5,920,886 | A | 7/1999 | Feldmeier |
| 5,944,817 | A | 8/1999 | Hoyt et al. |
| 5,999,435 | A | 12/1999 | Henderson et al. |
| 6,006,306 | A | 12/1999 | Haywood et al. |
| 6,011,795 | A | 1/2000 | Varghese et al. |
| 6,026,501 | A * | 2/2000 | Hohl et al. .................... 714/38 |
| 6,098,147 | A | 8/2000 | Mizuhara |
| 6,161,144 | A | 12/2000 | Michels et al. |
| 6,199,140 | B1 | 3/2001 | Srinivasan et al. |
| 6,226,710 | B1 | 5/2001 | Melchior |
| 6,289,414 | B1 | 9/2001 | Feldmeier et al. |
| 6,362,992 | B1 | 3/2002 | Cheng |
| 6,370,613 | B1 | 4/2002 | Diede et al. |
| 6,374,349 | B1 | 4/2002 | McFarling |
| 6,389,506 | B1 | 5/2002 | Ross et al. |
| 6,393,544 | B1 | 5/2002 | Bryg et al. |
| 6,499,081 | B1 | 12/2002 | Nataraj et al. |
| 6,700,809 | B1 * | 3/2004 | Ng et al. ...................... 365/49 |
| 6,735,670 | B1 | 5/2004 | Bronstein et al. |
| 7,184,446 | B2 * | 2/2007 | Rashid et al. ............... 370/424 |
| 2003/0093616 | A1 | 5/2003 | Slavin |

OTHER PUBLICATIONS

Waldvogel et al., "Scalable High-Speed Prefix Matching," ACM Transactions on Computer Systems, vol. 19, No. 4, Nov. 2001, pp. 440-482.

Kobayashi, M. and Murase, T., "A Processor Based High-Speed Longest Prefix Match Search Engine," IEEE 2001, pp. 233-239.

Huang et al., "A Fast IP Routing Lookup Scheme for Gigabit Switching Routers," IEEE 1999, pp. 1429-1436.

Huang, Nen-Fu and Zhao, Shi-Ming, "A Novel IP-Routing Lookup Scheme and Hardware Architecture for Multigigabit Switching Routers," IEEE Journal on Selected Areas in Communications, vol. 17, No. 6, Jun. 1999, pp. 1093-1104.

V. Srinivasan and G. Varghese, "Fast Address Lookups Using Controlled Prefix Expansion," ACM Transactions on Computer Systems, vol. 17, No. 1, Feb. 1999, pp. 1-40.

Gupta et al., "Routing Lookups in Hardware at Memory Access Speeds," Proc. Infocom, San Francisco, CA, Apr. 1998, pp. 1-8.

Waldvogel et al., "Scalable High Speed IP Routing Lookups," SIGCOMM, Cannes, France, 1997, pp. 25-35.

A. Broder and M. Mitzenmacher, "Using Multiple Hash Functions to Improve IP Lookups," Proceedings of IEEE INFOCOM, 2001, pp. 1454-1463.

Z. Cao, Z. Wang and E. Zegura, "Performance of Hashing-Based Schemes for Internet Load Balancing," Proc. IEEE INFOCOM 2000, Conf. on Computer Comm., vol. 1, 19th Annual Joint Conf. of the IEEE Computer and Comm. Soc., Tel Aviv, Israel, Mar. 26-30, 2000, pp. 1-10.

V. Srinivasan, S. Suri and G. Varghese, "Packet Classification using Tuple Space Search," Proceedings of SIGCOMM, 1999, pp. 135-146.

D. Knuth, "The Art of Computer Programming, vol. 3, Sorting and Searching, Second Edition," Addison Wesley Longman, 1998, pp. 541-545.

J. Da Silva and I. Watson, "Pseudo-Associative Store with Hardware Hashing," IEE Proceedings, Computers and Digital Techniques, vol. 130, Pt. E, No. 1, Jan. 1983, pp. 19-24.

* cited by examiner

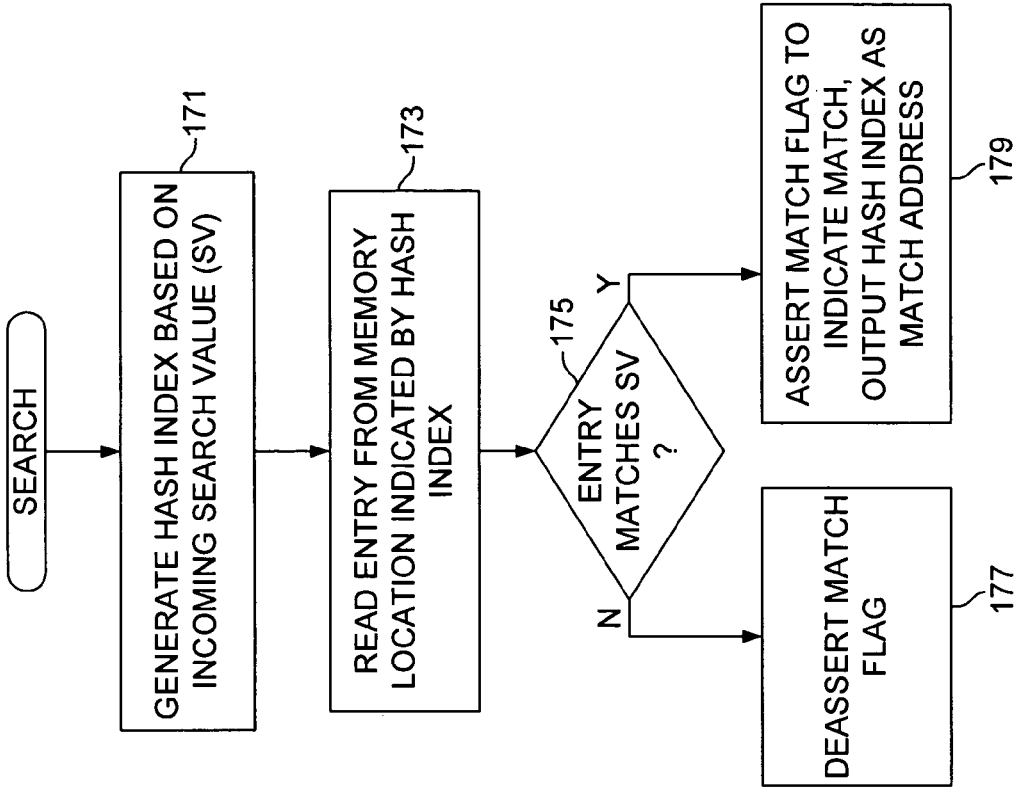
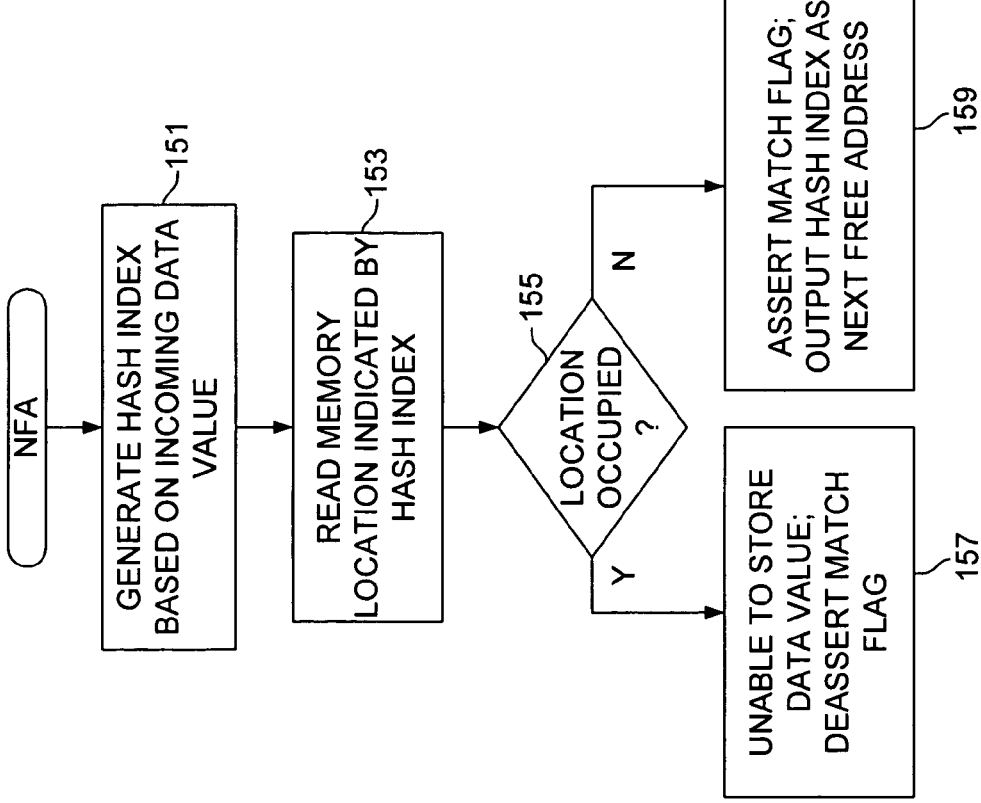

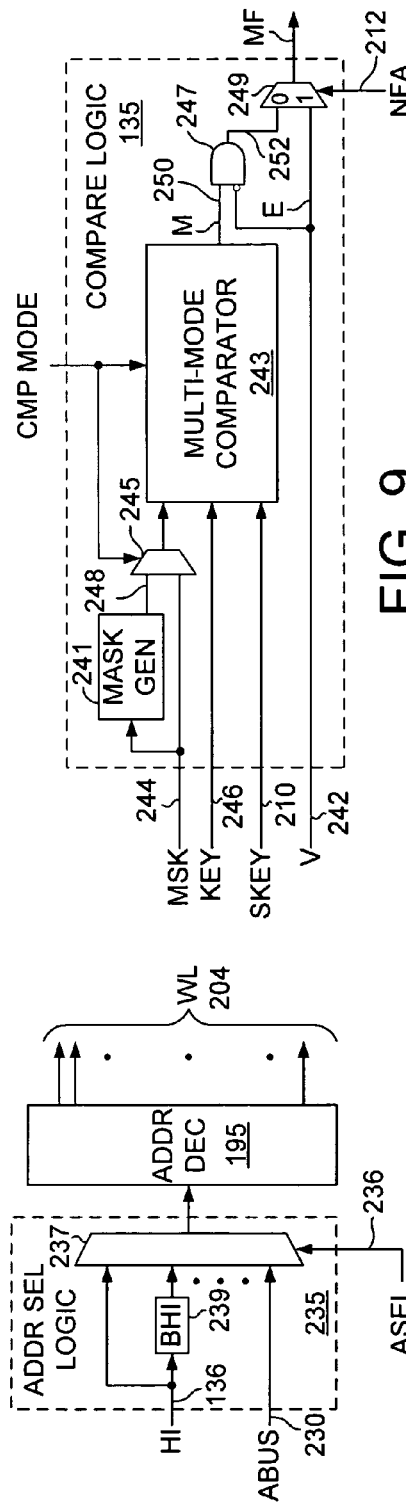
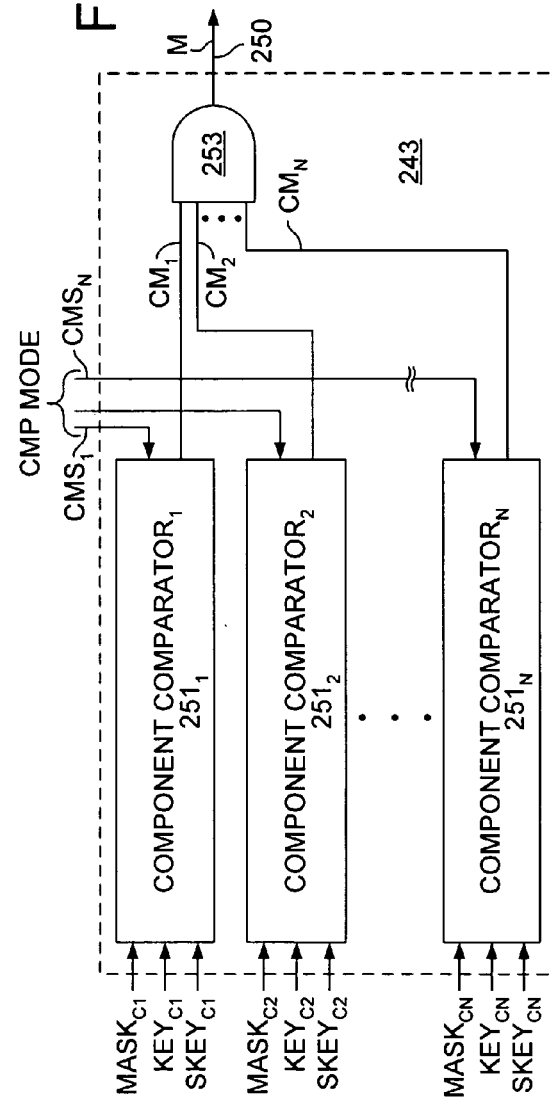

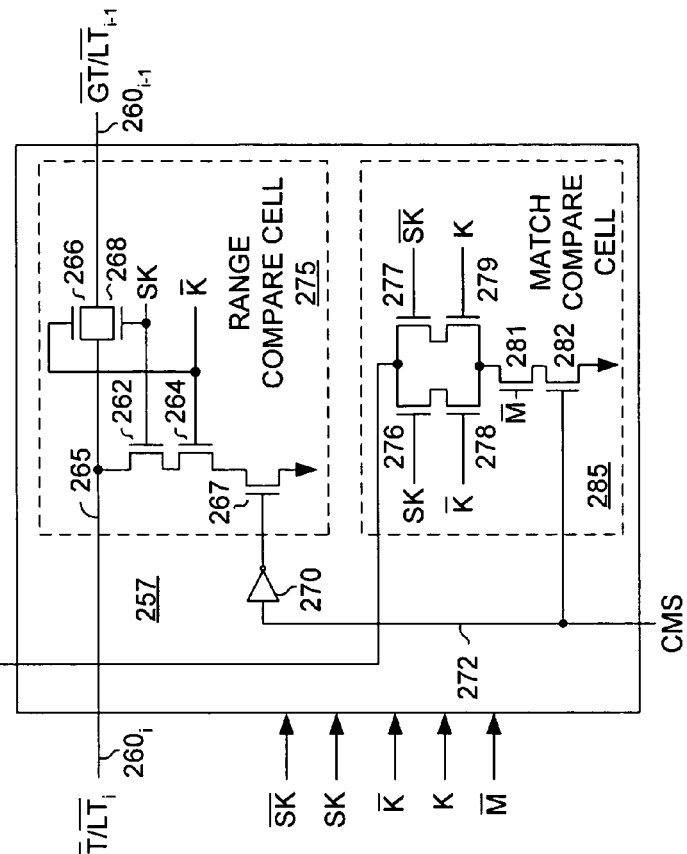
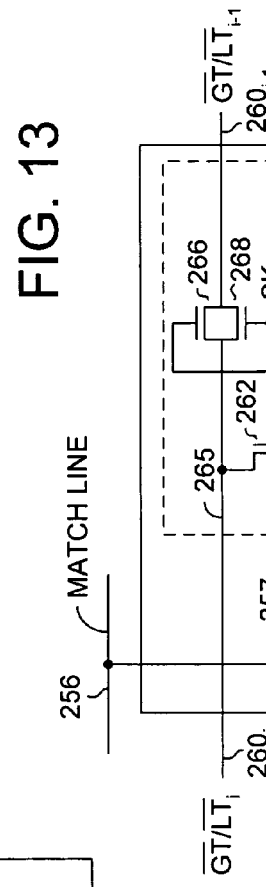
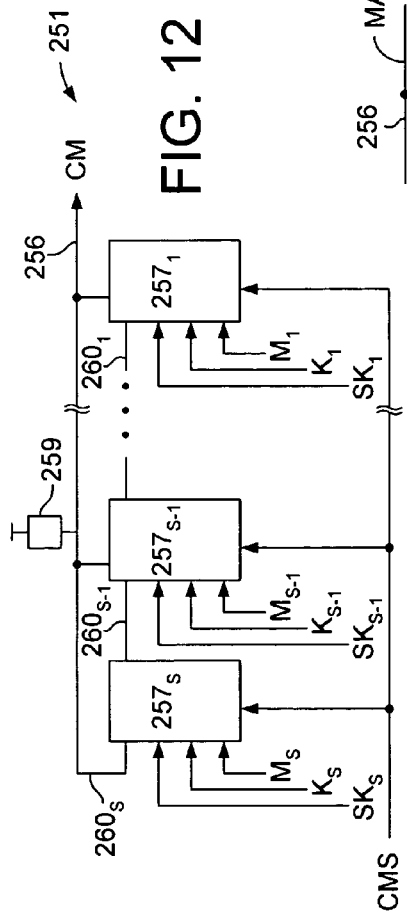

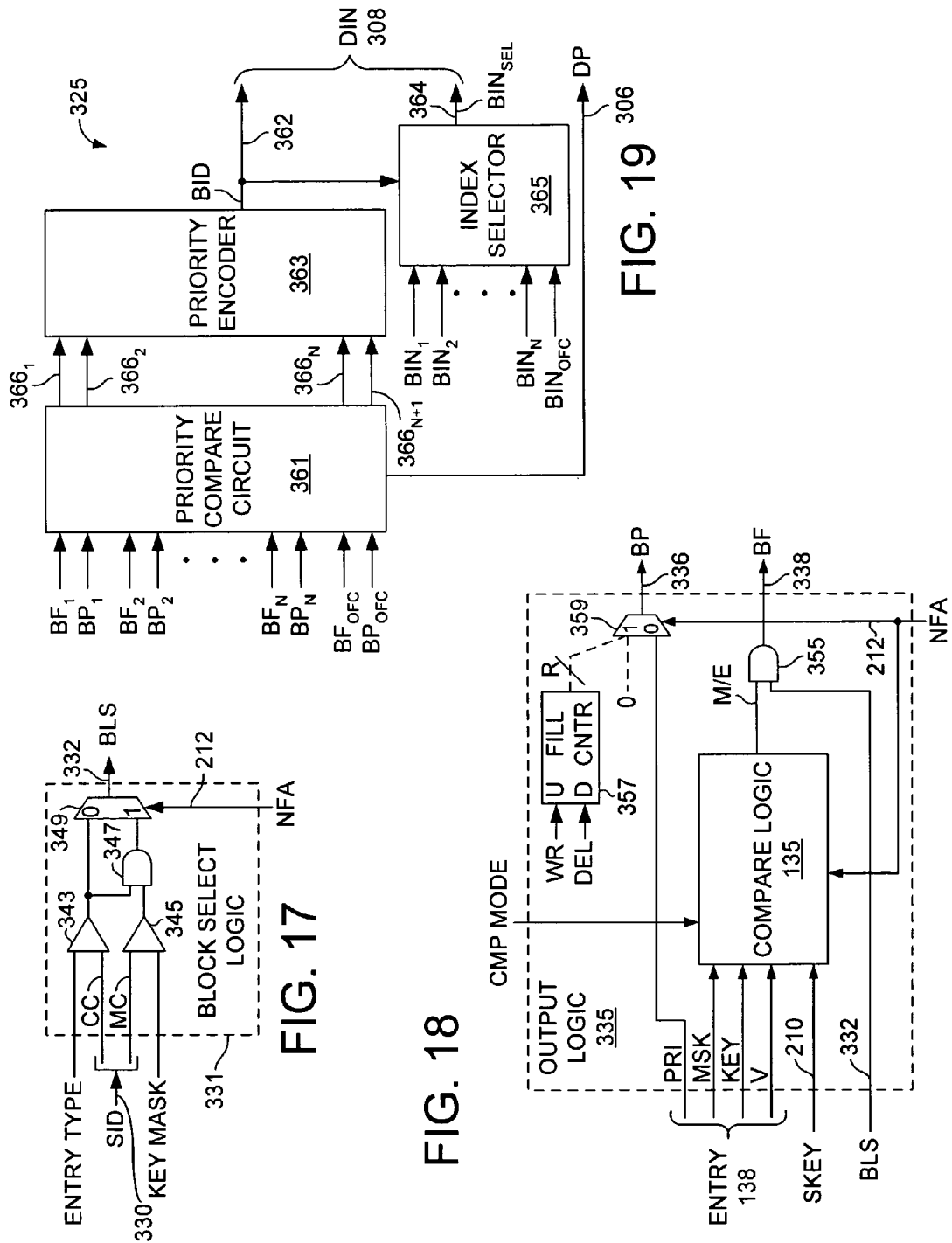

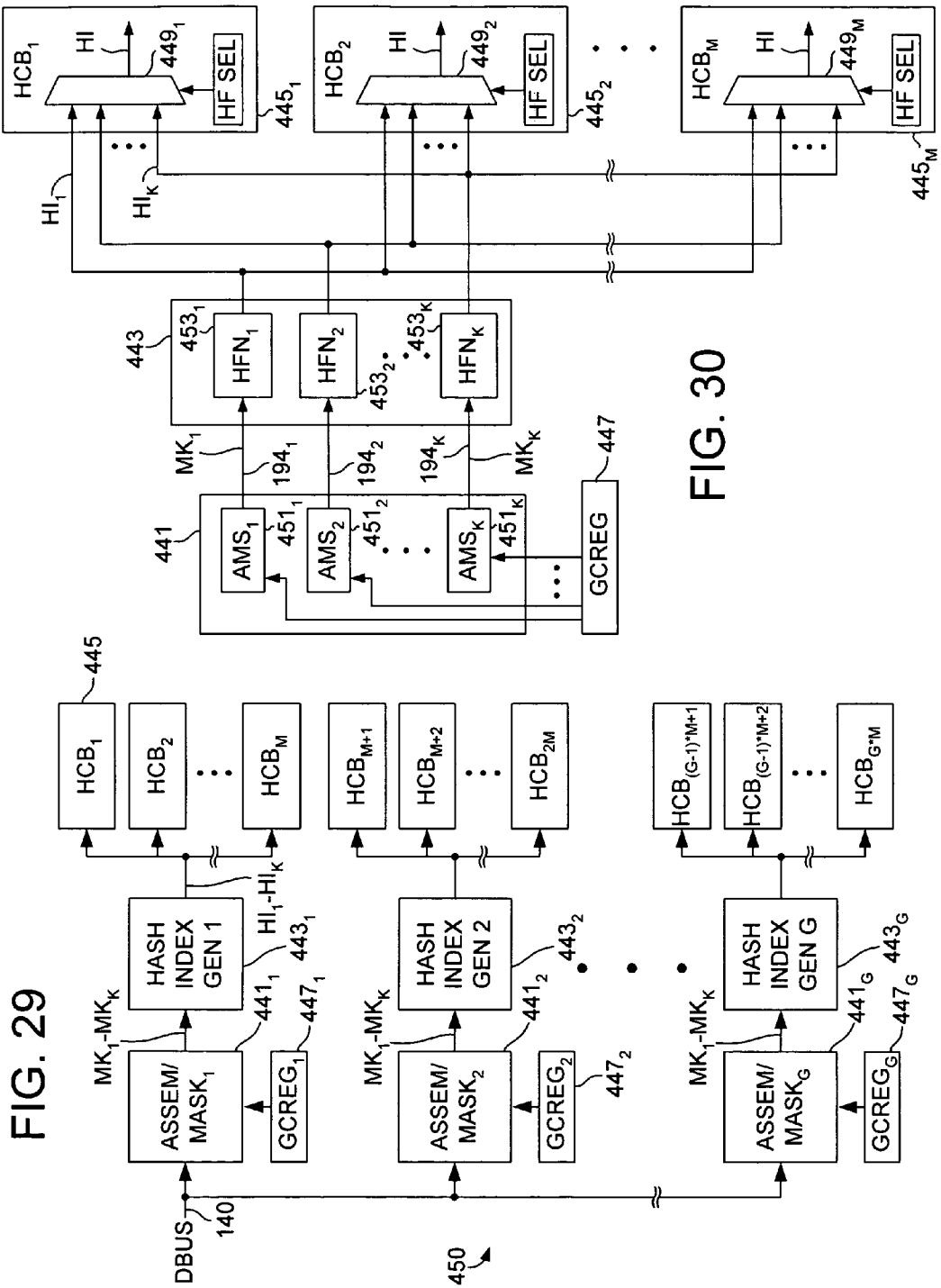

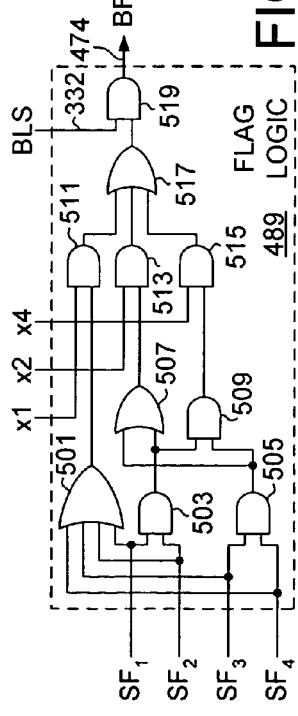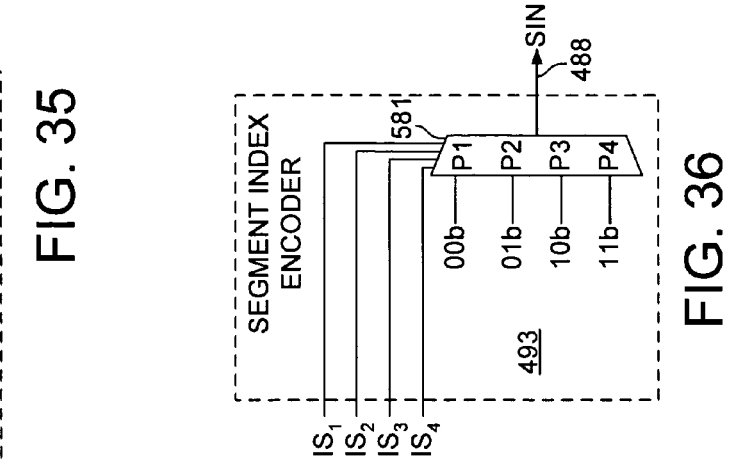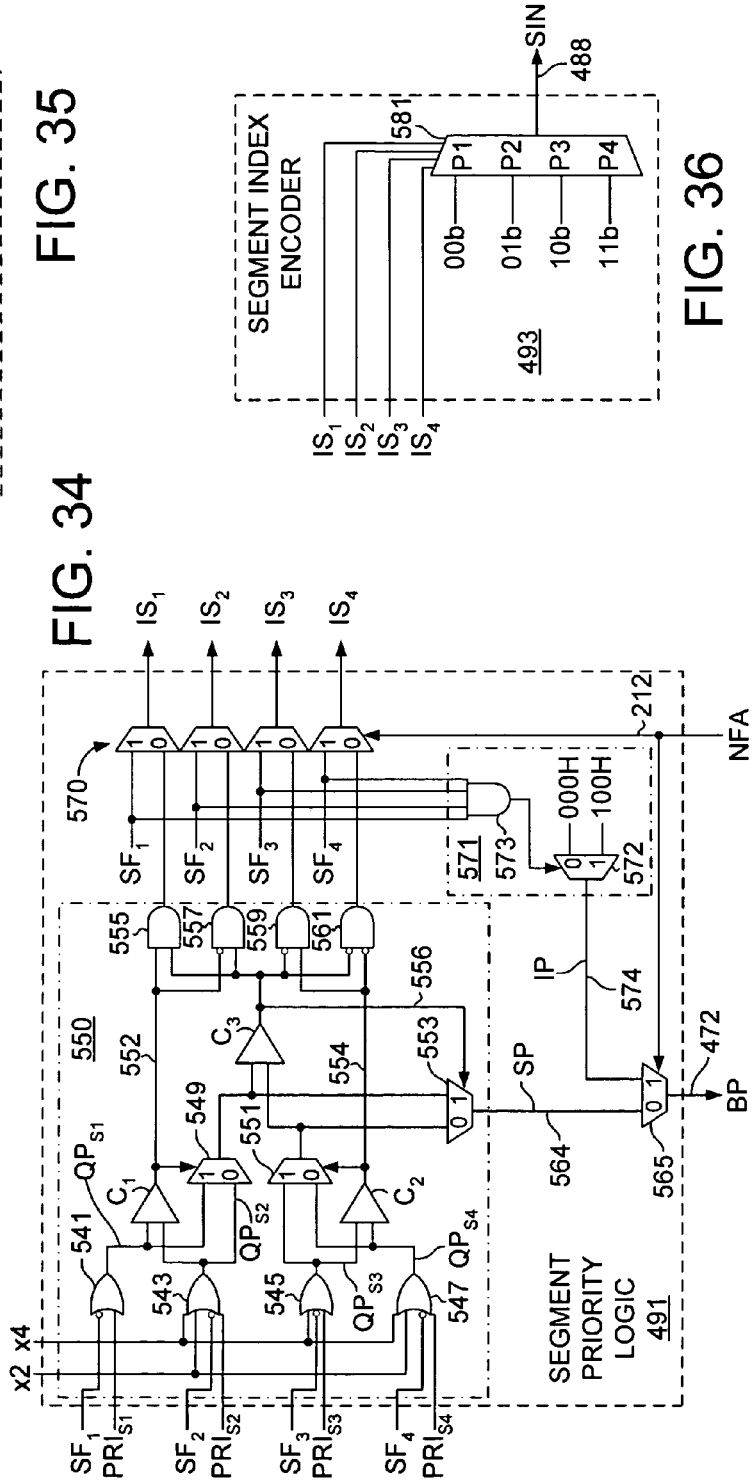

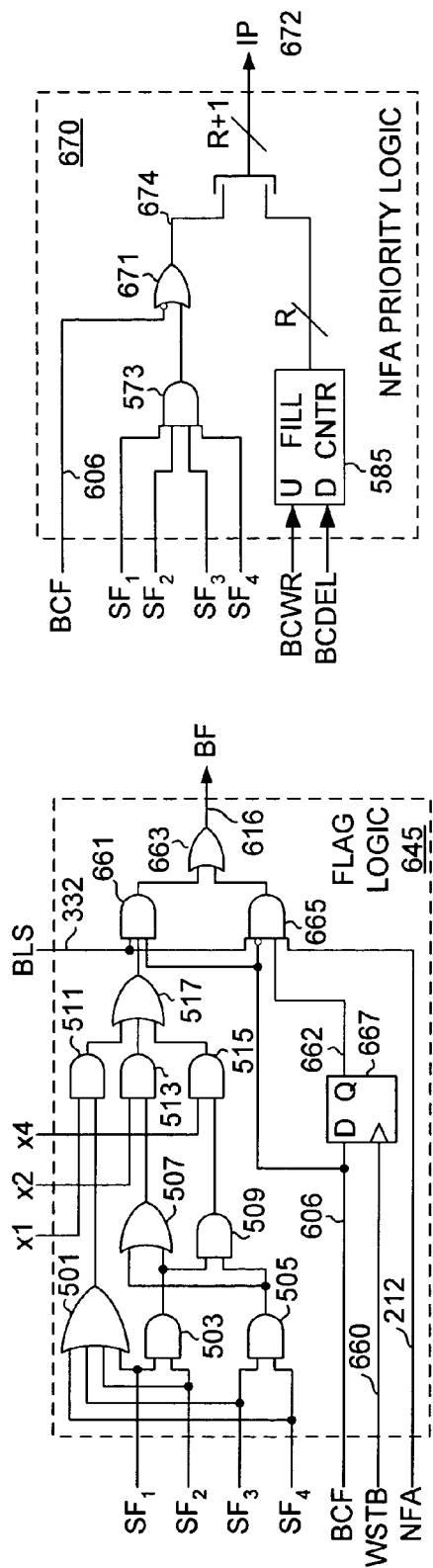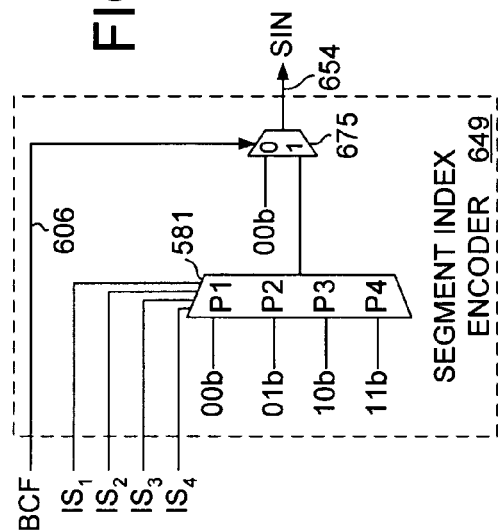
FIG. 45
FIG. 46
FIG. 47

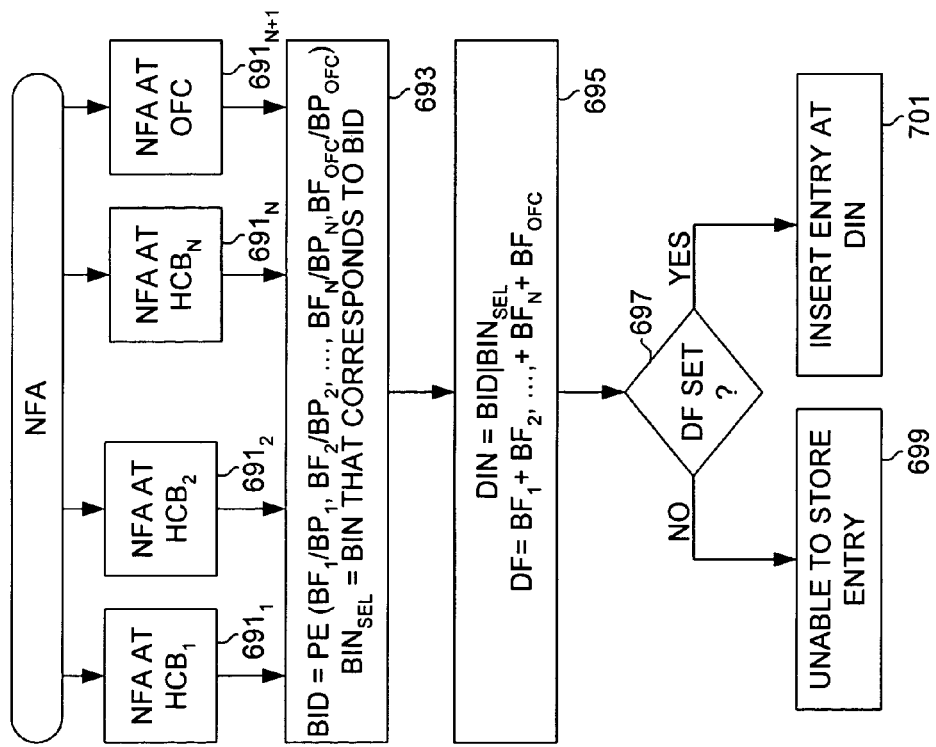

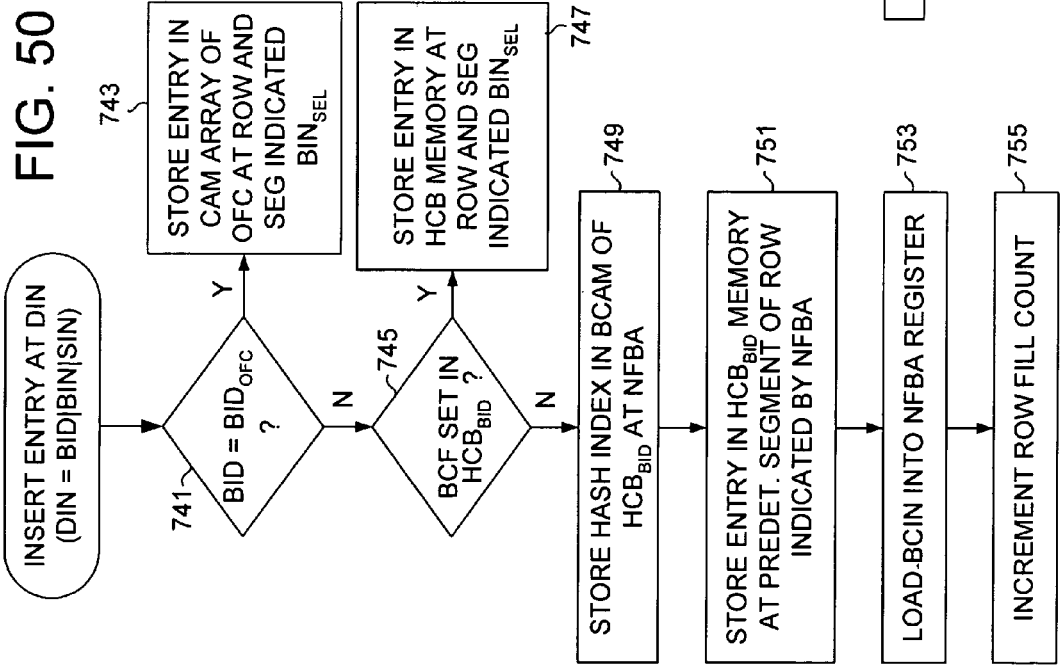

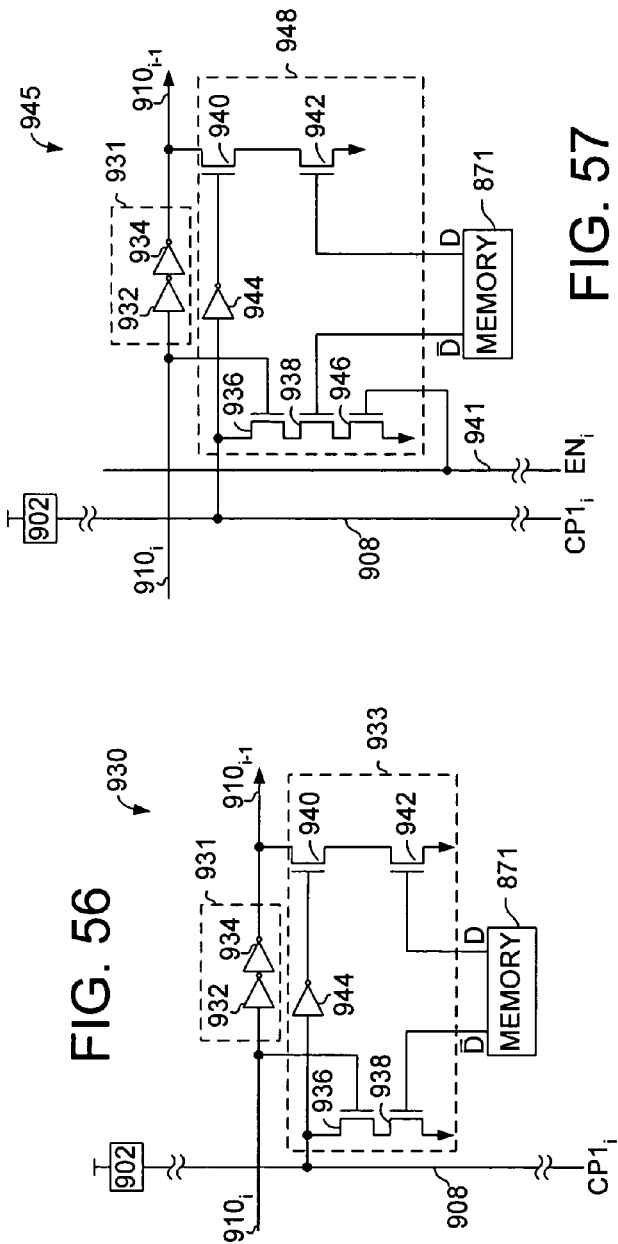
FIG. 57
FIG. 56
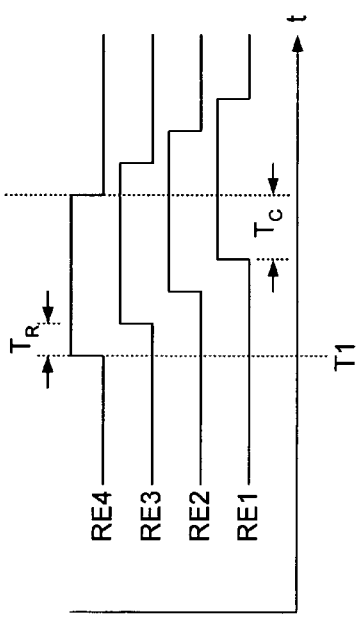
FIG. 58

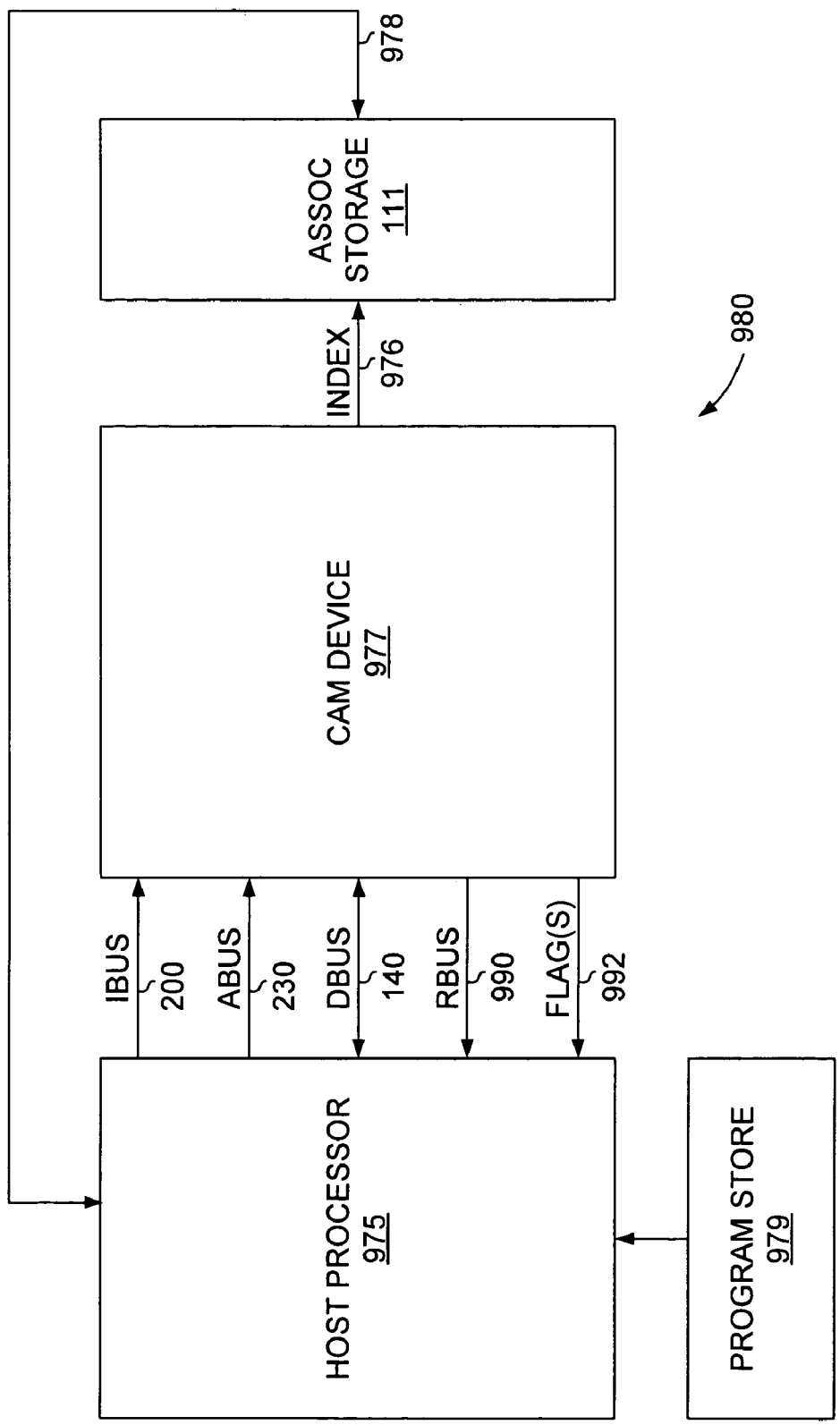

BLOCK-WRITABLE CONTENT ADDRESSABLE MEMORY DEVICE

CROSS-REFERENCE TO RELATED APPLICATIONS

This application is a continuation of U.S. patent application Ser. No. 10/300,653, filed Nov. 19, 2002 now U.S. Pat. No. 6,876,559, which is a continuation-in-part of U.S. patent application Ser. No. 10/062,307, filed Feb. 1, 2002 now U.S. Pat. No. 6,697,276, and a continuation-in-part of U.S. patent application Ser. No. 10/061,941, filed Feb. 1, 2002 now U.S. Pat. No. 6,934,796.

FIELD OF THE INVENTION

The present invention relates generally to information retrieval systems and more particularly to content addressable memory devices.

BACKGROUND

Content addressable memory (CAM) devices are often used to support packet forwarding and classification operations in network switches and routers. A CAM device can be instructed to compare a search value, typically formed from one or more fields within the header of an incoming packet, with entries within an associative storage array of the CAM device. If the search value matches an entry, the CAM device generates an index that corresponds to the location of the matching entry within the storage array, and asserts a match flag to signal the match. The index may then be used to address another storage array, either within or separate from the CAM device, to retrieve routing or classification information for the packet.

FIG. 1 illustrates a prior art CAM device 100 that includes a CAM array 101 coupled to match logic 103 via a plurality of match lines 105 (ML). During a search operation, a search key is compared with the contents of each row of CAM cells 107 within the CAM array 101 to generate a corresponding row match signal. Each row match signal is either asserted or deasserted to indicate a match or mismatch condition, and is output to the match logic 103 via a respective one of the match lines 105. The match logic 103 responds to an asserted match signal by generating a match address 114 (MA) that corresponds to the row of CAM cells 107 that signaled the match, and by asserting a match flag 116 (MF) to indicate the match detection.

Referring to FIG. 2, each CAM cell 107 within the CAM array of FIG. 1 includes both a storage element 123 and a compare circuit 125. During a search operation, a data bit within the storage element is compared to a corresponding bit (BSK) of the search key. If the bits do not match, compare circuit 125 pulls match line 105 low to indicate the mismatch. By integrating a storage element and compare circuit within each CAM cell 107 of the CAM array in this manner, a search key may be simultaneously compared with the contents of each row of CAM cells, thereby providing a massively parallel, and therefore extremely rapid search.

Although the integration of compare and storage circuits within each CAM cell 107 enables simultaneous, multi-row searching within the CAM array, the additional transistors required to implement the compare circuit significantly increases the size of the cell 107, reducing the memory density that can be achieved within the CAM device. Also, because each compare circuit in each row of CAM cells is simultaneously activated during a search operation, a relatively large amount of power is required to perform a search. This power consumption results in heat generation that further limits the storage density that can be achieved within the CAM device (i.e., due to thermal constraints).

BRIEF DESCRIPTION OF THE DRAWINGS

The features and advantages of the present invention are illustrated by way of example and are by no means intended to limit the scope of the present invention to the particular embodiments shown, and in which:

FIG. 4 is a flow diagram for a NFA operation within the hash CAM device of FIG. 3;

FIG. 5 illustrates a search operation within the hash CAM device of FIG. 3;

FIG. 8 illustrates address selection logic which may be included within the hash CAM device of FIG. 6;

FIG. 9 illustrates an embodiment of the compare logic of FIG. 6;

FIG. 10 illustrates an embodiment of the multi-mode comparator of FIG. 9;

FIG. 11 illustrates the structure of a component comparator according to one embodiment;

FIG. 12 illustrates the structure of a component comparator according to another embodiment;

FIG. 13 illustrates a compare cell according to one embodiment;

FIG. 17 illustrates an embodiment of the block select logic of FIG. 16;

FIG. 18 illustrates an embodiment of the output logic of FIG. 16;

FIG. 19 illustrates an embodiment of the device priority logic of FIG. 15;

FIG. 29 illustrates an alternative embodiment of a CAM device that includes multiple hash CAM blocks;

FIG. 30 illustrates a more detailed embodiment of the assembler/mask circuit and hash index generator of FIG. 29;

FIG. 33 illustrates an embodiment of the flag logic of FIG. 32;

FIG. 34 illustrates an embodiment of the segment priority logic of FIG. 32;

FIG. 35 illustrates alternative NFA priority logic that may be used in place of the NFA priority logic of FIG. 34;

FIG. 36 illustrates an embodiment of the segment index encoder of FIG. 32;

FIG. 45 illustrates the flag logic of FIG. 44 according to one embodiment;

FIG. 46 illustrates a NFA priority logic embodiment that may be included within the segment priority logic of FIG. 44;

FIG. 47 illustrates an embodiment of the segment index encoder of FIG. 44;

FIG. 48 is a flow diagram of a NFA operation within a hash CAM device that includes multiple hash CAM blocks each according to FIG. 41;

FIG. 49 is a flow diagram of a NFA operation within the hash CAM block of FIG. 41; and FIG. 50 is a flow diagram of an insert operation within hash CAM device that includes multiple hash CAM blocks each according to FIG. 41;

FIG. 51 is a flow diagram of a search operation within the hash CAM block of FIG. 41.

FIG. 56 shows one embodiment of a priority cell for implementing the truth table of Table 2;

FIG. 57 illustrates an alternate embodiment of a priority cell for implementing the truth table of Table 2;

FIG. 58 illustrates waveforms of enable signals that may be used within a priority index table having priority cells according to FIG. 57;

FIG. 65 illustrates a system that includes a CAM device according to an embodiment of the present invention;

DETAILED DESCRIPTION

Figures 1, 2:
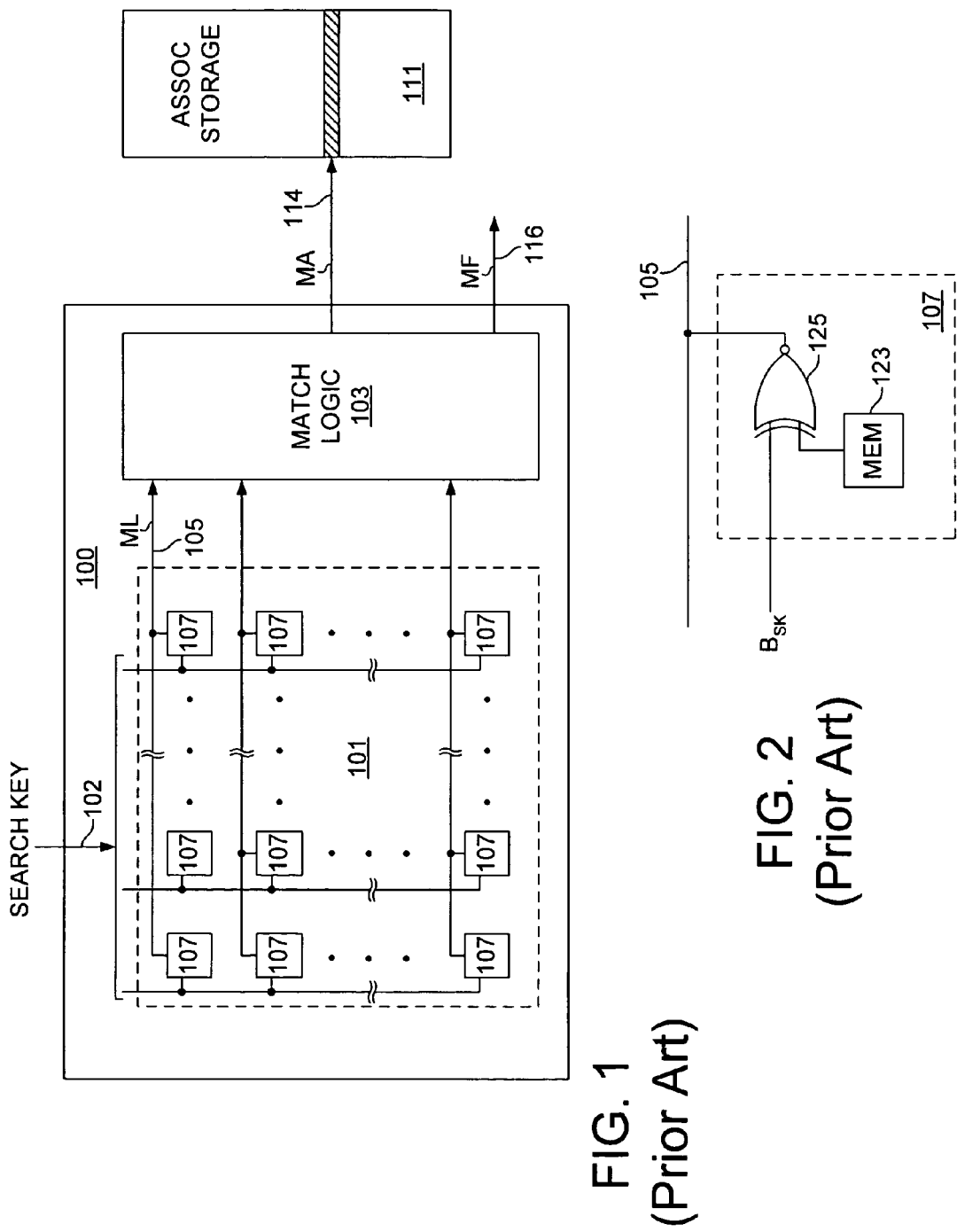
FIG. 1 illustrates a prior art CAM device.
FIG. 2 illustrates a prior art CAM cell.

In the following description, for purposes of explanation, specific nomenclature is set forth to provide a thorough understanding of the present invention. However, it will be apparent to one skilled in the art that these specific details may not be required to practice the present invention. In some instances, the interconnection between circuit elements or blocks may be shown as buses or as single signal lines. Each of the buses may alternatively be single signal lines, and each of the single signal lines may alternatively be buses. A signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '$\overline{\text{<signalname>}}$') is also used to indicate an active low signal. Active low signals may be changed to active high signals and vice-versa as is generally known in the art.

A hash CAM device that includes a memory and hash circuitry to associate a search value with a unique location within the memory is disclosed in numerous embodiments. In contrast to the prior art CAM device described above, a search value is not compared with each entry within an array of CAM cells to locate a matching entry, but rather the search value is input to a hash index generator which generates a search index (i.e., address) to the memory based on the search value itself. Each value stored within the memory was similarly input to the hash index generator to generate a storage index (i.e., memory address at which the value is stored) so that, if the search value matches a previously stored value, the search index and storage index will match. Accordingly, a match may be detected by comparing the search value with the entry stored at the search index. If the entry and search value match, a match flag is asserted to indicate the match detection and the search index is output as the match address. Because compare circuits need not be included within each storage cell of the device memory, a significantly higher memory density may be achieved in the hash CAM device than in the prior art CAM device described above. Also, because a search value is compared with only one memory entry per search (as opposed to comparing a search value with all entries within a CAM array), significantly less power is required to search the hash CAM device than the prior art CAM device described above.

Overview of a Hash CAM Device

Figure 3:
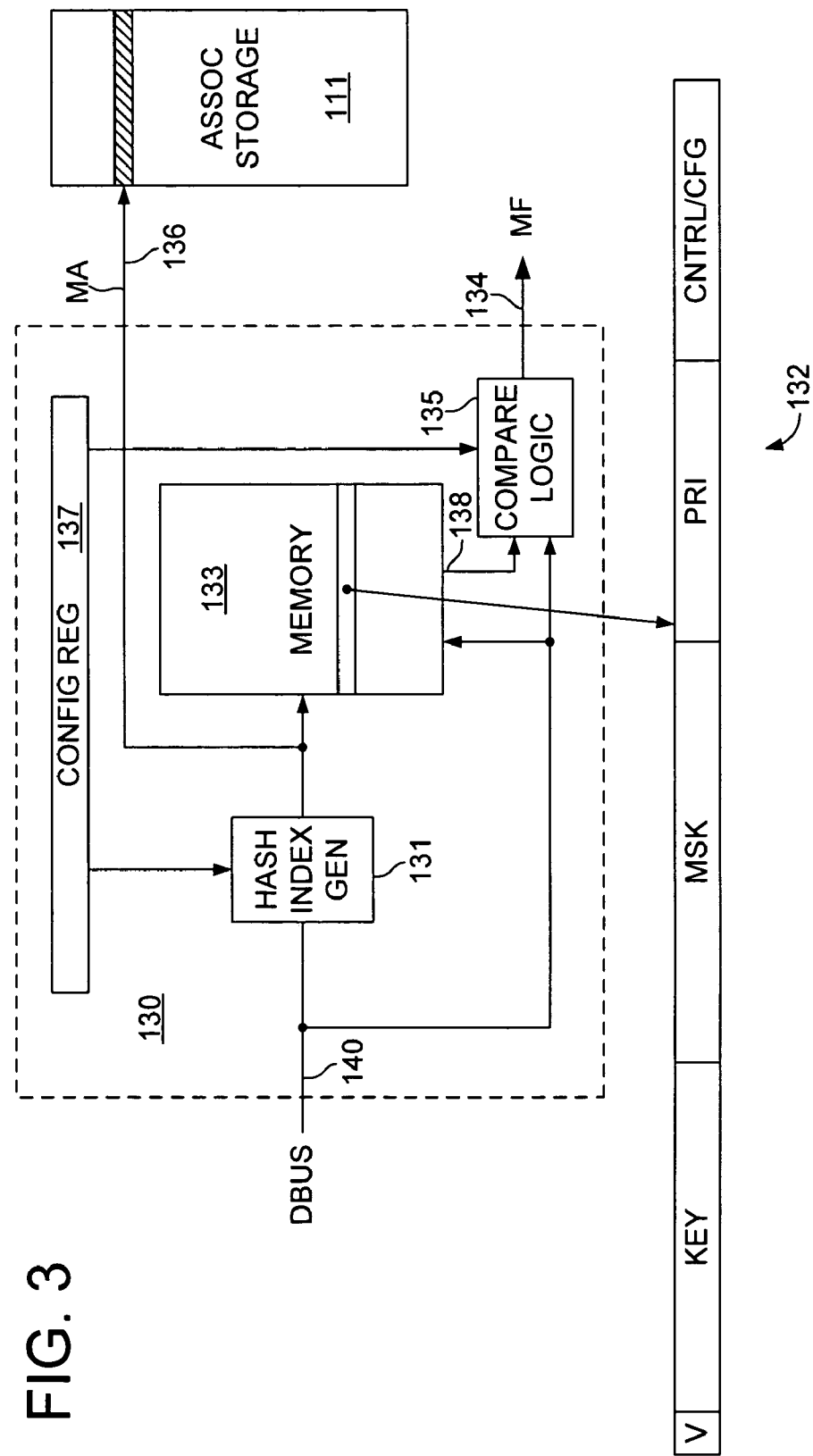
FIG. 3 illustrates a hash CAM device according to an embodiment of the present invention.

FIG. 3 illustrates a hash CAM device 130 according to an embodiment of the present invention. The hash CAM device 130 includes a hash index generator 131, memory 133, compare logic 135 and, optionally, a configuration register 137. A data bus 140 is coupled to the hash index generator 131 and to the compare logic 135 to provide input data values during load operations and search operations. The hash CAM device 130 may also include an instruction decoder (not shown) to generate timing and control signals in response to instructions from a host device, such as a network processor, general purpose processor, application specific integrated circuit (ASIC) or any other instruction-issuing device.

Each data value stored in the memory 133 is referred to herein as an entry (shown generally at 132) and includes at least a key, KEY, and validity value, V. The key is formed from selected bits within the input data value and is input, at least in part, to the hash index generator 131 to generate the hash index at which the entry is stored (i.e., the storage index). The validity value may include one or more bits and is used to indicate the presence of a valid entry. An entry 132 may optionally include mask information, MSK (e.g., a mask value to be applied during a comparison operation, or an encoded value that can be decoded to generate a mask value), a priority value, PRI, which is a numeric value that indicates a priority of the entry relative to other entries, and control/configuration information, CNTRL/CFG, that may be used to control certain operations within the hash CAM device 130. The priority values included within the various entries within memory 133 may be assigned in ascending priority order (i.e., lower numeric values indicate a higher priority than higher numeric values) or descending priority order (i.e., higher numeric values indicate a higher priority than lower numeric values). In the description that follows ascending priority order is generally assumed, though descending priority order may be alternatively be used. Also, in alternative embodiments, non-numeric values may be used to indicate priority (e.g., codewords or other indications of priority may be used).

Loading and Searching the Hash CAM

The hash index generator 131 ideally generates a unique storage index for each value to be loaded into the memory 133. For most applications, however, it is desirable for the hash index to be smaller (i.e., contain fewer constituent bits) than the corresponding input value, meaning that two or more different input values may yield the same storage index; an event referred to herein as a collision. Accordingly, before loading an input value into the memory 133, it is desirable to determine whether the input value will yield an index to an occupied or unoccupied storage location within memory 133 (i.e., determine whether a collision will occur). Otherwise, a previously loaded entry may be unknowingly overwritten. In one embodiment, a collision determination is achieved through a special type of search operation referred to herein as a next free address (NFA) operation. In a NFA operation, the value to be stored, referred to herein as an entry candidate, is provided in whole or part to the hash index generator 131 to produce a hash index 136. The entry, if any, at the indexed location (i.e., the storage location within memory 133 indicated by the hash index) is output to the compare logic 135 which, in turn, asserts or deasserts the match flag 134 according to the state of the validity value of the entry. If the validity value indicates the presence of a valid entry, a collision between the entry candidate and an existing entry (i.e., a previously loaded entry) has occurred, and the compare logic 135 deasserts the match flag 134 to indicate the conflicting occupation of the indexed memory location and that the candidate input value cannot be stored. If the validity value does not indicate the presence of a valid entry, the compare logic 135 asserts the match flag 134 to indicate that the indexed memory location is unoccupied. The candidate input value is subsequently stored in the memory 133 at the indexed location in an operation referred to herein as an insert operation.

During a search operation, a search value received via the data bus is input to the hash index generator to generate a hash index 136 referred to herein as a search index. The indexed entry 138 (i.e., entry at the location indicated by the search index) is output to the compare logic 135 which compares the entry with the search value. If the entry matches the search value, the match flag 134 is asserted to indicate the match condition. The search index (i.e., hash index 136) is output as the match address and may be used to access an associated storage 111, for example, to retrieve forwarding, classification, policing or other information associated with the entry. If the entry does not match the search value, the match flag 134 is deasserted to indicate that no match was detected within the hash CAM device 130 and, for example, may be used to qualify the read from the associated storage 111.

FIG. 4 is a flow diagram for a NFA operation within the hash CAM device of FIG. 3. Initially, at 151, a hash index is generated based on an incoming data value. At 153, memory is read at a location indicated by the hash index. If the location is determined to be occupied at 155 (e.g., based on the validity value at the indexed location), the hash CAM device is unable to store the incoming value and the match flag signal is deasserted at 157. If the location is determined to be unoccupied at 155, the hash CAM device asserts the match flag and outputs the hash index as the next free address at 159. The data value may then be stored in the memory location indicated by hash index in a subsequent insert operation.

FIG. 5 illustrates a search operation within the hash CAM device of FIG. 3. At 171, a hash index is generated based on an incoming search value. At 173, an entry is read from the memory at a location indicated by the hash index. The entry is compared with the search value at 175. If the entry matches the search value, then at 179 the match flag is asserted to indicate the match detection, and the hash index is output as the match address. If the entry does not match the search value, the match flag is deasserted at 177.

Figure 6:
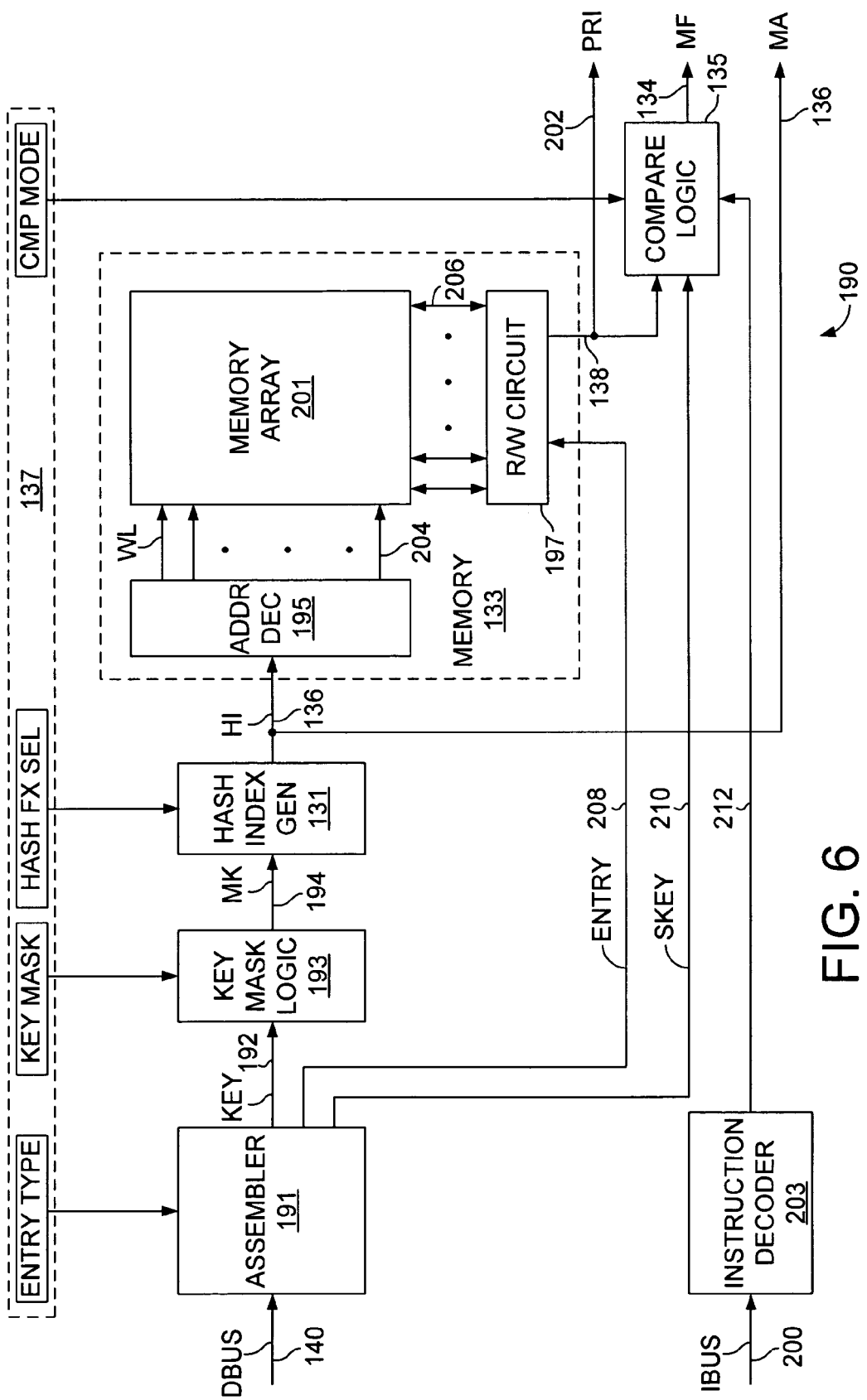
FIG. 6 illustrates an embodiment of a hash CAM device in greater detail.

FIG. 6 illustrates an embodiment of a hash CAM device 190. The hash CAM device 190 includes an assembler circuit 191, key mask logic 193, hash index generator 131, memory 133, compare logic 135, configuration register 137, and instruction decoder 203. The instruction decoder 203 is coupled to an instruction bus 200 to receive instructions from a host device (e.g., network processor, general purpose processor, application specific integrated circuit (ASIC) or any other instruction issuing device), and outputs control and timing signals to other circuit blocks within hash CAM device 190 to carry out the instructed operations. In one embodiment, the primary operations carried out in response to the incoming instructions are NFA, insert and search operations, though numerous other operations may be performed including, without limitation, memory read operations, memory write operations directed to explicitly provided addresses, test operations and so forth.

In one embodiment, the assembler circuit 191 assembles the key, mask information, priority and/or control/configuration values (referred to herein as entry components) from potentially dispersed fields of bits within an incoming data value. An entry type value programmed within the configuration register 137 indicates the location of the bit fields within the incoming data value and is provided to the assembler circuit 191 to enable the assembler circuit to properly assemble the entry components of differently formatted data types (e.g., IPv4 (Internet Protocol version 4), IPv6 (Internet Protocol version 6), MPLS (Multiprotocol Label Switching), etc.). The complete set of assembled entry components constitutes an entry 208 and is output from the assembler circuit to a read/write circuit 197 within the memory 133 for storage in an insert operation. The assembler circuit 191 also outputs the assembled key 192 to the key mask logic 193, and to the compare logic 135. The key provided to the compare logic 135 is referred to herein as a search key 210. Note that, in one embodiment, the key 192 and search key 210 are the same assembled portion of an incoming value, but are nonetheless referred to herein by different names and reference numerals.

The key mask logic 193 receives the key 192 from the assembler circuit 191 and masks selected portions of the key according to a key mask value programmed within the configuration register 137. The resulting masked key 194 is provided to the hash index generator 131. The hash index generator 131 generates a hash index 136 based on the masked key 134. As discussed above, the hash index is used during NFA and search operations to access a location within the memory 133.

Figure 7:
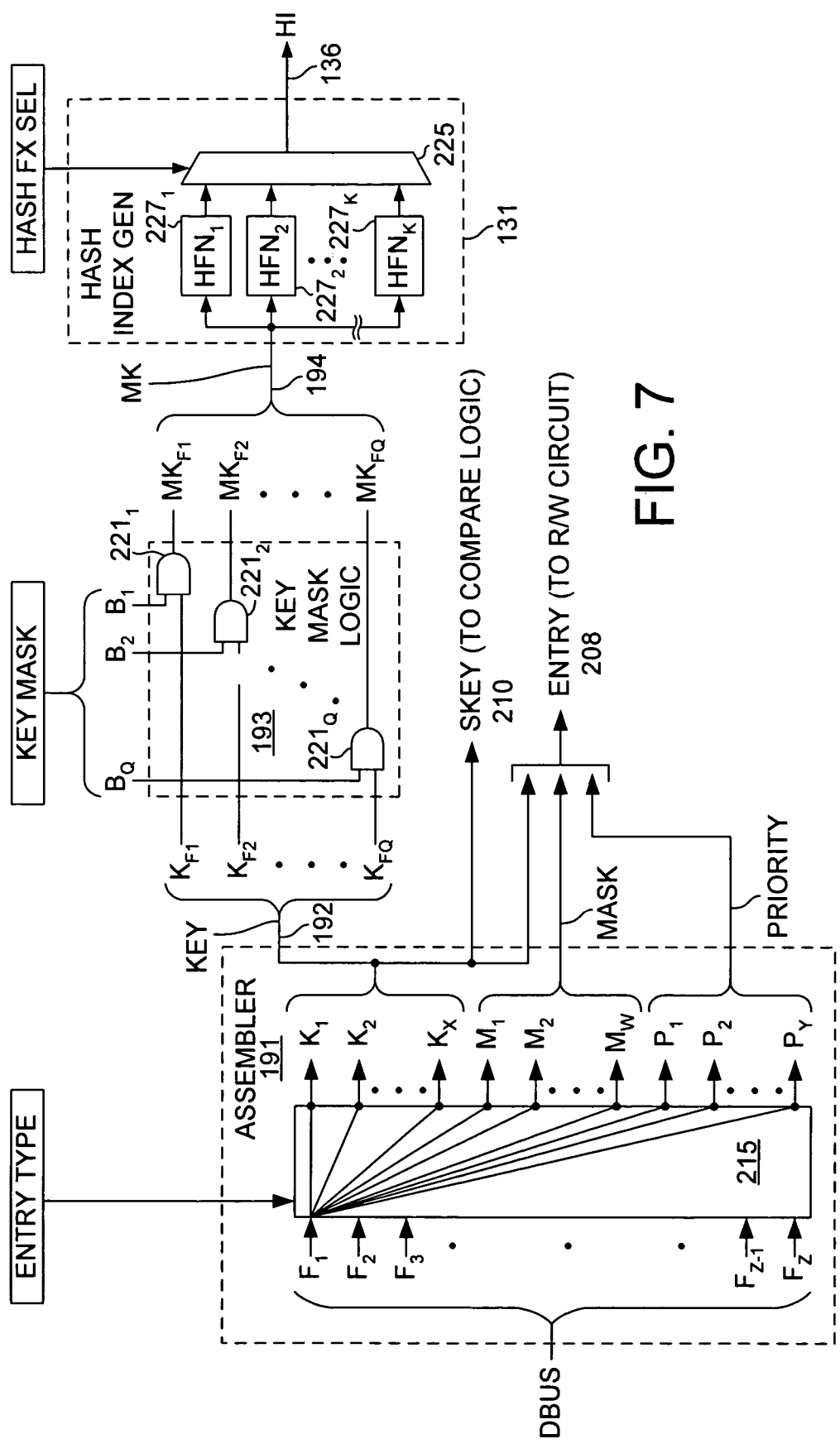
FIG. 7 illustrates an embodiment of the assembler circuit, key mask logic and hash index generator of FIG. 6.

FIG. 7 illustrates an embodiment of the assembler circuit 191, key mask logic 193 and hash index generator 131 of FIG. 6 (other embodiments may be used). Referring first to the assembler circuit 191, bit fields $F_1$-$F_Z$ of an incoming data value are assembled according to the programmed entry type value to produce a key having constituent bit fields $K_1$-$K_X$, mask information having constituent bit fields $M_1$-$M_W$, and a priority value having constituent bit fields $P_1$-$P_Y$. As mentioned above, the mask information and/or priority value may be omitted depending upon the entry type of the incoming data value. Also, other entry components such as a control/configuration value may be assembled in alternative embodiments. The complete set of entry components form entry 208 and is output to the read/write circuit, while the key 192 is output to the key mask logic and also, as search key 210, to the compare logic. Note that the constituent bit fields $F_1$-$F_Z$ of the incoming data value are not necessarily all the same size. Similarly the constituent bit fields of the key, mask, and priority value may be differently sized.

In one embodiment, Q equally sized bit fields, $K_{F1}$-$K_{FQ}$, within the key 192 are selectively masked by the key mask logic 193 according to a key mask value stored in the configuration register. In one embodiment, for example, each of the Q fields is a 4-bit field that is selectively masked (i.e., forced to a predetermined logic state) by a corresponding bit, $B_1$-$B_Q$, within the key mask value. In the key mask logic 193 of FIG. 7, the bits within a given one of the Q fields are forced to a logic low state by a corresponding one of AND gates $221_1$-$221_Q$ if the corresponding key mask bit is low. In alternative embodiments, the Q fields may each include more or fewer than four bits and may be a single bit. In any case, the resulting masked key 194 is output to the hash index generator 131.

Extending the embodiment to cover ternary searches presents some challenges. In a ternary search, some of the bit fields of a search key (or other portion of the search value) may be masked and are considered as don't cares during a search operation. In the following description, the unmasked portion of a key is called the invariant portion and the masked portion (don't care portion) is called the variant portion. If the hash index were to be calculated on the entire search key, (including the variant and invariant portions of the entry) then the hash index when inserting an entry can potentially be different than the hash index calculated during a search, even though the search value may match the entry (i.e., when selected bits are masked during the compare operation). From a search perspective, introducing the key mask logic 193 effectively isolates the invariant portions of the key 192 both in the insertion as well as the search operations, forming the basis for generation of a unique hash index for each input value. It is not necessary to use the entire invariant portion of the key for hash index generation; it can be a sub-set of the invariant portion. As an example, consider Table 1 below which illustrates how the key mask is chosen and illustrates the operation of a key mask logic circuit. The entries are ternary entries and the variant portions are shown with an 'X'. Each bit of an 8-bit key mask value corresponds to a respective 4-bit field within a 32-bit input key (the symbol 'h' indicates hexadecimal notation and the symbol 'b' indicates binary notation):

TABLE 1

| Entry # | Entry value 192 | Key Mask Value: 1100 0011b After Circuit 193 |
|---|---|---|
| 1 | XX5A5B5Ah | 005A5B00h |
| 2 | FF5A5AXXh | 005A5A00h |
| 3 | FE5A5AXXh | 005A5A00h |

In the above example, the key mask value masks the first and last bytes (i.e., 8 bits) of the input key, thereby establishing the first and last bytes as the variant (don't care) components of the entries and the middle two bytes of the entries as the invariant components of the input key. Note that if two entries are identical after going through the key mask circuit, they will, as in the example above, yield identical hash indices. Conversely, if two input keys have different invariant portions, the masked keys will be different and, in general, will yield different hash indices.

As can be seen, the key mask value may be chosen so that the variant portion of all the entries in the search table are in effect set to a known, pre-defined value (in this case binary 0). The search process can be illustrated with an example. If the search key of FF5A5A3Ch is presented, this key goes through the same key mask circuit and will generate the same index as entry#2 in the table, and will also result in a match.

Thus, by programming the key mask value to define a desired invariant component (or components) within an input key, a degree of key masking (i.e., in the variant components) may be achieved within the hash CAM device. This key masking feature may be used to achieve ternary CAM operation within a system that contains multiple hash CAM devices by programming a different key mask value into the configuration register of each hash CAM device, and storing each input value in a CAM device selected according to the invariant/variant key components of the input value. For example, a first hash CAM device may be assigned a key mask value that defines bits 24-31 of an IPv4 destination address as a don't care field (i.e., variant key component) and bits 0-23 of the destination address as a invariant key component, while a second hash CAM device may be assigned a key mask value that defines bits 16-23 of the IPv4 destination address as variant key component, and bits 0-15 and 24-31 as a invariant key component. Thereafter data values may be loaded into either the first hash CAM device or the second hash CAM device according to whether bits 24-31 or 16-23 may be masked during a search operation. This technique for achieving ternary CAM operation is discussed in further detail below.

Still referring to FIG. 7, the hash index generator 131 includes K hash function circuits $227_1$-$227_K$, each of which applies a different hash function to the masked key 194. A hash function select value stored in the configuration register is used to select, via multiplexer 225, one of the hash index functions $227_1$-$227_K$ to output the hash index 136. By this arrangement different hash CAM devices within a system may be programmed to use different hash functions to reduce the system-wide likelihood of collisions. To understand why different hash function selections reduce collision likelihood, consider an example in which two entries having identical invariant key patterns are stored in hash CAM devices having different hash function selections. During a subsequent NFA operation in which an entry candidate having a different invariant key pattern than the entries is input to both hash CAM devices, the entry candidate may, by happenstance, collide with the entry in one of the hash CAM devices but, due to the different hash function selections, is statistically unlikely to collide with the entries in both of the hash CAM devices. By contrast, if the same hash function is used within each of the two hash CAM devices, happenstance collision between entry candidate stored entry will occur in both CAM devices (i.e., the number of collisions is doubled). Thus, the use of different hash functions in different hash CAM devices within the same system may reduce the system-wide likelihood of collisions.

Still referring to FIG. 7, in one embodiment, the hash index generator 131 includes four hash function circuits $227_1$-$227_4$ each of which generates a respective hash index by dividing the masked key by a different cyclic redundancy check (CRC) polynomial. That is, each of the four hash function circuits 227 is a CRC circuit that generates a different hash index using the same masked key 194. Numerous other hash index generation circuits may be used in alternative embodiments, including encryption circuits, checksum circuits, bit-reordering circuits, or any other circuit to process the search value or a portion thereof to generate a hash index (herein processing a value refers to receiving the value as an input, and generating a different value in response). More generally, while the hash function circuits within the hash index generator are preferably designed to generate non-colliding hash indices for a broad range of input values, any circuit that returns an index (i.e., address) to the memory within the hash CAM block based on all or a selected portion of an input value may be used to implement a hash function circuit 227 without departing from the spirit and scope of the present invention. Also, the assembler circuit 191, key mask logic 193 and hash index generator 131 may viewed collectively to be a hash index generator.

Referring again to FIG. 6, the memory 133 includes a memory array 201, an address decoder 195 coupled to the memory array 201 via a plurality of word lines 204, and a read/write circuit 197 coupled to the memory array 201 via a plurality of bit lines 206. As discussed above, compare circuits are not integrated with storage elements within the memory array 201 (i.e., the memory array does not include CAM cells) so that a significantly higher storage density may be achieved in memory 133 than in the prior art CAM device of FIG. 1. In one embodiment, the storage elements used to implement the memory array 201 are static random access memory (SRAM) storage cells, though dynamic RAM cells or any other form of storage cells may alternatively be used.

The address decoder 195 receives the hash index 136 from the hash index generator 131 and decodes the hash index to activate one of the word lines 204. The activated word line switchably couples a corresponding row of storage elements within the memory array 201 to the bit lines 206, thereby enabling read and write access to the storage elements (i.e., the selected row). In a memory read, for example, during a NFA or search operation, the contents of the selected row is output via the bit lines 206 to a bank of sense amplifiers within the read/write circuit 197. The sense amplifiers sense the contents of the selected row and output the sensed data to the compare logic as entry 138. In a memory write (e.g., during an insert operation), a bank of write drivers within the read/write circuit 197 drives an entry 208 onto the bit lines for storage within the selected row.

FIG. 8 illustrates address selection logic 235 which, though not shown in FIG. 6, may be included within the hash CAM device to enable selection of memory addresses from different sources. For example addresses may be provided via address bus 230 (e.g., to enable testing of the memory array 201). Also, in one embodiment, a register 239 is provided to buffer the hash index generated during a NFA operation. If the indexed location is determined not to be occupied, register 239 may be selected to provide the address for entry storage during a subsequent insertion operation. Also, during a NFA or search operation, the hash index 136 is selected to address the memory 133. Additional address sources may be provided in an alternative embodiment. In the embodiment of FIG. 8, address selection is performed by a multiplexer 235 in response to an address select signal 236 (ASEL). The address select signal 236 may be provided, for example, by the instruction decoder 203 of FIG. 6 or from another source.

Returning again to FIG. 6, the compare logic 135 operates as discussed in reference to FIG. 3 to generate a match flag 134. That is, during a NFA operation, the compare logic 135 outputs a match flag that indicates whether the memory location selected by the hash index is occupied. During a search operation, the compare logic 135 outputs a match flag 134 that indicates whether the search key 210 matches an entry 138 output from a memory location selected by the hash index. A NFA signal 212 from the instruction decoder 203 is provided to the compare logic 135 to select between different match flag sources according to whether a NFA operation or search operation is being performed.

FIG. 9 illustrates an embodiment of the compare logic 135 of FIG. 6. The compare logic 135 receives an entry (i.e., entry key 246, mask information 244 and validity value 242) from the memory array and the search key 210 as inputs, and includes a multi-mode comparator 243, mask generator 241, multiplexers 245 and 249, and AND gate 247. The mask generator 241 decodes the mask information 244 into a decoded mask value 248. Multiplexer 245 selects, according to a compare mode value within the configuration register, either the decoded mask value 248 or the mask information 244 to be input to the multi-mode comparator 243 as the selected mask value. Thus, if the mask information represents an encoded mask value (e.g., as in the case of a prefix value included with an IPv4 entry type), the mask generator will decode the prefix value to generate a corresponding decoded mask value, and the compare mode value is programmed to select the decoded mask value 248 for input to the multi-mode comparator 243. Alternatively, if the mask information is a mask value rather than an encoded mask value, the compare mode value may be programmed to select the mask information 244 to be input to the multi-mode comparator 243. One example of an encoded mask value is a prefix length value that indicates the number of unmasked bits within an IPv4 or IPv6 address field. In the case of IPv4, for example, the prefix length value is a 5-bit value that indicates how many bits within a 32 bit address field of an IPv4 packet are to be unmasked. Thus, a n-bit prefix length value may be decoded by mask generator 241 to produce a 2n bit mask value having a mask (and unmask) bit pattern according to the numeric value of the prefix length. For one example, when the prefix length value is 16 (010000 binary), the decoded prefix length value (i.e., decoded mask value) is 0000 0000 0000 0000 1111 1111 1111 1111 binary, where a logic 1 represents a masked bit and a logic 0 represents an unmasked bit. In an alternative embodiment, the mask generator 241 may be a lookup table containing mask values that are selected (i.e., looked up) by the mask information 244; the looked up mask value being output as mask value 248. Alternative mask encoding schemes and mask generation schemes may be used in other embodiments.

The multi-mode comparator receives the entry key 246 and search key 210 and compares the two keys in accordance with the mask value selected by multiplexer 245 and the compare mode indicated by the compare mode value. If entry key and search key are determined to match one another (i.e., after any masking specified by the compare mode and mask value), the multi-mode comparator asserts a match signal 250 to indicate the match detection. If the entry key and search key are determined not to match, the match signal is deasserted. The match signal 250 is logically ANDed with an active low validity value 242 in AND gate 247 to generate a qualified match signal 252. Thus, only a match between the search key and the key of a valid entry will result in assertion of the qualified match signal 252. Multiplexer 249 selects either the qualified match signal 252 or the validity value 242 to be output as a match/empty value 134 according to the state of the NFA signal 212. Thus, when the NFA signal is high (i.e., during a NFA operation), the state of the validity value is output by multiplexer 249 to indicate whether or not the memory location selected by the hash index is occupied. During a search operation, when the NFA signal is low, the qualified match signal 252 is output to indicate whether a match was detected.

Still referring to FIG. 9, in one embodiment, the validity value is a single bit value that is low (e.g., logic 0) to indicate a valid entry and high otherwise. Accordingly, the validity value may alternatively be viewed, and is occasionally referred to herein, as an empty signal that is high (e.g., logic 1) when the entry-sourcing memory location is empty (i.e., does not contain valid data) and low when the memory location is occupied (i.e., contains valid data). Validity signals having more bits and different logic states may be used in alternative embodiments. More generally, alternative embodiments of the compare logic 135 may be used within the hash CAM devices of FIGS. 6 and 3. For example, in one alternative embodiment, the multiplexer 249 and NFA signal 212 are omitted and the existence and location of a next free address within the hash CAM block is determined by circuitry external to the hash CAM device (e.g., a programmed processor that tracks memory usage within the hash CAM device).

In one embodiment, the multimode comparator 243 is capable of performing different types of comparisons according to the programmed compare mode value. For example, the compare mode value may indicate a binary comparison, ternary comparison (i.e., comparison in which mismatch conditions are ignored for selected bit positions), range comparisons (i.e., comparison to determine whether search key is greater than or less than a given value) or any combination of binary, ternary and/or range comparisons. In an application where less than all types of comparisons are needed, the multi-mode comparator 243 may be replaced by a comparator that performs only the needed types of comparisons.

FIG. 10 illustrates an embodiment of the multi-mode comparator 243 of FIG. 9 that includes N component comparators $251_1$-$251_N$ (other embodiments may be used). In one implementation, each of the component comparators 251 receives a respective mask value component ($MASK_{C1}$-$MASK_{CN}$), entry key component ($KEY_{C1}$-$KEY_{CN}$) and search key component ($SKEY_{C1}$-$SKEY_{CN}$), and compares the search key and entry key components in accordance with the mask value and in accordance with a respective one of compare mode select signals $CMS_1$-$CMS_N$. The compare mode select signals are component signals of the compare mode value stored in the configuration register. Each of the component comparators 251 outputs a respective component match signal, $CM_1$-$CM_N$, which is ANDed with the component match signals output by the others of the component comparators in AND gate 253. AND gate 253 outputs the match signal 250 to AND gate 247 of FIG. 9.

FIG. 11 illustrates the structure of a component comparator 251 of FIG. 10 according to one embodiment. The component comparator includes compare elements $254_1$-$254_F$, each to compare a sub-field of an entry key component (i.e., sub-fields $K_1$-$K_F$) with a respective subfield of a search key component (i.e., sub-fields $SK_1$-$SK_F$). Each of the F sub-fields may include one or more bits and each sub-field may include a different number of bits than others of the sub-fields. In the embodiment of FIG. 11, the output of each compare element 254 is high if the corresponding entry key and search key sub-fields match. OR gates $255_1$-$255_F$ receive the outputs of the compare elements $254_1$-$254_F$, respectively, and also receive mask signals from the mask information included within the entry (MASK). The mask information may include bit mask values to selectively mask single-bit sub-fields, and the mask information may additionally include mask values to mask multi-bit sub-fields. The mask value that corresponds to each sub-field is supplied to an input of OR gates $255_1$-$255_F$ and is used to selectively mask a mismatch indication from a corresponding compare element. As an example, if the sub-field comparison within compare element $254_1$ is to be masked, a logic high mask value is input to OR gate $255_1$ so that, regardless of whether compare element $254_1$ indicates a mismatch or a match, the output of logic OR gate 255 will be high, indicating a match condition. If the outputs of all the OR gates $255_1$-$255_F$ are high, AND gate 258 outputs a logic high component match signal 256 (CM) to indicate the match condition. If any of the outputs of compare elements $254_1$-$254_F$ are low (indicating a mismatch condition), and not masked by a corresponding mask value, a logic low signal will be input to AND gate 258, thereby producing a low component match signal 256 to indicate the mismatch condition. In an embodiment in which masking is not required, the OR gates 255 may be omitted from the component comparator of FIG. 11. Also, different logic states may be used in alternative embodiments. Further any circuit may be used to implement the OR gates 255 and/or AND gate 258 including, without limitation, wired OR and wired AND logic.

FIG. 12 illustrates the structure of a component comparator 251 of FIG. 10 according to another embodiment (yet other embodiments may be used). The component comparator 251 includes S compare cells, $257_1$-$257_S$, each to compare a respective bit of an entry key component (i.e., bits $K_1$-$K_S$) with a corresponding bit of the search key component (bits $SK_1$-$SK_S$) in accordance with the state of a corresponding bit of the mask value component (bits $M_1$-$M_S$). In one embodiment, the compare cells are chained to one another via greater-than (GT)/less-than (LT) lines, $260_1$-$260_{S-1}$, to enable numeric range comparisons. Each of compare cells $257_1$-$257_S$ receives a compare mode select signal (CMS) that indicates a compare mode for the corresponding entry and search key components, and each compare cell 257 outputs a match signal which is coupled to a component match line 256. In the embodiment of FIG. 12, the component match line 256 is pulled up to a first reference level (e.g., a supply voltage level) by pull-up circuit 259, and pulled-down to a second reference level (e.g., a ground voltage level) by a mismatch or out-of-range detection within compare cells $257_1$-$257_S$. Different voltage levels and/or logic states may be used to signal match/mismatch in alternative embodiments.

FIG. 13 illustrates a compare cell 257 according to one embodiment. The compare cell 257 receives a search key bit (SK) and complement search key bit (/SK), an entry key bit (K) and complement entry key bit (/K), and a complement mask bit (/M) as inputs. The compare cell 257 includes a range compare cell 275 to perform a single bit range comparison, and a match compare cell 285 to perform a maskable, bitwise match comparison. The compare mode select signal, CMS, is used to alternately enable the range compare cell 275 and disable the match compare cell 275, or enable the match compare cell 285 and disable the range compare cell 275. More specifically, when the compare mode select signal is high, transistor 282 is switched on to enable operation of the match compare cell 285, and transistor 267 is switched off (i.e., due to the operation of inverter 270) to disable operation of the range compare cell 275. Conversely, when the component compare mode select signal is low, transistor 282 is switched off to disable the match compare cell 285 and transistor 267 is switched on to enable the range compare cell 275.

When the match compare cell 285 is enabled, transistors 276, 278, 277, 279, and 281 cooperate to perform a maskable comparison of the search key bit and entry key bit. Transistor 281 is coupled to receive the complement mask bit, /M, so that when the complement mask bit is low (i.e., mask bit high to mask the compare operation), transistor 281 is switched off, and transistors 276, 278, 277 and 279 are prevented from pulling the match line low, thereby masking any mismatch indication. By contrast, when the active low mask bit is high (i.e., mask bit low to unmask the compare operation), transistor 281 is turned on to enable transistors 276, 278, 277 and 279 to pull the match line 256 low in the event of a mismatch between the search key bit and entry key bit. For example, if the entry key bit is high and the search key bit is low, transistors 279 and 277 will be switched on, pulling the match line low through transistors 281 and 282. Alternatively, if the search key bit is high and the entry key bit is low, transistors 276 and 278 will be switched on, pulling the match line through transistors 281 and 282.

The range compare cell 275, when enabled, signals an out-of-range condition by asserting a logic low signal ($GT_i$) on GT line $260_i$ if either (1) the search key bit is greater than the entry key bit, or (2) the search key bit and entry key bit are equal and a greater-than signal ($GT_{i-1}$) from a less significant compare cell is low. More specifically, if the search key bit is high and the entry key bit is low (i.e., if the search key bit is greater than the entry key bit), then transistors 262 and 264 are switched on to form, along with enabling transistor 267, a path between the GT line $260_i$ and ground, thereby pulling the GT line $260_i$ low. Transistors 266 and 268 are used to couple the $GT_{i-1}$ signal on input GT line $260_{i-1}$ to the GT line $260_i$ if the search key bit and entry key bit are equal. That is, if the search key bit is high (meaning that the search key bit must either be equal to or greater than the search key bit), transistor 266 is switched on to enable the $GT_{i-1}$ signal onto the GT line $260_i$, and if the entry key bit is low (again meaning that the search key bit is equal to or greater than the entry key bit), then transistor 268 is switched on to enable the $GT_{i-1}$ signal onto the GT line $260_i$. Thus, if either transistor 266 or 268 is switched on, a low $GT_{i-1}$ signal (indicating that a less significant portion of the search key component is greater than a corresponding less significant portion of the entry key component), will be propagated to the GT line $260_i$ of range compare cell 275. Referring to FIG. 11, the propagation of a low GT signal continues through the chain of compare cells (from right to left in the exemplary diagram of FIG. 11) until the signal is blocked by a compare cell that receives an entry key bit that is greater than the search key bit (i.e., transistors 266 and 268 are both switched off), or until the signal is output from the most significant compare cell in the chain (i.e., compare cell 257$_S$ in this example). The GT line 260$_S$ driven by the most significant compare cell 257$_S$ is coupled to the match line 256, thereby pulling the match line 256 low in the event of an out-of-range condition (i.e., search key component greater than entry key component).

Note that the compare cells 257$_1$-257$_S$ may alternatively pull the match line low in response to detecting that the search key component is less than the entry key component (i.e., signal a less-than (LT) condition). Referring again to FIG. 13, for example, instead of comparing the search key bit against the complement of the stored key in transistors 262 and 264, the complement search key bit may be compared against the uncomplemented entry key bit, pulling line 260$_i$ (now a LT line) low if the entry key bit is high and the search key bit is low. Similarly transistors 268 and 266 may pass a LT$_{i-1}$ signal from a less significant compare cell to the LT line 260 if the complement search key bit is high (meaning that the search key bit is low) or the entry key bit is high.

In another embodiment, both out-of-range conditions, GT and LT, may be signaled by a single compare cell by using the mask bit to indicate the lower (or upper) boundary of the range definition. In yet another embodiment, a selection may be made between GT and LT range comparisons by selectively multiplexing the key bits applied to transistors 262, 264, 266 and 268. Also, the mask transistor 281 may be omitted from the match compare cell 285 in an alternative embodiment in which maskable compare (i.e., ternary compare) operation is not needed.

Referring again to FIG. 10 each of the component comparators 251 may include any number of compare cells and may include compare cells that are dedicated or configurable to perform range comparisons, ternary comparisons and/or binary comparisons. For example, in alternative embodiments, one or more of the compare cells within component comparators 251 may include only range compare cells 275 and not match compare cells 285, or only match compare cell 285 and not range compare cells 275.

Reflecting on the operation of the hash CAM devices of FIGS. 3 and 6, it should be noted that, in an alternative embodiment, the information maintained in the configuration register 137 may be stored on an entry-by-entry basis within memory 133, effectively enabling multiple search tables to be stored within a single device In such an embodiment, a hash index may be generated based on a predetermined portion (or all) of a search value. The configuration information within the entry retrieved from the indexed location may then be used to qualify the comparison of the search value and the entry. For example, an entry type within the entry may be compared with a class code associated with the search value to qualify any match detection (i.e., suppress assertion of the match flag 136 if the entry type and class code do not match), mask information within the entry may be used to mask mismatches at selected bit positions of the entry and search key, control information within the entry may be used to select the type of comparison operation to be performed (e.g., binary, ternary and/or range compare) and so forth. In general, any information that may be stored in the configuration register may be stored on an entry by entry basis within the memory 133.

Overflow CAM

Reflecting on the operation of the hash CAM devices described in reference to FIGS. 3 and 6, it should be noted that a host device generally will not know beforehand whether a given data value may be stored within the hash CAM device. That is, except when the hash CAM device is completely empty, a preliminary search (i.e., NFA operation) is used to determine whether a collision with an existing hash CAM entry will occur. If a collision is detected, the data value may not be stored in the hash CAM device and the hash CAM device is said to be conflicted as to that data value. In a system that includes multiple hash CAM devices, a data value that cannot be stored in a conflicted hash CAM device may instead be stored in another hash CAM device. To maintain determinism in the data load operation, all the hash CAM devices in the system may be concurrently instructed to perform a NFA operation, followed by an insert instruction to an unconflicted one of the hash CAM devices. In the event that all the hash CAM devices in the system are conflicted, a data value may be stored in a backup or overflow CAM device that includes an array of CAM cells. Taking this concept a step further, the overflow CAM device may be implemented in the same integrated circuit as the hash CAM device (or multiple hash CAM devices), and control over the CAM devices combined within a unified instruction decoder or other control unit. This approach has the advantage of relieving system level resources (i.e., host processor, instruction buses etc.) from managing load and search operations. In one embodiment, referred to herein as a unified load embodiment, the presence of the hash CAM is hidden from the host altogether by performing both a NFA operation and an insert operation within an integrated hash CAM/overflow CAM device in response to a single load instruction. That is, from the host perspective, the integrated hash CAM/overflow CAM device behaves like a conventional CAM device by deterministically storing a data value (i.e., storing the data value within a known time) in response to a load instruction. In an alternative embodiment, referred to herein as a two-phase load embodiment, a load operation is achieved by issuing a NFA instruction to the integrated hash CAM/overflow CAM device, followed by an insert instruction.

Figure 14:
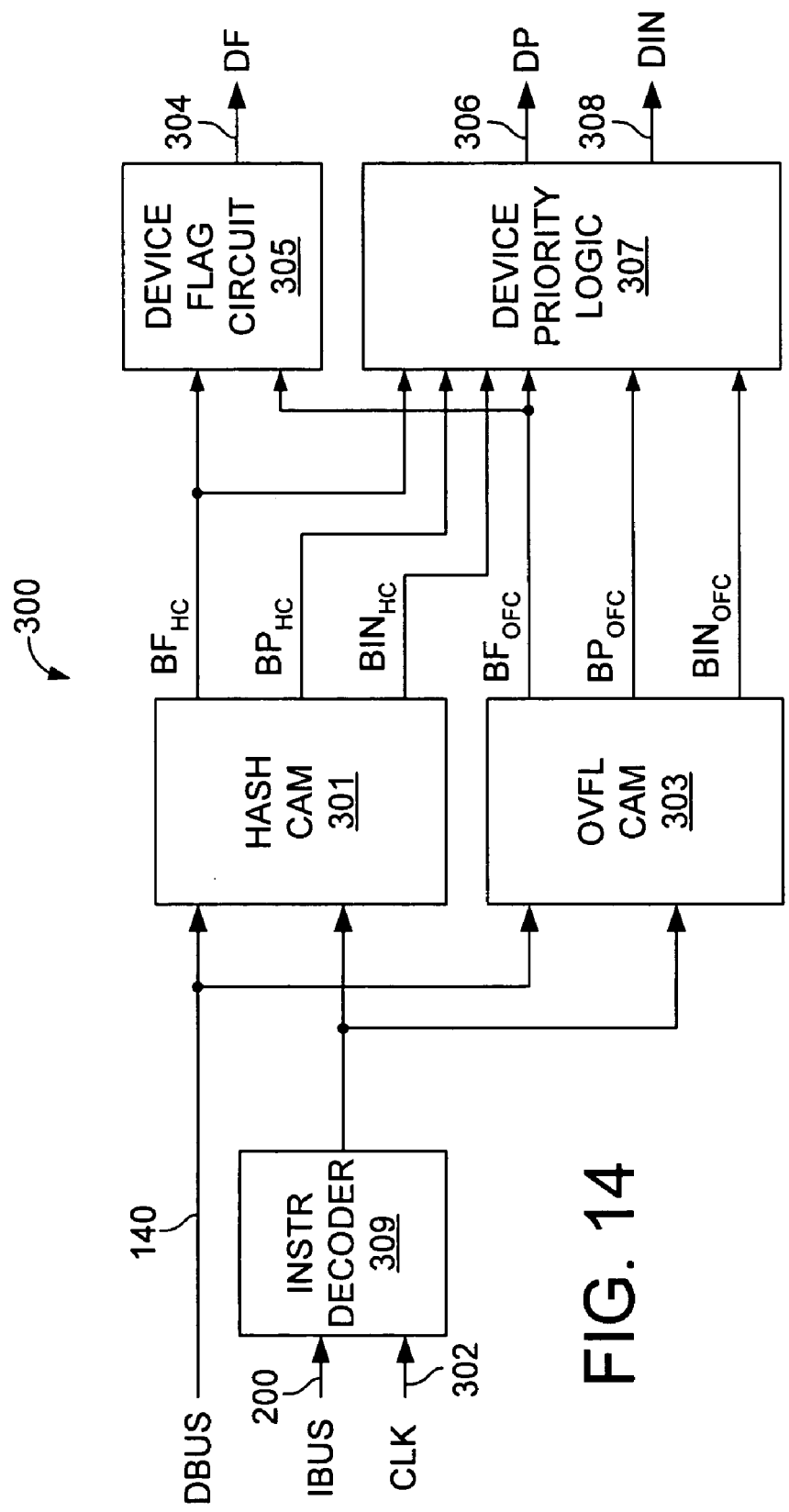
FIG. 14 illustrates a CAM device that includes a hash CAM block and an overflow CAM block.

FIG. 14 illustrates a CAM device 300 that includes both hash CAM and overflow CAM functions in a hash CAM block 301 and overflow CAM block 303, respectively. The hash CAM block 301 may include, for example, the circuit blocks of hash CAM device 130 of FIG. 3 or hash CAM device 190 of FIG. 6. A shared instruction decoder 309 issues control and timing signals to both CAM blocks in response to host instructions received via instruction bus 200 and a clock signal received via clock line 302. A data bus 140 is input to both the hash CAM block and the overflow CAM block, and each of the CAM blocks 301 and 303 outputs a respective block flag (BF$_{HC}$, BF$_{OFC}$), block priority value (BP$_{HC}$, BP$_{OFC}$) and block index (BIN$_{HC}$, BIN$_{OFC}$).

The CAM device 300 also includes a device flag circuit 305 and device priority logic 307. The device flag circuit 305 receives the block flags from the hash CAM and overflow CAM blocks and logically combines the block flags to generate a device flag 304 (DF). In one embodiment, the block flags are combined in an OR operation so that, if either CAM block indicates a match condition, the device flag circuit 305 will assert the device flag 304. The device flag 304 may also be asserted to indicate a full/empty status for the CAM device 300 (e.g., during a non-search operation), or a separate signal or signals may be output for such purposes. Further, additional flags may be output by the flag logic such as a multiple match flag (to be asserted, for example, when more than CAM block indicates a match condition), an almost full flag (to be asserted, for example, when a CAM block reaches a predetermined fill-level), and so forth. The device priority logic 307 receives the block flags, block priority values and block indices from the hash CAM and overflow CAM blocks, and outputs, as a device priority value 306 (DP), a highest priority one of the block priority values for which the corresponding block flag is asserted. The device priority logic 307 also outputs a device index 308 (DIN) that includes a block identifier (block ID) component and a block index component. The block identifier component is a block address that corresponds to the CAM block (301 or 303) that sourced the device priority value, and the block index component is the block index ($BIN_{HC}$ or $BIN_{OFC}$) output by the CAM block indicated by the block ID.

In response to a load instruction (or NFA instruction in the case of a two-phase load embodiment), the instruction decoder 309 initiates a NFA operation within the hash CAM block 301 to determine whether the hash CAM block 301 is conflicted. In response, the hash CAM block 301 outputs a block index ($BIN_{HC}$) and a block flag ($BF_{HC}$) that indicates whether the indicated memory location is empty or occupied. In one embodiment, the instruction decoder 309 does not enable the overflow CAM block 303 to participate in the NFA operation so that the overflow CAM block 303 does not assert a block flag. Consequently, during the NFA operation, the device flag circuit 305 outputs a device flag 304 that corresponds to the state of the hash CAM block flag ($BF_{HC}$) and the device priority logic 307 outputs a device index 308 that includes a block ID that corresponds to the hash CAM block 301 and the hash CAM block index ($BIN_{HC}$). Thus, after a NFA operation within the CAM device 300, the device flag 304 will indicate whether a candidate entry may be stored in the hash CAM block 301 and, if so, the device index 308 will indicate the location within the hash CAM block 301 at which the entry may be inserted (i.e., the insertion address). In a two-phase load embodiment, the host may respond to an asserted device flag signal by issuing an insert instruction to insert the candidate entry at the indicated location within the hash CAM block 301. If the device flag is not asserted, the host may issue an instruction to insert the entry candidate into the next free address within the overflow CAM block 303. In one embodiment, during an insertion into the overflow CAM block 303, the overflow CAM block 303 outputs a next free address (i.e., available location within the overflow CAM block) and a block flag ($BF_{OFC}$) that indicates whether the overflow CAM is full. The overflow CAM block flag is output by device flag circuit 305 as the device flag 304 (the block flag from hash CAM block 301 being deasserted) so that a host device may determine when the overflow CAM block 303 becomes full and cease further instructions to insert collision-producing entry candidates into the overflow CAM block 303.

In an alternative embodiment of the hash CAM device 300, the overflow CAM block 303 participates in a NFA operation by asserting its block flag signal, $BF_{OFC}$, if the overflow CAM block 303 is not full and by outputting the next free address within the overflow CAM as block index, $BIN_{OFC}$. The overflow CAM block 303 further outputs a predetermined block priority value, $BP_{OFC}$, that is lower than the priority value output by an unconflicted hash CAM block 301. By this arrangement, so long as the overflow CAM block 303 is not full, the CAM device 300 will always assert the device flag signal in response to a NFA instruction, and the device priority logic will select, according to which CAM block (301 or 303) outputs the highest priority block priority value in combination with an asserted block flag, one of the block indices, $BIN_{HC}$ or $BIN_{OFC}$, to form the block index component of the device index 308, and will generate a block ID that corresponds to the selected block index. Thus, if the device flag 304 is asserted in response to a NFA instruction, the host device may instruct the CAM device 300 to store the entry candidate at the block and storage location indicated by the device index 308. Note that, in a unified load embodiment, the instruction decoder 309 (or other control circuit within the CAM device 300) may respond to assertion of the device flag 304 and device index 308 by signaling the indicated CAM block (301 or 303) to store the candidate entry at the indicated block index. In either embodiment (i.e., unified or two-phase load), a collision within the hash CAM block 301 will not prevent the CAM device 300 from being able to store an incoming data value. Also, from the perspective of a host device, the unified load embodiment of CAM device 300 responds to a load request by carrying out the instructed load operation. The host device (and therefore the system designer) need not know that the CAM device 300 searches for an insertion address, and system level operation is not impacted by which of the hash CAM block 301 and the overflow CAM block 303 is ultimately selected for entry insertion.

Using Multiple Hash CAM Blocks to Achieve Ternary CAM Operation

As discussed above in reference to FIGS. 6 and 7, the portion of the key used to generate the storage index of an entry and the search index for a matching search key may not be masked without destroying the equality between the two indices. This aspect of hashing operation presents a significant obstacle to ternary CAM operation in which the portion of the search key to be masked varies from one search value to the next.

As discussed above in reference to FIG. 7, the key mask value within a configuration register may be used to define a desired invariant component (or components) within an input key, thereby defining the remainder of the key to be a maskable, variant portion of the key. Consequently, ternary CAM operation in which selected bits of a search value are ignored for match detection purposes, may be achieved at least within the variant portion of the key. In one embodiment of the present invention, this limited ternary CAM operation is extended by providing multiple hash CAM blocks within a CAM device, and by selectively storing entries within the hash CAM blocks according to the locations of the variant portions of their key components (i.e., according to their variant key definitions). For example, all entries having a first variant key definition may be stored in a first hash CAM block (or set of hash CAM blocks), all entries having a second variant key definition may be stored in a second hash CAM block (or set of hash CAM blocks), and so forth. By this arrangement, all or a significant percentage of anticipated variant key definitions may be allocated among the multiple hash CAM blocks (or sets of hash CAM blocks) to achieve a relatively robust ternary CAM operation. Entry candidates having an unassigned variant key definition may be stored in an overflow CAM block.

In one embodiment, a variant key definition is assigned to a given hash CAM block by programming a corresponding key mask value into the configuration register of the CAM block. Thereafter, as part of a NFA operation, the key mask value within each CAM block is compared with a mask code that indicates a variant key definition for the entry candidate (i.e., the mask code indicates which bits within the key of the entry candidate may be masked). Using this approach, the key mask value programmed within each CAM block effectively allocates the hash CAM block to a logical group of hash CAM blocks (or at least one hash CAM block) referred to herein as a mask pool.

The entry type value programmed within the configuration register of each hash CAM block also allocates the hash CAM block to a logical group of one or more hash CAM blocks referred to herein as an entry type pool. In one embodiment, each hash CAM block is allocated to one of a finite number of entry type pools which are used to store only entries having the programmed entry type. For example, a first set of hash CAM blocks may be allocated (i.e., by appropriate assignment of entry type values within their respective configuration registers) to an IPv4 pool, a second set of hash CAM blocks may be allocated to an MPLS pool, a third set of hash CAM blocks may be allocated to a packet classification pool, a fourth set of hash CAM blocks may be allocated to an IPv6 pool, and so forth. Any hash CAM block, in any physical order, can be assigned to any entry type pool.

During a NFA operation, the programmed entry type and key mask value of each hash CAM block are compared with the entry type and key mask value of the entry candidate. Only those hash CAM blocks which fall within the mask pool and entry type pool indicated by the entry candidate are enabled to participate in the NFA operation, with all other CAM blocks being disabled from asserting their block flags (i.e., disabled from indicating an ability to store the candidate entry). Thus, all hash CAM blocks configured with the same key mask value and entry type define a logical pool, called an insertion pool, into which an entry having a matching key mask value and entry type may be asserted.

During a search operation, the entry type for an incoming search value is compared with the entry type of each hash CAM block, and only those hash CAM blocks which have been programmed with a matching entry type are enabled to participate in the search. That is, all hash CAM blocks which do not fall within the indicated entry type pool are disabled from signaling a match.

CAM Device with Multiple Hash CAM Blocks

Figure 15:
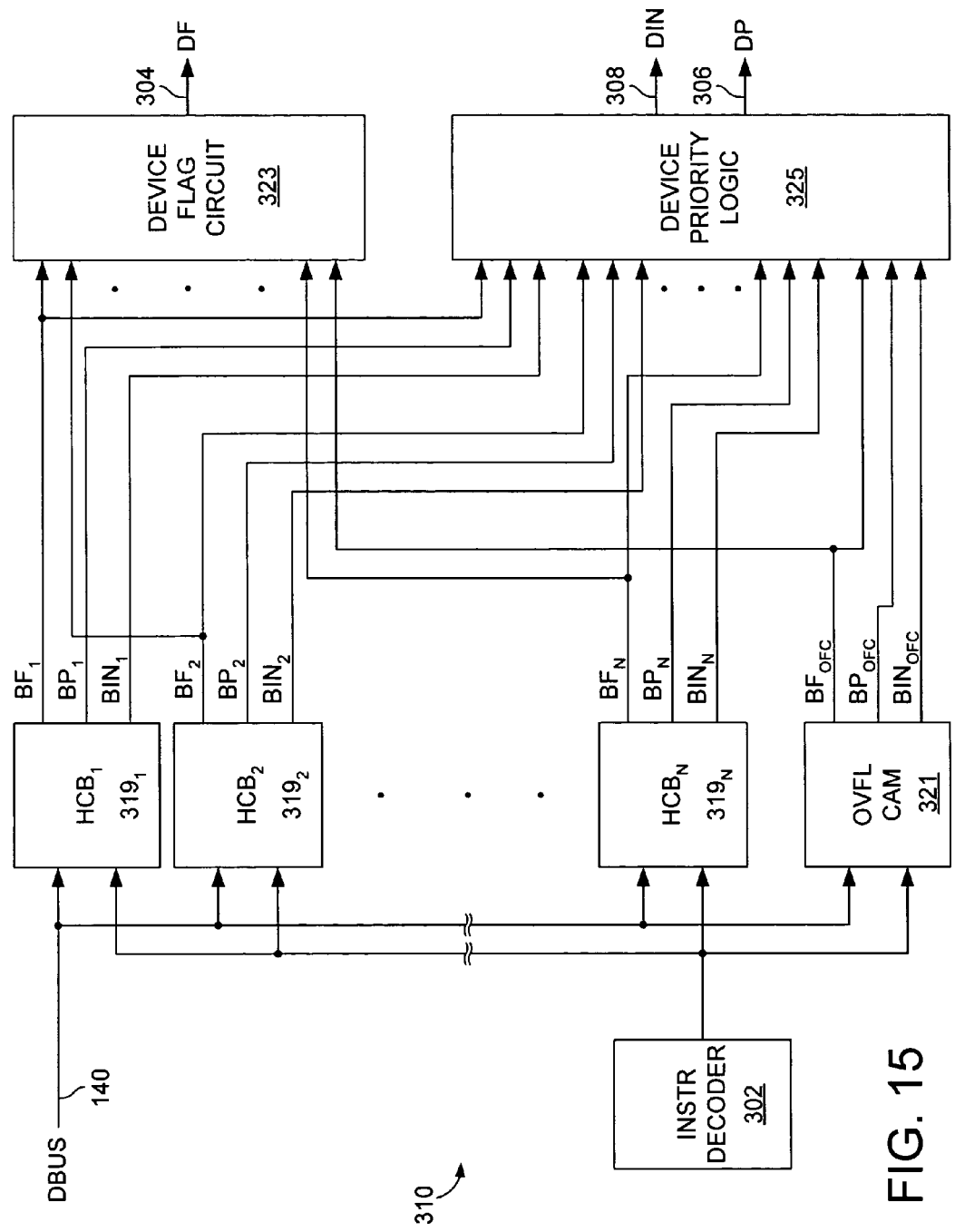
FIG. 15 illustrates an embodiment of a CAM device that includes multiple hash CAM blocks and an overflow CAM block.

FIG. 15 illustrates an embodiment of a CAM device 310 that includes multiple hash CAM blocks $319_1$-$319_N$ along with an overflow CAM block 321. Each of the hash CAM blocks 319 outputs a respective block flag ($BF_1$-$BF_N$), block priority value ($BP_1$-$BP_N$), and block index ($BIN_1$-$BIN_N$), as does the overflow CAM block 321 (i.e., $BF_{OFC}$, $BP_{OFC}$ and $BIN_{OFC}$). Device flag circuit 323 receives the block flag signals (BF) from each of the hash CAM blocks 319 and the overflow CAM block 321, and a device priority logic circuit 325 receives the block priority value, block index, and block flag signal from each of the hash CAM blocks 319 and the overflow CAM block 321. The hash CAM device 310 operates similarly to the hash CAM device 300 of FIG. 14 to perform NFA, insert and search operations in response to corresponding signals from an instruction decoder 302. During a search operation, each hash CAM block $319_1$-$319_N$ and the overflow CAM block 321 is searched concurrently to generate a set of block flags ($BF_1$-$BF_N$, $BF_{OFC}$), block priority values ($BP_1$-$BP_N$, $BP_{OFC}$) and block indices ($BIN_1$-$BIN_N$, $BIN_{OFC}$). The device flag circuit 323 asserts the device flag 304 if any of the block flag signals are asserted. The device priority logic 307 generates a device index and device priority value according to the highest priority block priority value for which the corresponding block flag is asserted. During a NFA operation, each hash CAM block generates a block flag to indicate whether the CAM block is conflicted, and also a block priority value that may be used to select between multiple unconflicted CAM blocks according to a predetermined insertion policy.

Figure 16:
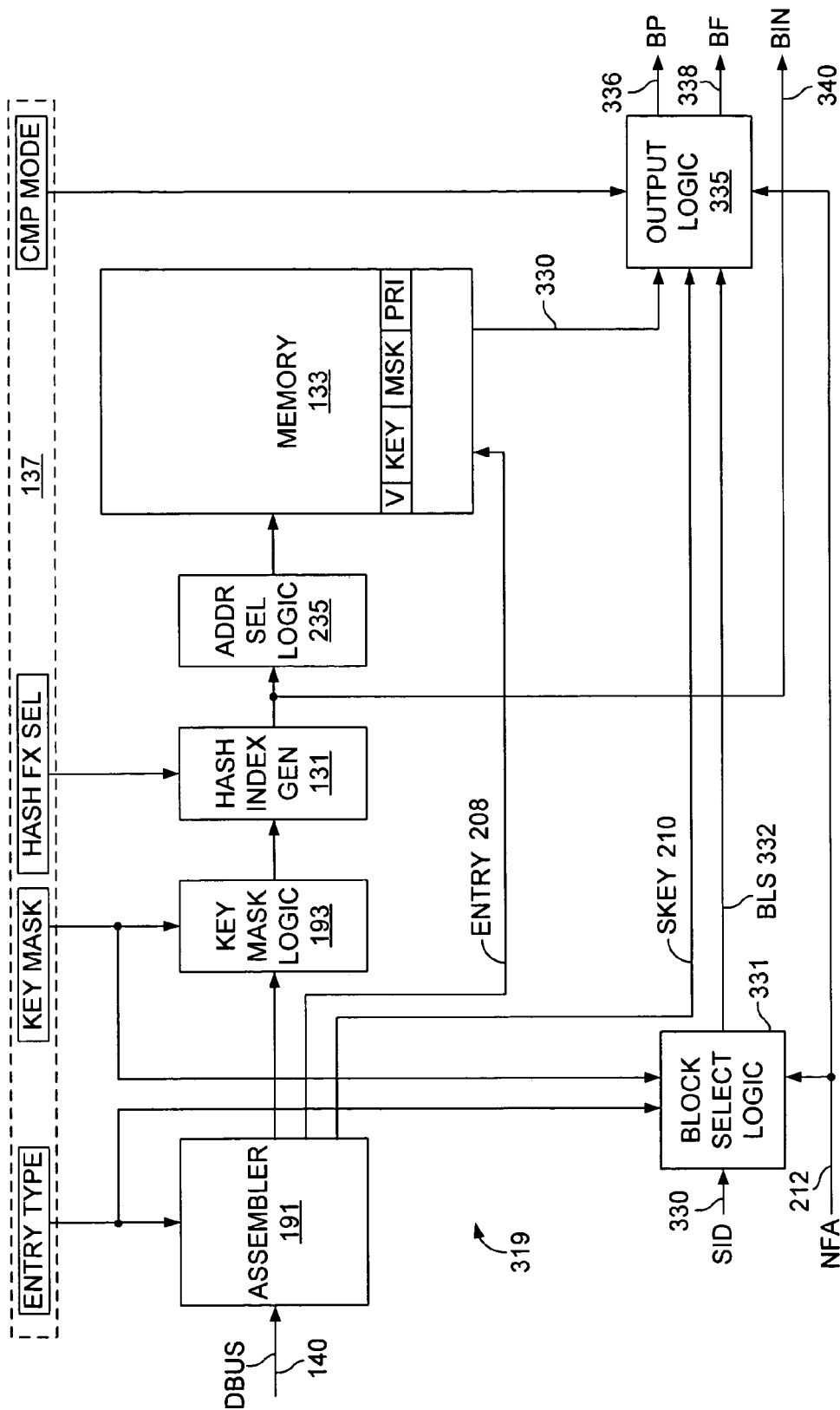
FIG. 16 illustrates the structure of a hash CAM block that may be used within the hash CAM device of FIG. 15.

FIG. 16 illustrates the structure of a hash CAM block 319 that may be used within the hash CAM device 310 of FIG. 15. The hash CAM block 319 includes an assembler circuit 191, key mask logic 193, hash index generator 131, address select logic 235, memory 133 and configuration register 137, all of which operate generally as described in reference to FIGS. 6-8, as well as output logic 335. Referring briefly to FIG. 15, it should be noted that the size of the memory 133 within a given one of the hash CAM blocks $319_1$-$319_N$ may be different from others of the hash CAM blocks. For example, in one embodiment, some of the hash CAM blocks contain memories with 256 storage rows, while others of the hash CAM blocks contain memories with 512 storage rows. Other sized memories may be used in alternative embodiments.

The hash CAM block 319 further includes block select logic 331 to generate a block select signal 332 according to an incoming search ID value 330 (SID). In one embodiment, the search ID 330 is incorporated or encoded within the operation code or operand of an incoming NFA instruction or search instruction. In a NFA instruction, the search ID includes a mask code and class code that correspond to a key mask value and entry type value, respectively, and therefore specify an insertion pool. The block select logic compares the mask code and class code against the key mask and entry type values, respectively, programmed into the configuration register 137. If the specified codes match the programmed values, the block select logic 331 asserts the block select signal 332 to enable the output logic 335 to assert the block flag 338 (i.e., if no collision is detected). If the codes do not match the programmed values (i.e., the specified insertion pool does not match the programmed insertion pool), the block select logic 331 deasserts the block select signal 332 to disable the output logic 335 from asserting the block flag 338, thereby preventing the hash CAM block from being selected for entry insertion.

In a search instruction, the search ID includes a class code, but no mask code. Accordingly, the block select logic 331 compares only the programmed entry type value with the class code. If the class code and programmed entry type match (i.e., programmed entry type pool matches the search-specified entry type pool), the block select signal 332 is asserted to enable the output logic 335 to assert the block flag 338 (i.e., if a match is detected between search value and entry). If the programmed and specified entry type pools do not match, the block select signal 332 is deasserted to disable the output logic 335 from asserting the block flag 338. Note that, in alternative embodiments, the block select signal 332 may be applied to any other circuit blocks within the hash CAM block to prevent operation of those circuits (e.g., to save power) in the event of a mismatch between the search ID and programmed value(s).

FIG. 17 illustrates an embodiment of the block select logic 331 of FIG. 16 (other embodiments may be used). The block select logic 331 includes a pair of comparators 343 and 345, AND gate 347 and a multiplexer 349. As shown, an input search ID 330 includes a class code (CC) that specifies an entry type pool and, in a NFA operation, a mask code (MC) that specifies a mask pool. During a NFA operation, the mask code is compared to the key mask value in comparator 345 and the class code is compared with the entry type value in comparator 343, the key mask and entry type values being stored within the configuration register of the hash CAM block. If the entry type matches the class code and the key mask matches the mask code, both inputs to AND gate 347 will be high resulting in a logic high output to a first input port of the multiplexer 349. The NFA signal 212 is high during the NFA operation, causing the multiplexer 349 to select the output of AND gate 347 to drive the block select signal 332. Thus, during a NFA operation, the block select signal 332 will have a high or low state according to whether the insertion pool specified by the search ID matches the insertion pool defined by the programmed key mask and entry type values.

During a search operation, the NFA signal is low so that the multiplexer 349 selects the output of comparator 343 to set the state of the block select signal 332. Consequently, during a search operation, the block select signal 332 will have a high or low state according to whether the entry type pool specified by the search ID matches the entry type pool indicated by the programmed entry type value.

FIG. 18 illustrates an embodiment of the output logic 335 of FIG. 16 (other embodiments may be used). The output logic 335 includes the compare logic 135 discussed above in reference to FIG. 6 as well as AND gate 355 to disable assertion of the block flag 338 if the block select signal 332 is not asserted (i.e., to a logic high state in this example).

The block priority value 336 output during a NFA operation is referred to herein as an insert priority value, and is compared with insert priority values output by other hash CAM blocks to select one of a number of available hash CAM blocks to store the input value. During a search operation, by contrast, the priority component (PRI) of the indexed entry 138 (referred to as a search priority value) is output as the block priority value 336. The output logic 335 includes a multiplexer 359 to select, either an insert priority value or the search priority value to be output as block priority value 336 according to the state of the NFA signal 212. That is, if the NFA signal is low, indicating a search operation, the priority component of entry 138 is selected to be output as the block priority value 336. If the NFA signal is high, indicating a NFA operation, an insert priority value is selected. In one embodiment, the insert priority value is a predetermined priority value (zero in this example). Alternatively, in an embodiment that implements a capacity-dependent insertion policy, the insert priority value is maintained in a R-bit fill counter 357 that is incremented in response to an insertion operation within the hash CAM block (in which case signal WR is asserted, for example, by the instruction decoder) and decremented in response to a delete operation within the hash CAM block (in which case signal DEL is asserted). Thus, the insertion priority value indicates the fill level of the hash CAM block, and, when output as block priority value 336, enables the device priority logic 325 of FIG. 15 to select between multiple unconflicted hash CAM blocks (i.e., for entry insertion) on the basis of which is most or least filled.

FIG. 19 illustrates an embodiment of the device priority logic 325 of FIG. 15 (other embodiments may be used). (Note that the device priority logic 325 may also be used in the hash CAM block of FIG. 14; a case in which there is only one hash CAM block). The device priority logic 325 includes a priority compare circuit 361, priority encoder 363 and index selector 365. As discussed in reference to FIG. 15, the device priority logic 325 receives the block flags, block priority values and block indices from each of N hash CAM blocks (i.e., $BF_1$-$BF_N$, $BP_1$-$BP_N$, and $BIN_1$-$BIN_N$) and also the block flag, block priority value and block index from the overflow CAM device ($BF_{OFC}$, $BP_{OFC}$, $BIN_{OFC}$), and outputs a highest priority one of the block priority values, for which the corresponding block flag signal is asserted, as a device priority number 306 (DP). Herein, a block priority value for which the corresponding block flag signal is asserted is referred to as a match-qualified block priority value, and, conversely, a block priority value for which the corresponding block flag signal is deasserted is referred to as a disqualified block priority value. During a given NFA or search operation, disqualified block priority values are disabled from participation in a priority number comparison operation (e.g., by being forced to a lowest possible priority value) such that only a match-qualified block priority value may be output as the device priority number. In one embodiment, if all the block priority values are disqualified (i.e., no match signals are asserted), a lowest possible priority number is output as the device priority number 306.

The priority compare circuit also outputs a plurality of qualified match signals $366_1$-$366_{N+1}$, each of which corresponds to a respective one of the N+1 CAM blocks (i.e., match signals $366_1$-$366_N$ correspond to the N hash CAM blocks 319 and match signal $366_{N+1}$ corresponds to the overflow CAM block 321). Each qualified match signal, if asserted, indicates that the corresponding CAM block sourced (i.e., output to the priority compare circuit) the device priority number. The priority encoder 363 encodes the qualified match signals into a block identifier (BID) that identifies the CAM block that sourced the device priority number. Note that multiple CAM blocks may source the device priority number (a multiple match condition), in which case the priority encoder generates a block identifier according to a predetermined tie resolution policy. For example, in one embodiment, the priority encoder generates a block identifier that identifies the lowest numbered one of the CAM blocks for which qualified match signals are asserted. In one embodiment, for example, the lowest numbered one of the CAM blocks is the CAM block having the lowest physical address for the memory address space spanned by the hash CAM blocks. Different priority encoding policies may be used in alternative embodiments.

Still referring to FIG. 19, the block identifier is supplied to the index selector where it is used to select the block index output by the identified CAM block as a selected block index ($BIN_{SEL}$). In one embodiment, the index selector is a multiplexer circuit that selects the block index to be output as $BIN_{SEL}$ in response to the block identifier. Together, the block identifier and the selected block index constitute the device index, DIN.

Figure 20:
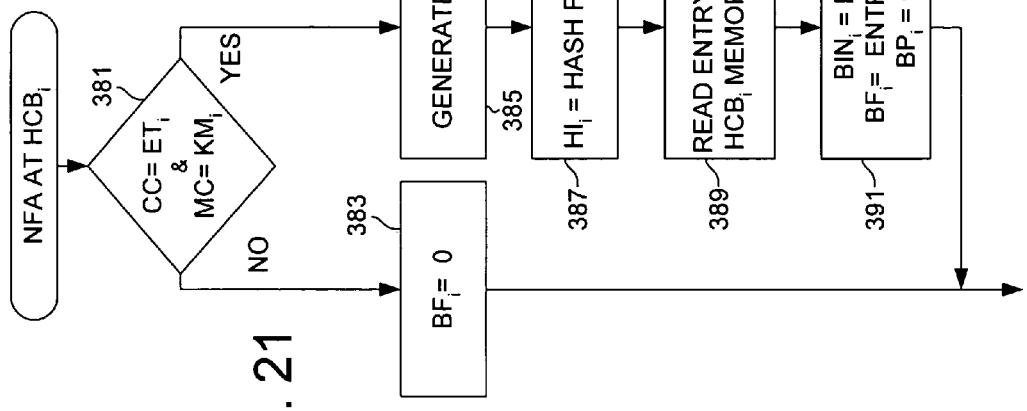
FIG. 20 is a flow diagram of a NFA operation within the hash CAM device of FIG. 15.

FIG. 20 is a flow diagram of a NFA operation within the hash CAM device of FIG. 15. In response to a NFA signal from the instruction decoder, NFA operations are performed concurrently within each of the N hash CAM blocks at $375_1$-$375_N$ to generate a corresponding set of N block priority values and N block flags. At 377, a block identifier (BID) is generated by priority encoding the match-qualified block priority values. Also at 377, the block index that corresponds to the block ID is chosen to be the selected block index, $BIN_{SEL}$. At 379, a device flag (DF) is generated by logically ORing the block flag signals received from the hash CAM blocks, and the device index (DIN), formed by the block identifier and selected block index, is output.

Still referring to FIG. 20, it should be noted that the block flag signal and block priority value from the overflow CAM device may also included in the block identifier, block index selection and device flag generation operations. In one embodiment, block flag signal from the overflow CAM, $BF_{OFC}$, is suppressed during a NFA operation (i.e., disabled from being asserted), so that the overflow CAM device is not identified by the block ID and does not contribute the device flag generation. In an alternative embodiment, discussed below, the overflow CAM device is enabled to participate in a NFA operation.

Figure 21:
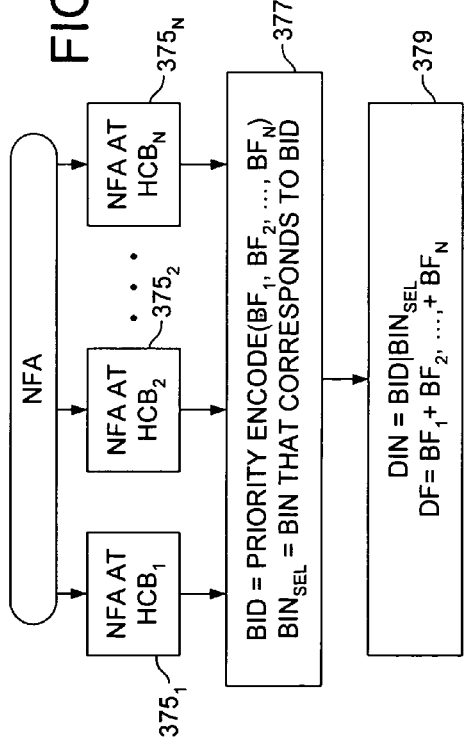
FIG. 21 is a flow diagram of a NFA operation within the hash CAM block of FIG. 16.

FIG. 21 is a flow diagram of a NFA operation within an $i^{th}$ one of the hash CAM blocks of FIG. 15, i being an integer value between 1 and N, inclusive. At 381, the class code of the NFA instruction (CC) is compared with the entry type of the CAM block ($ET_i$), and the mask code of instruction (MC) is compared with the key mask of the CAM block ($KM_i$). If the class code matches the block entry type and the mask code matches the block key mask, then at 385, a key is generated from a selected portion of the incoming value. A hash index is generated based on the key at 387, and at 389 an entry is read from the hash block memory at the location indicated by the hash index. Finally, at 391, the hash index is output as the block index; the validity value of the entry read from memory is output as the block flag; and a predetermined value (e.g., 0) or, in an alternative embodiment, a value indicative of the block fill level is output as the block priority value. If, at 381, the class code does not match the block entry type, or the mask code does not match the block key mask, the block flag is deasserted at 383.

Figure 22:
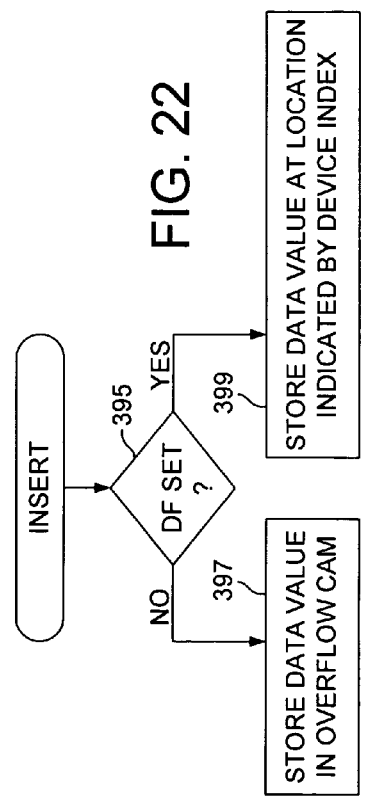
FIG. 22 illustrates an insert operation within the hash CAM device of FIG. 15.

FIG. 22 illustrates an insert operation within the hash CAM device of FIG. 15. The device flag is evaluated at 395. If the device flag is not set, then no hash CAM block asserted its block flag during a preceding NFA operation, and the data value is stored in the overflow CAM (397). If the device flag is set, then at least one hash CAM block is available to store the data value, and the data value is stored at the location indicated by the device index (399).

Figure 23:
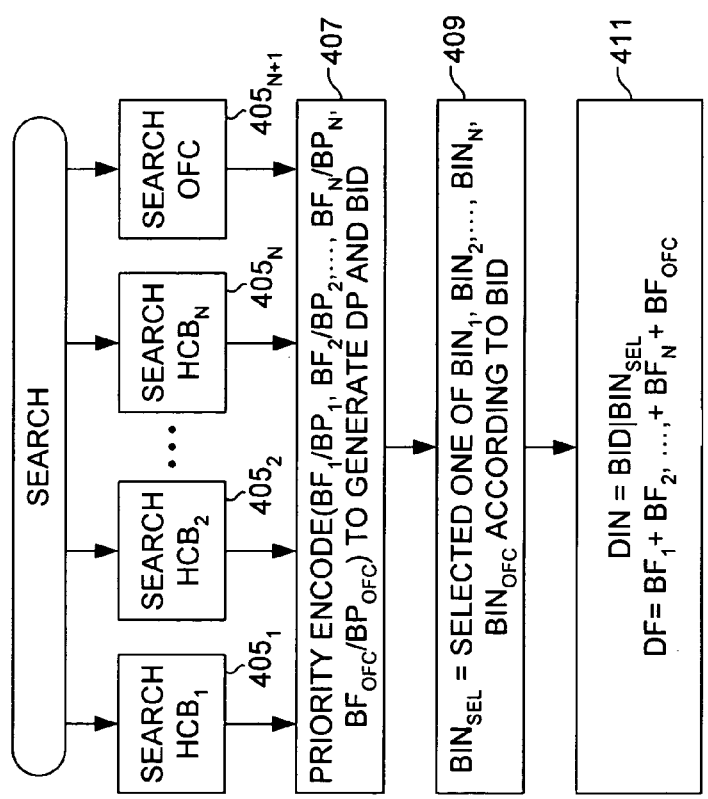
FIG. 23 illustrates a search operation within the hash CAM device of FIG. 15.

FIG. 23 illustrates a search operation within the hash CAM device of FIG. 15. At $405_1$-$405_{N+1}$, each of the N hash CAM blocks and the overflow CAM block are searched in parallel to generate a set of block flags, block priority values, and block indices. At 407, a block identifier (BID) and device priority (DP) are generated by priority encoding the block flags according to the block priority values. At 409, one of the N+1 block indices (i.e., $BIN_1$, $BIN_2$, ..., $BIN_N$ or $BIN_{OFC}$) is selected according to the block identifier to be $BIN_{SEL}$, the selected block index. At 409, the block identifier and selected block index are output to form the device index (DIN), and the device flag (DF) is generated by logically ORing the block flags from the hash CAM blocks and overflow CAM block.

Figure 24:
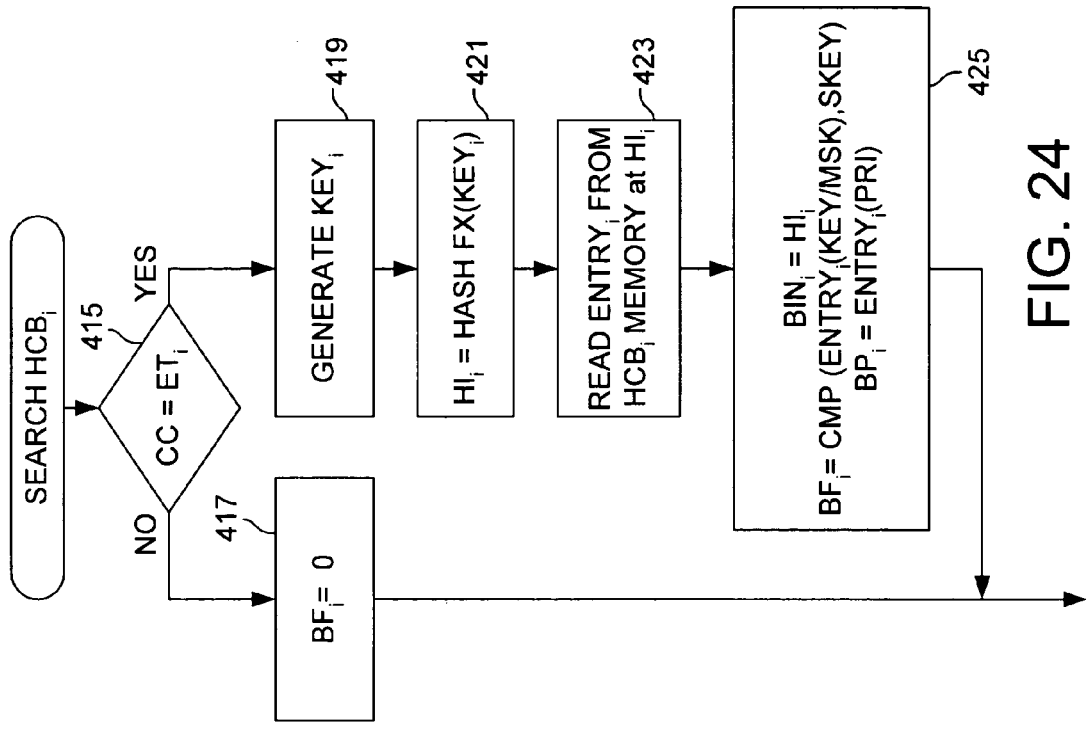
FIG. 24 illustrates a search operation within a hash CAM block of FIG. 15.

FIG. 24 illustrates a search operation within a hash CAM block of FIG. 15. At 415, the class code of the incoming search instruction (CC) is compared with the entry type ($ET_i$) of the hash CAM block. If the class code does not match the entry type, the block flag ($BF_i$) is deasserted at 417 and the search operation is concluded. If the class code does match the entry type, then a key is generated at 419, and used to generate a hash index at 421. At 423, an entry is read from the hash CAM block memory at a location indicated by the hash index. At 425, the block index is assigned to be the hash index and output from hash CAM block. Also at 425, the block flag ($BF_i$) is asserted or deasserted according to whether the search key matches the entry key (i.e., after accounting for any masking indicated by the mask information within the entry), and the priority field of the entry is output as the block priority value ($BP_i$).

Figure 25:
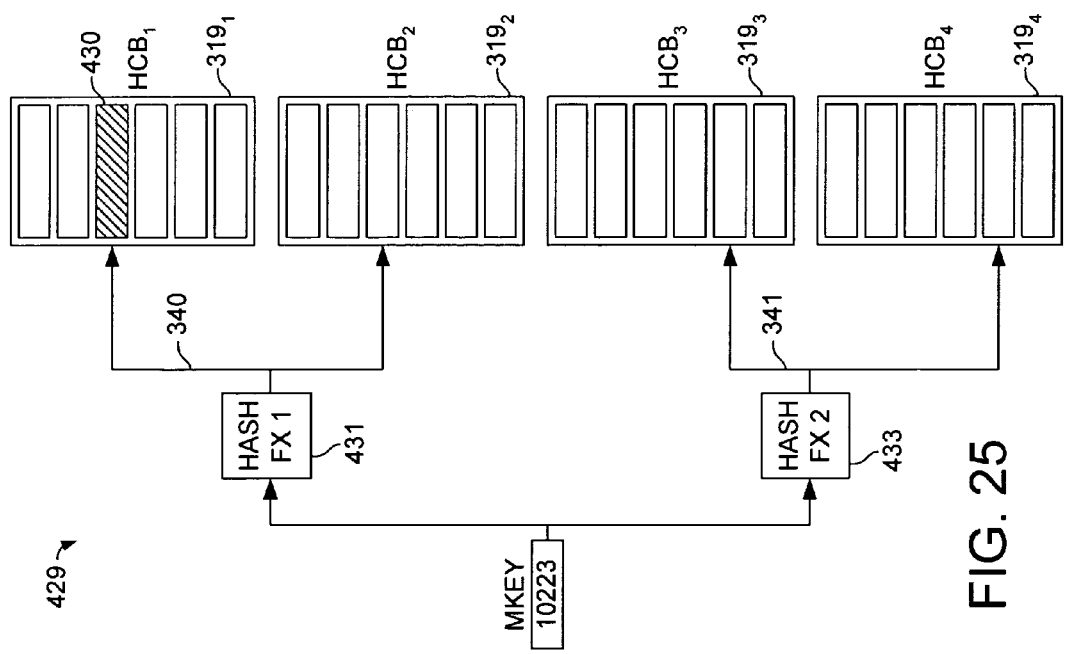
FIG. 25 illustrates a NFA operation within an exemplary CAM device having four hash CAM blocks, each of which outputs a fixed insert priority value.

FIG. 25 illustrates a NFA operation within an exemplary CAM device 429 having four hash CAM blocks, $319_1$-$319_4$, each of which outputs a fixed insert priority value. For simplicity, each hash CAM block is depicted as having six storage locations, with hash CAM blocks 1 and 2 ($319_1$, $319_2$) programmed to select the hash index generated by a first type of hash function circuit 431 and hash CAM blocks 3 and 4 ($319_3$, $319_4$) programmed to select a hash index generated by a second type of hash function circuit 433. Thus, for a given masked key value (MKEY), the hash indices generated within hash CAM blocks 1 and 2 will be the same (i.e., index 340), and the hash indices generated within CAM blocks 3 and 4 will be the same (i.e., index 341), but, except in cases of coincidence, index 340 will be different from index 341. Also for simplicity, the key mask values and entry type values programmed within the four hash CAM blocks are assumed to be the same (i.e., all four hash CAM blocks are in the same insertion pool).

Because all four hash CAM blocks $319_1$-$319_4$ are initially empty, each hash CAM block will respond during a NFA operation by asserting its block flag and outputting the same fixed block priority value. Thus, the device priority logic (i.e., element 325 of FIGS. 15 and 19) will select one of the hash CAM blocks according to a predetermined, hardwired tie resolution policy. In this particular example, lower numbered hash CAM blocks (e.g., those with lower physical addresses) are given higher priority over higher numbered hash CAM blocks so that, even though all four hash CAM blocks output the same priority number, the device priority logic will generate a block identifier (BID) that corresponds to hash CAM block 1 ($319_1$). (In alternative embodiments, different tie resolution policies may be used, and a value within the block configuration register may be used to select between multiple tie resolution policies). Thus, in the example of FIG. 25, hash index 340 and a block identifier for hash CAM block 1 form the device index output by the CAM device 429. Accordingly, during an ensuing insert operation, an entry is stored in hash CAM block 1 at the location pointed to by hash index 340. This location within the hash CAM device (i.e., location 430) is referred to herein as an insertion address, and is indicated in FIG. 25 by a lined shading pattern.

Figure 26:
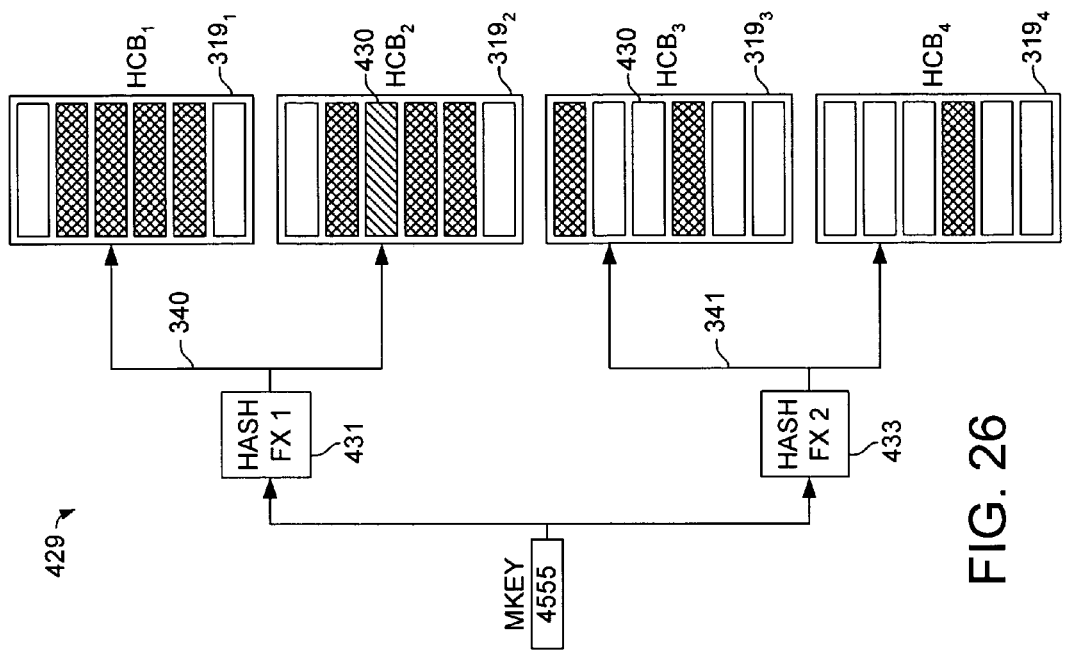
FIG. 26 illustrates an exemplary NFA operation within the hash CAM device of FIG. 25 after a number of entries have been loaded.

FIG. 26 illustrates an exemplary NFA operation within the hash CAM device 429 of FIG. 25 after a number of entries (indicated by cross-hatched shading) have been loaded into the hash CAM blocks $319_1$-$319_4$. During the NFA operation, hash CAM block 1 deasserts its block flag to signal its inability to store the data value that produced the masked key because an entry has previously been inserted at the indexed location. That is, hash CAM block 1 is conflicted due to a collision between index 340 and the index generated by a previously loaded entry. Hash CAM blocks 2, 3 and 4, on the other hand, are unconflicted and each asserts its block flag and outputs the fixed insert priority value. Thus, each of the hash CAM blocks 2, 3 and 4 provides the same match-qualified priority value to the device priority logic which, in this example, is hardwired to resolve ties in favor of the lowest numbered hash CAM block. Accordingly, as indicated by insertion address 430, hash CAM block 2 is selected to store the new entry in this example.

Figure 28:
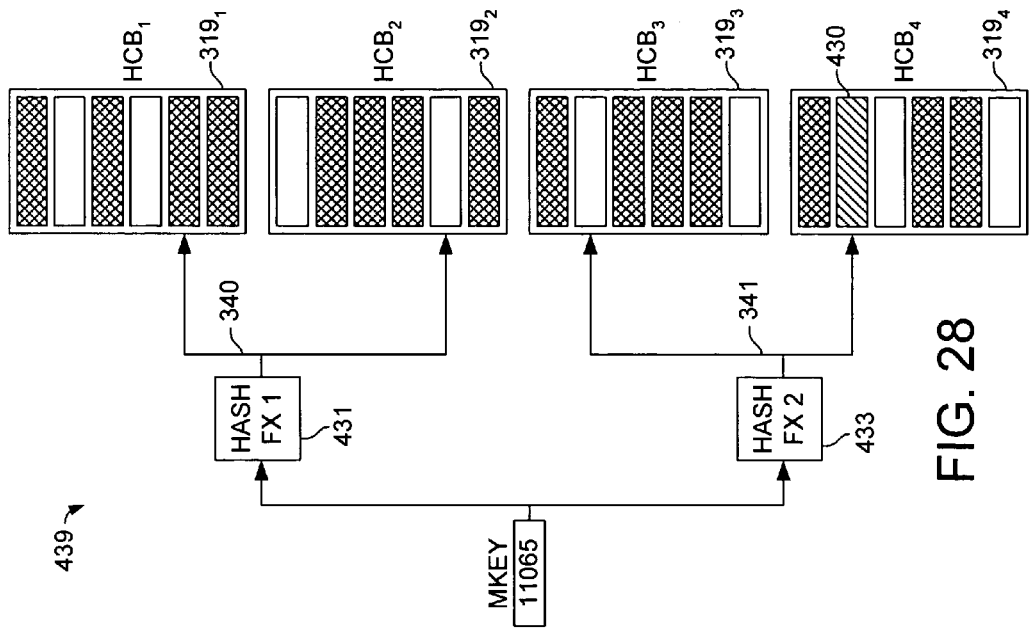
FIGS. 27 and 28 illustrate NFA operations within a hash CAM device that implements a capacity-dependent insertion policy.
Figure 27:
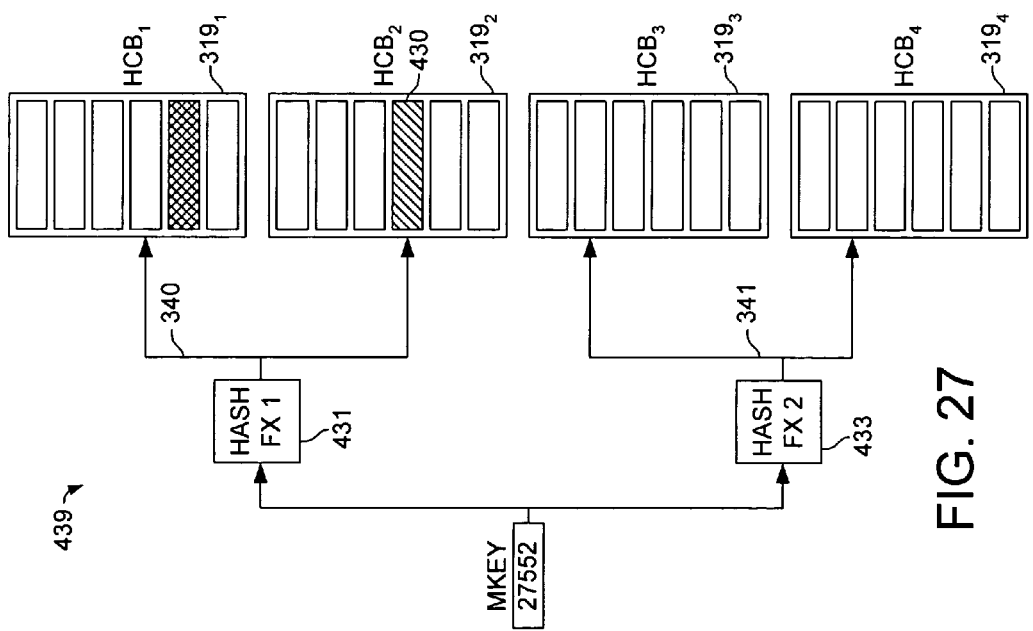

FIGS. 27 and 28 illustrate NFA operations within a hash CAM device 439 that is identical to the exemplary hash CAM device 429 of FIGS. 25 and 26 except that the hash CAM device 439 implements a capacity-dependent insertion policy. In the examples of FIGS. 27 and 28, each hash CAM block responds to a NFA instruction by outputting a priority value that is proportional to its fill level. Referring specifically to FIG. 27, hash CAM blocks 2, 3 and 4, being completely unfilled, output numerically lower insert priority values than hash CAM block 1, which contains a previously loaded entry. In an embodiment in which numerically lower values indicate a higher priority than numerically higher values (the case in the example of FIG. 27), hash CAM blocks 2, 3, and 4 will each output a match-qualified priority number having a higher priority than the match-qualified priority number output by hash CAM block 1, with hash CAM block 2 ultimately being selected by the device priority logic (i.e., by hardwired tie resolution logic) for entry insertion. Note that, had fixed insert priority values been used, hash CAM block 1 would have sourced the same match-qualified priority number as hash CAM blocks 2, 3 and 4 and would have been selected for entry insertion by the hardwired tie resolution logic.

FIG. 28 illustrates an exemplary NFA operation within the hash CAM device 439 of FIG. 27 after a number of entries have been loaded into the hash CAM blocks $319_1$-$319_4$. In this example, hash CAM block 1 ($319_1$) is conflicted, but hash CAM blocks 2, 3 and 4 are not. Hash CAM blocks two and three each contain four previously loaded entries, however, while hash CAM block 4 contains only three previously loaded entries. Consequently, hash CAM block 4 ($319_4$) will output a lower priority number than hash CAM blocks 2 and 3, and therefore be selected for entry insertion. Note that, had fixed insert priority values been used, hash CAM blocks 2, 3 and 4 would each have output the same match-qualified priority number, thereby causing CAM block 2 to be selected for entry insertion according to the hardwired tie resolution policy.

Although FIGS. 27 and 28 illustrate NFA examples using a least-filled insertion policy, a most-filled insertion policy (i.e., policy which favors a more-filled rather than a less filled hash CAM block for entry insertion purposes) may be applied instead. A most-filled insertion policy may be implemented, for example, by using an empty counter rather than the fill counter 357 within the output logic 335 of FIG. 18. The empty counter may be preloaded to a predetermined value, then decremented in response to each insertion event (i.e., insertion of an entry within the corresponding hash CAM block) and incremented in response to each delete event. Referring to FIG. 27, in such an embodiment, hash CAM block 1 would output a numerically lower (higher priority) priority value than hash CAM blocks 2, 3 and 4 due to the previously inserted entry. Similarly, if a most-filled insertion policy was used in the example of FIG. 28, either hash CAM block 2 or 3 would be selected over hash CAM block 4 due to the fact that hash CAM blocks 2 and 3 are more filled than hash CAM block 4. Note that hash CAM block 1 remains conflicted and therefore unable to store the candidate entry, and that the selection between hash CAM blocks 2 and 3 may be determined by a hardwired or programmable tie resolution policies.

Hash CAM Device Having Shared Key/Hash Index Generation Circuitry

FIG. 29 illustrates an alternative embodiment of a CAM device 450 that includes multiple hash CAM blocks 445. In the CAM device 450, the hash CAM blocks 445 are organized into G groups of M hash CAM blocks each, with each hash CAM block operating as described in reference to the previous figures, and with each group of hash CAM blocks sharing a respective assembler/mask circuit $441_1$-$441_G$ and hash index generator $443_1$-$443_G$. A group configuration register $447_1$-$447_G$ is associated with each group of hash CAM blocks and used to control the operation of the corresponding assembler/mask circuit. FIG. 30 illustrates a more detailed embodiment of the assembler/mask circuit 441 and hash index generator 443 of FIG. 29. As shown, the assembler/mask circuit 441 includes K assembler/mask subcircuits, $451_1$-$451_K$, each coupled to provide a respective masked key, $194_1$-$194_K$, to a corresponding one of K hash function circuits $453_1$-$453_K$ within the hash function generator 443. Each assembler/mask subcircuit includes an assembler subcircuit and key mask logic subcircuit that operate in the manner described above in reference to the assembler circuit 191 and key mask logic 193 of FIG. 6 to generate an assembled, masked key. In one embodiment, the group configuration register 447 includes a set of K entry type values that are input, respectively, to the K assembler/mask subcircuits $451_1$-$451_K$ to enable each assembler/mask subcircuit to be configured to output a different masked key based on the same incoming data value. By this arrangement, each hash function circuit $453_1$-$453_K$ may receive a different masked key. Each of the M hash CAM blocks within a given group (i.e., $445_1$-$554_M$) includes a configuration circuit that may be programmed with a respective hash function select value (HFSEL) and includes a hash function select circuit $449_1$-$449_M$ to select, according to the programmed hash function select value, one of the K hash indices, $HI_1$-$HI_K$, generated by the hash index generator 443. Accordingly, each hash CAM block within the group may receive a hash index which has been generated according to a selected entry type, key mask and hash function. Comparing the hash CAM device 450 to the hash CAM device of FIG. 15, the total number of hash index generator circuits is reduced by a factor of M while retaining independent configurability for each hash CAM block 445. Note that in an alternative embodiment, the groups of hash CAM blocks depicted in FIG. 29 need not all include the same number of CAM blocks. Also, while embodiments of hash CAM blocks are described below as including a dedicated assembler circuit, key mask logic and hash index generator, such hash CAM blocks may be modified to operate with the shared assembler/mask circuit 441 and shared hash index generator 443 of FIGS. 29 and 30.

Hash CAM Block with Segmented Memory

Figure 31:
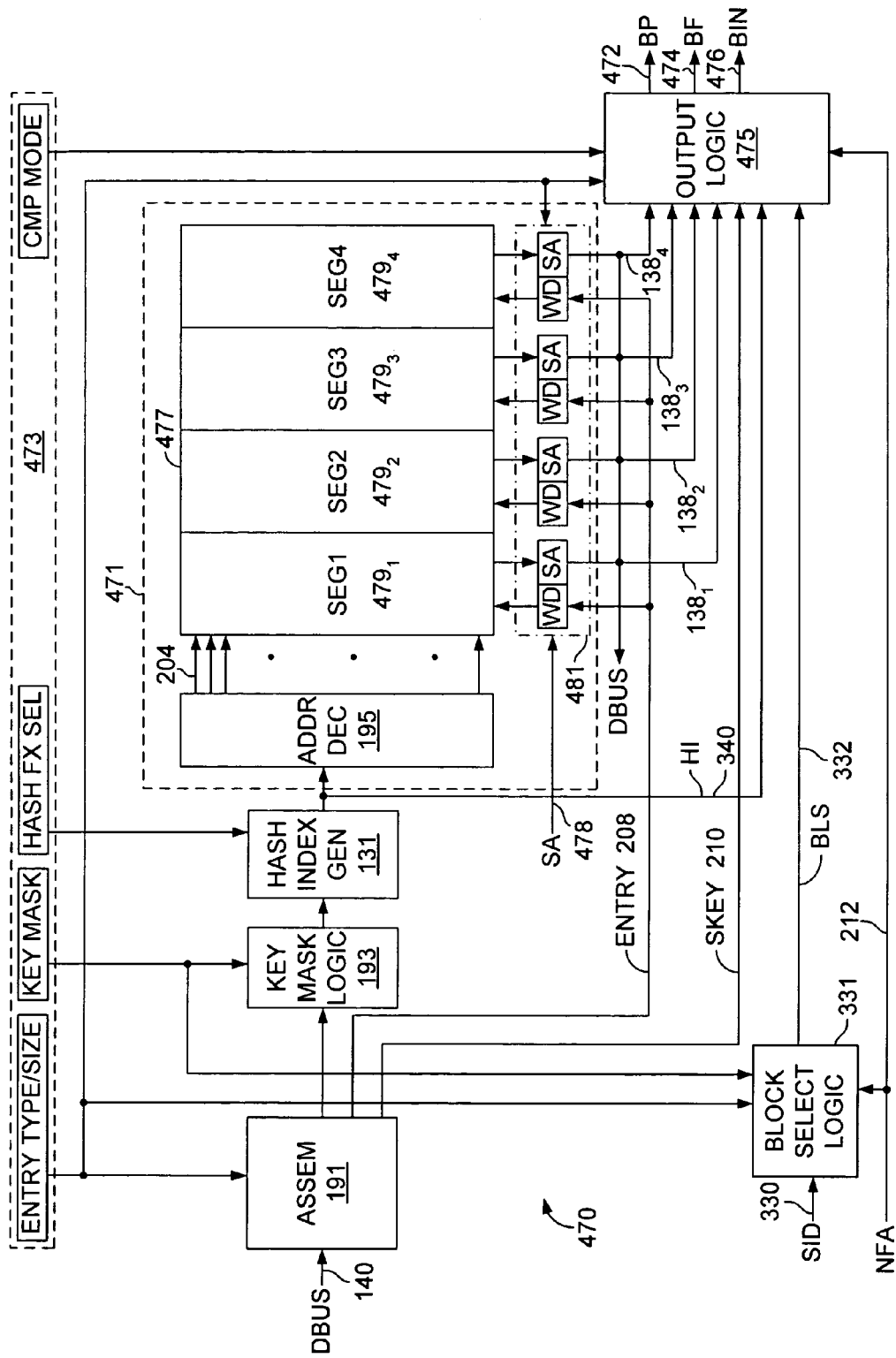
FIG. 31 illustrates an embodiment of a hash CAM block that includes a segmented memory.

FIG. 31 illustrates an embodiment of a hash CAM block 470 that includes a segmented memory 471 and which may be used within any of the multiple hash CAM block devices or single hash CAM block devices described above. The hash CAM block 470 includes an assembler circuit 191, key mask logic 193, hash index generator 131 and block select logic 331 that operate generally as described above in reference to FIG. 16. The segmented memory 471 includes an address decoder 195, read write circuit 481 and segmented memory array 477. The address decoder 195 responds to a hash index 340 from the hash index generator 131 by activating one of a plurality of word lines 204 in the manner described above in reference to FIG. 6. Each word line 204 is shared among each of four segments $479_1$-$479_4$ within the segmented memory array 477 (more or fewer segments may be used to form the memory array in alternative embodiments), so that the activated word line enables read and write access to a row of storage cells that spans all four segments. During a NFA or search operation, the contents within the entire row of storage cells (i.e., the contents of the word-line indicated location within each of segments $479_1$-$479_4$) are sensed by a set of four sense amplifier banks (SA) within the read/write circuit 481 and output as a set of four entry segments $138_1$-$138_4$ to an output logic circuit 475. During an insert operation, a segment address 478 (SA) is provided to the read/write circuit 481 to select one or more of write driver banks (WD) within the read/write circuit 481 to store an entry within the corresponding segment or segments 479.

The hash CAM block 470 includes a configuration register 473 that is similar to the configuration register 137 described in reference to FIGS. 6 and 16, except that the entry type value within the configuration register includes an entry size field which specifies the size (i.e., number of constituent bits) of entries stored within the segmented memory 471. In the embodiment of FIG. 31 for example, entries which span 1, 2, or 4 segments may be stored within the segmented memory. Such values are referred to herein as x1, x2, and x4 entries and correspond to x1, x2, and x4 operating modes of the CAM block 470 selected by the entry size field. In alternative embodiments that include more or fewer memory segments 479, entries may span different numbers of segments.

The entry size field within the entry type value (collectively designated an entry type/size value in FIG. 31 to emphasize the presence of entry size information) is provided to the read/write circuit 481 to control which of the segments 479 are accessed in a read or write access to the segmented memory array 477. For example, during an insert operation in the x1 mode, a 2-bit segment address 478 is provided to the read/write circuit 481 to enable one of four write driver circuits (WD) within the read/write circuit 481 to store a x1 entry in a corresponding one of the memory array segments 479. During an insert operation in the x2 mode, the least significant bit of the 2-bit segment address 478 is ignored, and the most significant bit of the segment address value is used to enable one of two pairs of write driver circuits to store a x2 entry in segment pair $479_1/479_2$ or $479_3/479_4$, respectively. During an insert operation in the x4 mode, both bits of the segment address 478 are ignored and all four write driver circuits within the read/write circuit 481 are enabled to store a x4 entry in the memory array 477. In all three operating modes, the word line activated by the address decoder 195 selects the row of the memory array 477 in which the entry is stored.

The entry size information within configuration register 473 is also provided to the output logic 475 to control the generation of a block flag signal 474, block priority value 472 and block index 476. The output logic 475 is coupled to the sense amplifier banks (SA) within the read/write circuit 481 to receive an entry segment $138_1$-$138_4$ from each of the corresponding segments $479_1$-$479_4$ of memory array 471. Depending on the operating mode selected by the entry type/size value within the configuration register 473, the entry segments $138_1$-$138_4$ may be four distinct entries (x1 mode) that each span a single memory segment 479, two distinct entries (x2 mode) that each span a pair of memory segments, or a single entry that spans all four memory segments (x4 mode). The output logic 475 also receives the search key 210 from the assembler circuit 191, hash index 340 from the hash index generator 131, block select signal 332 from the block select logic 331, and NFA signal 212 from an instruction decoder (not shown in FIG. 31) or other control circuit.

Figure 32:
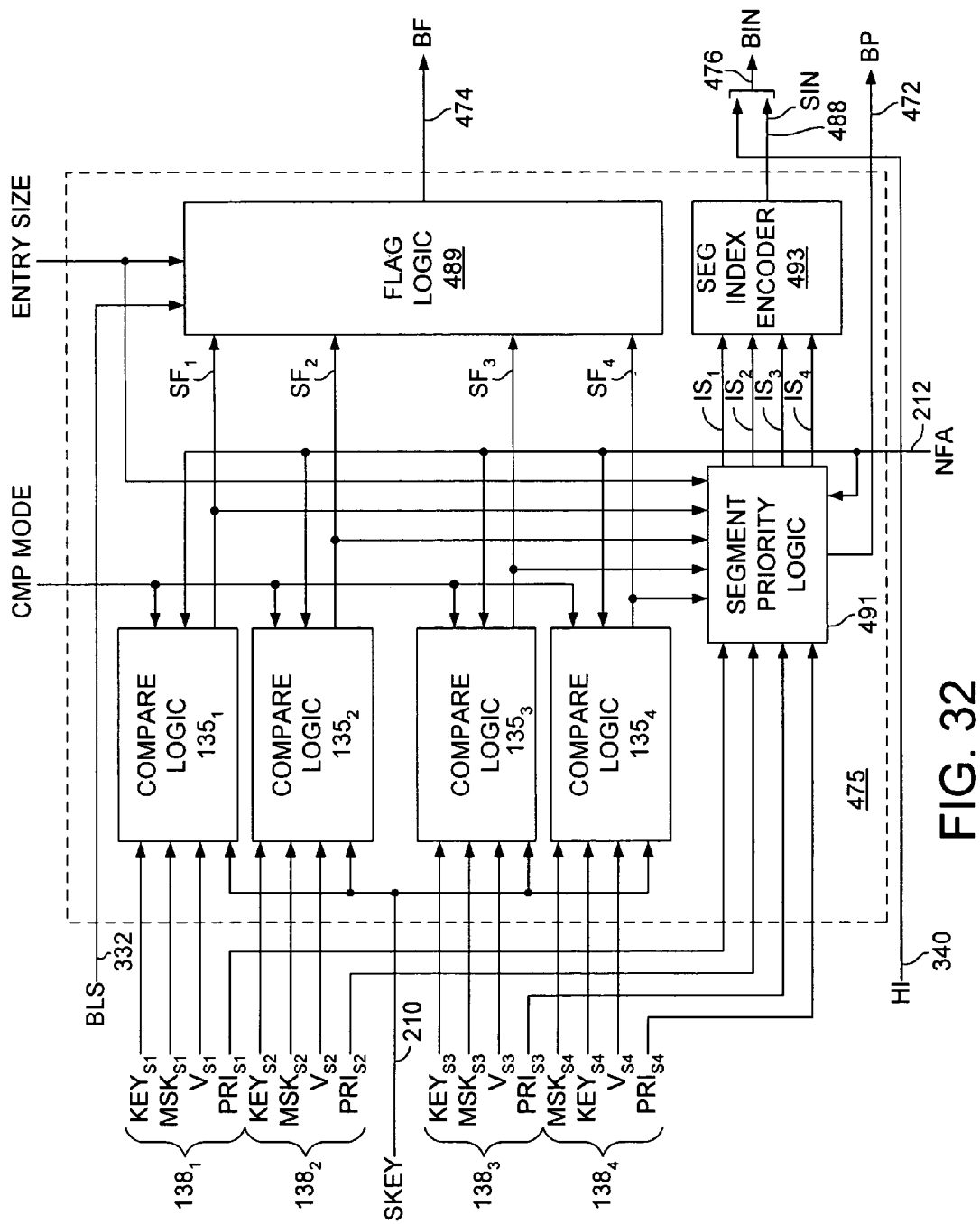
FIG. 32 illustrates an embodiment of the output logic of FIG. 31.

FIG. 32 illustrates a more detailed embodiment of the output logic 475 of FIG. 31 (other embodiments may be used). The output logic 475 includes four compare logic circuits $135_1$-$135_4$, segment priority logic 491, flag logic 489 and segment index encoder 493. Each of the compare logic circuits $135_1$-$135_4$ receives a respective entry segment $138_1$-$138_4$ (i.e., from memory segments $479_1$-$479_4$ of FIG. 31) and operates generally as described in reference to FIG. 9 to generate a corresponding match/empty signal, referred to herein as a segment flag (SF). During a NFA operation, each segment flag, $SF_1$-$SF_4$, indicates the state of the valid bit for the corresponding segment, and therefore indicates whether the corresponding segment is occupied (i.e., by a valid entry or portion thereof) or unoccupied. During a search operation, each segment flag indicates whether the entry key for the corresponding segment (i.e., $KEY_{S1}$, $KEY_{S2}$, $KEY_{S3}$, $KEY_{S4}$) matches the search key 210, ignoring any mismatch between bits indicated to be masked by the entry mask information for the segment (i.e., $MSK_{S1}$, $MSK_{S2}$, $MSK_{S3}$, $MSK_{S4}$). In both NFA and search operations, the segment flags are output to the flag logic circuit 489 which generates the block flag 474 (BF) in accordance with the entry size value from the configuration register and the block select signal 332. The segment flags are also output to the segment priority logic 491 which generates a block priority value (BP) and a plurality of index select signals, $IS_1$-$IS_4$. The index select signals are input to the segment index encoder 493 which encodes the index select signals to generate a segment index 488 (SIN). In a NFA operation, the segment priority logic 489 selects the segment flags, SF1-SF4, to be output as the index select signals, while in a search operation, the entry priority values ($PRI_{S1}$, $PRI_{S2}$, $PRI_{S3}$, $PRI_{S4}$) are qualified by the segment flags and used to generate the index select signals. The NFA signal 212 is input to the segment priority logic 491 to select the source of the index select signals.

FIG. 33 illustrates an embodiment of the flag logic 489 of FIG. 32 (other embodiments may be used). The flag logic 489 receives the entry size information from the configuration register (i.e., element 473 of FIG. 31) in the form of three component entry size signals: x1, x2 and x4. The x1 signal is asserted (i.e., to a logic high state in this example) when the CAM device is configured for x1 mode, the x2 signal is asserted in the x2 mode, and the x4 signal is asserted in the x4 mode. In x1 mode, the asserted x1 signal enables the output of OR gate 501 to pass through AND gate 511 and OR gate 517 to a first input of AND gate 519. A second input of AND gate 519 is coupled to receive the block select signal 332. Accordingly, in the x1 mode, if the block select signal 332 is asserted and any one of the segment flags $SF_1$-$SF_4$ are high (indicating an empty condition within the corresponding segment during a NFA operation and a match condition during a search operation), the block flag 474 will be asserted by AND gate 519.

In the x2 mode, AND gate 513 is selected to drive the block flag 474 via OR gate 517 and AND gate 519. AND gate 513 receives the output of OR gate 507 which receives outputs of AND gates 503 and 505. Each of AND gates 503 and 505 receives a respective pair of the segment flag signals, $SF_1/SF_2$ and $SF_3/SF_4$, so that an empty (or match) indication is indicated in the x2 mode only if $SF_1$ and $SF_2$ are both asserted or $SF_3$ and $SF_4$ are both asserted. In the x4 configuration, AND gate 515 is selected to drive the block flag 474 via OR gate 517 and AND gate 519. In the x4 mode, all four segment flags, $SF_1$-$SF_4$, are ANDed together in AND gates 503, 505 and 509 to generate the signal input to AND gate 515. Thus, in the x4 mode, all four segment flags must indicate an empty status in order for the block flag 474 to be asserted during a NFA operation, and all four segments flags must indicate a match condition in order for the block flag 474 to be asserted during a search operation. In an alternative embodiment, three of the four segment flags could be ignored in the x4 mode and one segment flag in each pair of segment flags could be ignored in the x2 mode.

FIG. 34 illustrates an embodiment of the segment priority logic 491 of FIG. 32 (other embodiments may be used). The segment priority logic 491 includes search priority logic 550, NFA priority logic 571, multiplexer 565 and multiplexer bank 570. The segment priority logic 491 receives the x2 and x4 entry size signals from the configuration register and also receives the segment flags, $SF_1$-$SF_4$, from the compare logic circuits and the corresponding priority values, $PRI_{S1}$-$PRI_{S4}$, from the segmented memory. As discussed above, the segment priority logic 491 outputs the index select signals, $IS_1$-$IS_4$, and also outputs the block priority value 472 (BP). The NFA signal 212 is coupled to the control inputs of multiplexers 570 to select the source of the index select signals, $IS_1$-$IS_4$. During a NFA operation, the asserted NFA signal 212 selects segment flags $SF_1$-$SF_4$ to be output as the index select signals $IS_1$-$IS_4$. For example, if segment flag $SF_1$ is high (indicating that the corresponding segment within the segmented memory is empty), index select signal $IS_1$ will also be high. By contrast, during a search operation, the NFA signal 212 is deasserted and search priority logic 550 is selected (i.e., by multiplexer bank 570) to drive the index select signals. Multiplexer 565 is responsive to the NFA signal 212 to select an insert priority value 574 (IP) from the NFA priority logic 571 to be output as the block priority value 472 during a NFA operation, and to select a search priority value 564 (SP) from the search priority logic 550 to be output during a search operation (i.e., when the NFA signal 212 is deasserted).

The search priority logic 550 includes logic OR gates 541, 543, 545 and 547 to generate match-qualified priority values; comparator circuits $C_1$, $C_2$ and $C_3$ to compare the match-qualified priority values; multiplexers 549, 551 and 553 to select a search priority value from among the match-qualified priority values; and AND gates 555, 557, 559 and 561 to output the index select signals $IS_1$-$IS_4$ via multiplexer bank 570. Each of the OR gates 541, 543, 545, 547 outputs a respective match-qualified priority $QPS_1$, $QP_{S2}$, $QP_{S3}$, $QP_{S4}$ according to the state of the corresponding segment flags $SF_1$-$SF_4$. For example, if segment flag $SF_1$ is high (indicating a match condition), OR gate 541 will output the $PRI_{S1}$ value as the match-qualified priority value $QP_{S1}$. If $SF_1$ is low, indicating a mismatch condition, OR gate 541 will output a match disqualified priority value $QP_{S1}$ in which all constituent bits are high (i.e., due to the inversion of the segment flag at the input to OR gate 541), which, in the embodiment of FIG. 34, is the lowest possible priority value. OR gates 543, 545 and 547 are additionally coupled to receive the x4 signal so that, in the x4 mode, the priority values $QP_{S2}$, $QP_{S3}$ and $QP_{S4}$ are driven to the lowest possible priority value (i.e., disqualified because they are unused). Consequently, in the x4 configuration, the match-qualified priority values for segments 2-4 of the segmented memory will not exceed the match-qualified priority value for segment 1 and therefore are effectively ignored. That is, the segment 1 priority value, $PRI_{S1}$, is the priority value for a x4 entry. In alternative embodiments, any of others of the segments, including combinations of two or more segments may be used to source the x4 priority value. OR gates 543 and 547 are further coupled to receive the x2 signal so that, in the x2 mode, the priority values for segments 2 and 4 are ignored, the x2 entries being represented by priority values stored in segments 1 and 3. In alternative embodiments, others of the segments, including combinations of segments may be used to source the x2 priority values and/or the x4 priority value.

Comparator $C_1$ compares priority values $QP_{S1}$ and $QP_{S2}$ and generates a select signal 552 having a high logic state if priority value $QP_{S1}$ indicates a higher priority (or equal priority) than priority value $QP_{S2}$, and a low state if priority value $QP_{S1}$ indicates a lower priority than priority value $QP_{S2}$. That is, select signal 552 is high or low according to whether priority value $QP_{S1}$ or $QP_{S2}$, respectively, is the winner of the priority comparison in comparator $C_1$. The select signal 552 is input to multiplexer 549 to select the $C_1$ comparison winner (i.e., priority value $QP_{S1}$ or $QP_{S2}$) to be output to multiplexer 553 and comparator $C_3$. Similarly comparator $C_2$ compares the priority values $QP_{S3}$ and $QP_{S4}$ and generates a select signal 554 having a high or low state according to whether priority value $QP_{S3}$ or $QP_{S4}$ is the comparison winner. The select signal 554 is input to multiplexer 551 to select the $C_2$ comparison winner (i.e., priority value $QP_{S3}$ or $QP_{S4}$) to be output to multiplexer 553 and comparator $C_3$. Comparator $C_3$ compares the priority numbers output by multiplexers 449 and 551 and generates a select signal 556 having a high or low state according to whether the priority value from multiplexer 449 or 551 is the comparison winner. The select signal 556 is provided to a select input of multiplexer 553 to select the $C_3$ winner to be output as the search priority value 564 (SP). The select signals 552, 554 and 556 are also input to AND gates 555, 557, 559 and 561 to enable one of the AND gates to assert a high logic signal according to which priority value, $QP_{S1}$, $QP_{S2}$, $QP_{S3}$ or $QP_{S4}$, is the overall priority comparison winner. Thus, if select signals 552 and 556 are both high, then the output of AND gate 555 is high to indicate that $QP_{S1}$ is the priority comparison winner. Similarly, if select signal 552 is low and 556 high, the output of AND gate 557 is high to indicate that $QP_{S2}$ is the priority comparison winner; if select signal 556 is low and 554 high, the output of AND gate 559 is high to indicate that $QP_{S3}$ is the priority comparison winner; and if select signal 556 and 554 are both low, the output of AND gate 561 is high to indicate that $QP_{S4}$ is the priority comparison winner. Thus, when in the x1 configuration, the memory segment that sources the highest priority match-qualified priority value will cause the corresponding index select signal, $IS_1$-$IS_4$, to be asserted.

NFA priority logic 571 is provided to generate the insert priority value 574. As discussed above, the insert priority value 574 may be compared with insert priority values from other hash CAM blocks during a NFA operation to select a hash CAM block for entry insertion. In the embodiment of FIG. 34, the NFA priority logic 571 includes a multiplexer 572 to select between two predetermined priority values according to whether the indexed row within the segmented memory contains at least one occupied segment. More specifically, if the indexed row includes at least one occupied segment (indicated by a logic low segment flag), the output of AND gate 573 will be low, thereby selecting a first predetermined priority value (zero in this example) to be output as the insert priority value 574. Conversely, if all the segment flags indicate empty, an empty row within the segmented memory has been selected by a hash index and second predetermined priority value of (100H in this example, the 'H' indicating hexadecimal notation) is selected to be output as the insert priority value 574. In one embodiment, the first predetermined priority value has a higher priority than the second predetermined priority so that, a hash CAM block which is indexed at a partially filled row of a segmented memory will output a higher insert priority value than a hash CAM block which is indexed at a completely empty row. (Note that the NFA priority logic 571 need not account for a completely filled row because the block flag 474 will not be asserted in that circumstance). Different insertion policies may be used in alternative embodiments, however it is generally desirable to insert entries into partially filled rows within the segmented memory whenever possible in order to use the memory efficiently.

FIG. 35 illustrates alternative NFA priority logic 580 that may be used in place of NFA priority logic 571 of FIG. 34. The NFA priority logic 580 generates an insert priority value 582 having an R-bit fill count component 586 and at least one bit 588, referred to herein as a partial fill bit, that indicates whether or not at least one segment of the indexed memory row is occupied by at least one valid entry (i.e., a partially filled row). The R-bit fill count 586 is generated by a fill counter 585 which is incremented in response to an insert operation and decremented in response to a delete operation (i.e., an operation to invalidate an entry). Accordingly, the fill count 586 indicates the number of valid entries stored in the memory of a hash CAM block such that, in an embodiment in which numeric value is inversely proportional to priority, the less filled of two CAM blocks having matching partial fill bits 588 will output a higher priority value than the more filled CAM block. In the embodiment of FIG. 35, insert and delete signals (INS and DEL) are applied, respectively, to up and down inputs of the fill counter 585, the insert and delete signals being generated, for example, by an instruction decoder. In an alternate embodiment, the fill counter 585 may count down in response to the insert signal and up in response to the delete signal so that the less filled of two CAM blocks having matching partial fill bits 588 will output a numerically higher (lower priority) priority value than the more filled CAM block.

The partial fill bit 588 is generated by AND gate 573 according to the states of the segment flags $SF_1$-$SF_4$. Specifically, if any of the segment flags indicates an occupied segment (i.e., segment flag is low), the output of AND gate 573 goes low to produce a low partial fill bit 588. Conversely, if all the segment flags indicate unoccupied segments (i.e., all segments flags are high), the partial fill bit 588 is high. Thus, in the exemplary embodiment of FIG. 35, the partial fill bit 588 is 0 in the case of a partially (or completely) filled memory row, and 1 in the case of a completely unfilled memory row. In one embodiment, the partial fill bit is the most significant bit of the insert priority value 582 (or at least more significant than the fill count 586) so that a CAM block containing a partially filled row will output a numerically lower (i.e., higher priority) insert priority value than a CAM block containing no valid entries within the indexed row (i.e., a completely unfilled row), regardless of the relative fill levels of the two CAM blocks.

FIG. 36 illustrates an embodiment of the segment index encoder 493 of FIG. 32. The segment index encoder 493 receives the index select signals, $IS_1$-$IS_4$, from the segment priority logic and selects one of four predetermined segment indices, 00b, 01b, 10b or 11b (the 'b' indicating binary notation) to be output as the segment index 488. Each of the predetermined indices is an address to one of the four different segments within the segmented memory. Thus, if during either a NFA operation or a search operation, index select signal $IS_1$ is asserted, value 00 at port P1 of a multiplexer 581 is output as the segment index 488. That is, if segment 1 within the segmented memory is signaled to be unoccupied in a NFA operation, or signaled to contain a matching entry in a search operation, the address of that segment (i.e., 00b) will be output as the segment index 488. In one embodiment, the multiplexer 581 is designed to resolve ties (i.e., more than one index select signal being asserted) in favor of the lowest numbered of the index select signals. For example, if all four index select signals are asserted, the segment index that corresponds to index select signal $IS_1$ (i.e., 00b) is output as the segment index 488. Different tie resolution schemes may be used in alternative embodiments.

Figure 37:
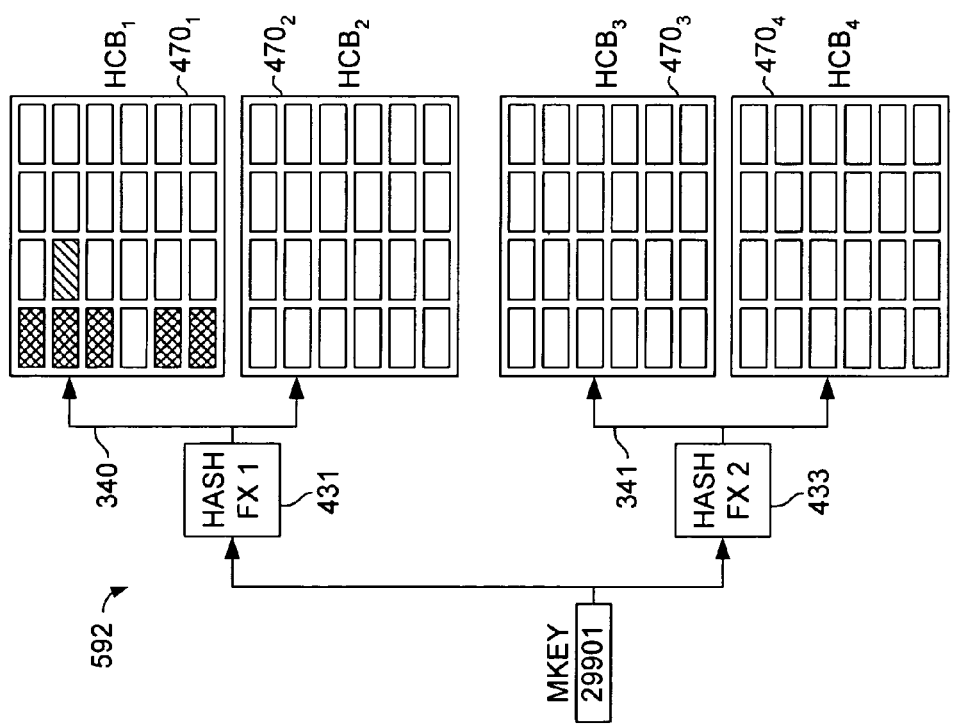
FIG. 37 illustrates a NFA operation within an exemplary CAM device having four hash CAM blocks, each of which includes a four-segment memory, and each of which outputs one of two insert priority values.

FIG. 37 illustrates a NFA operation within an exemplary CAM device 592 having four hash CAM blocks, $470_1$-$470_4$, each of which includes a four-segment memory, and each of which outputs one of two insert priority values according to whether an indexed memory row is partially filled (i.e., each hash CAM block includes NFA priority logic 571 of FIG. 34). For simplicity, each hash CAM block $470_1$-$470_4$ is depicted as having six memory storage rows (each with four segments), with hash CAM blocks 1 and 2 ($470_1$, $470_2$) programmed to select the hash index generated by a first hash function circuit 431 and hash CAM blocks 3 and 4 ($470_3$, $470_4$) programmed to select a hash index generated by a second hash function circuit 433. Thus, for a given masked key value (MKEY), the hash indices generated within hash CAM blocks 1 and 2 will be the same (i.e., index 340), and the hash indices generated within CAM blocks 3 and 4 will be the same (i.e., index 341), but, except in cases of coincidence, index 340 will be different from index 341. Also for simplicity, the key mask values and entry type values programmed within the four hash CAM blocks are assumed to be the same (i.e., all four hash CAM blocks are in the same insertion pool).

In the example of FIG. 37, hash CAM block 1 ($470_1$) includes five entries each stored within segment 1 (indicated by cross-hatched shading). Hash CAM blocks 2, 3 and 4 are each completely empty. Because hash CAM block 1 is indexed at a partially filled row, hash CAM block 1 will generate a numerically lower (higher priority) insert priority value than hash CAM blocks 2, 3 and 4. Thus, in FIG. 37, hash CAM block 1 is selected for entry insertion instead of hash CAM blocks 2, 3 and 4. The insertion location is indicated by lined shading (i.e., at row 2, segment 2 of hash CAM block 1).

Figure 38:
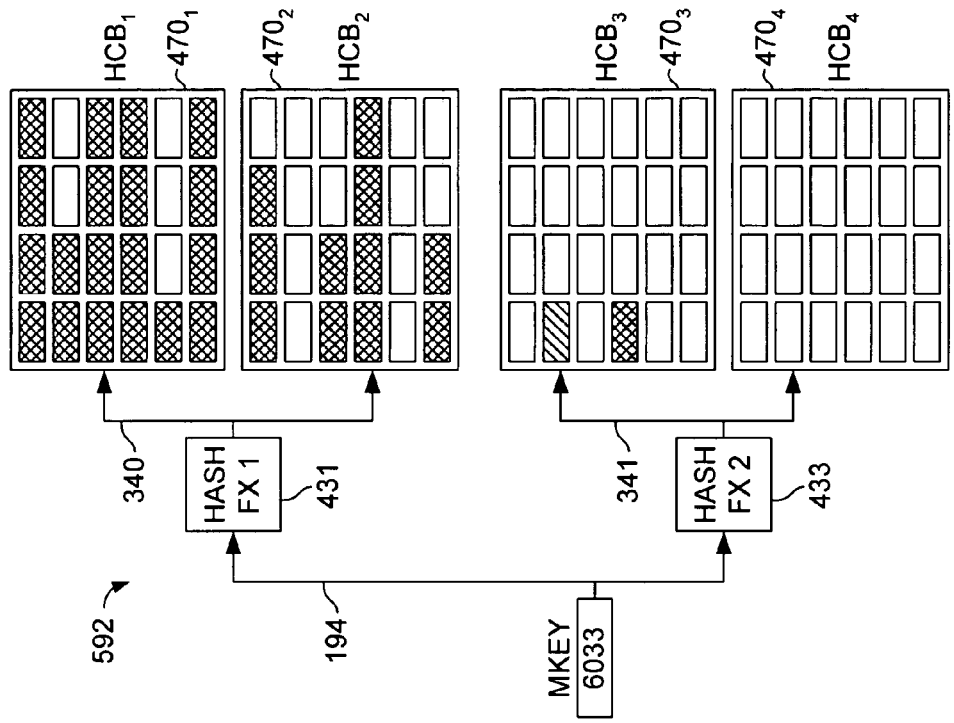
FIG. 38 illustrates another exemplary NFA operation within the hash CAM device of FIG. 37 after additional entries have been loaded.

FIG. 38 illustrates another exemplary NFA operation within the hash CAM device 592 of FIG. 37 after additional entries have been loaded into the hash CAM blocks 1, 2 and 3. Hash CAM block 4 is still completely empty. In this example, hash CAM blocks 1 and 2 are conflicted (i.e., the rows at the indexed location are fully loaded), and therefore will not assert a block flag signal. Hash CAM blocks 3 and 4, by contrast, both have completely empty rows at the indexed location. Because hash CAM blocks 3 and 4 both output the same priority number (the relative fill levels of the CAM blocks not being incorporated into the insert priority values), hash CAM block 3 is selected to store the entry according to a hardwired tie resolution policy that favors lower numbered hash CAM blocks. Different tie resolution policies may be implemented in alternative embodiments.

Figures 39, 40:
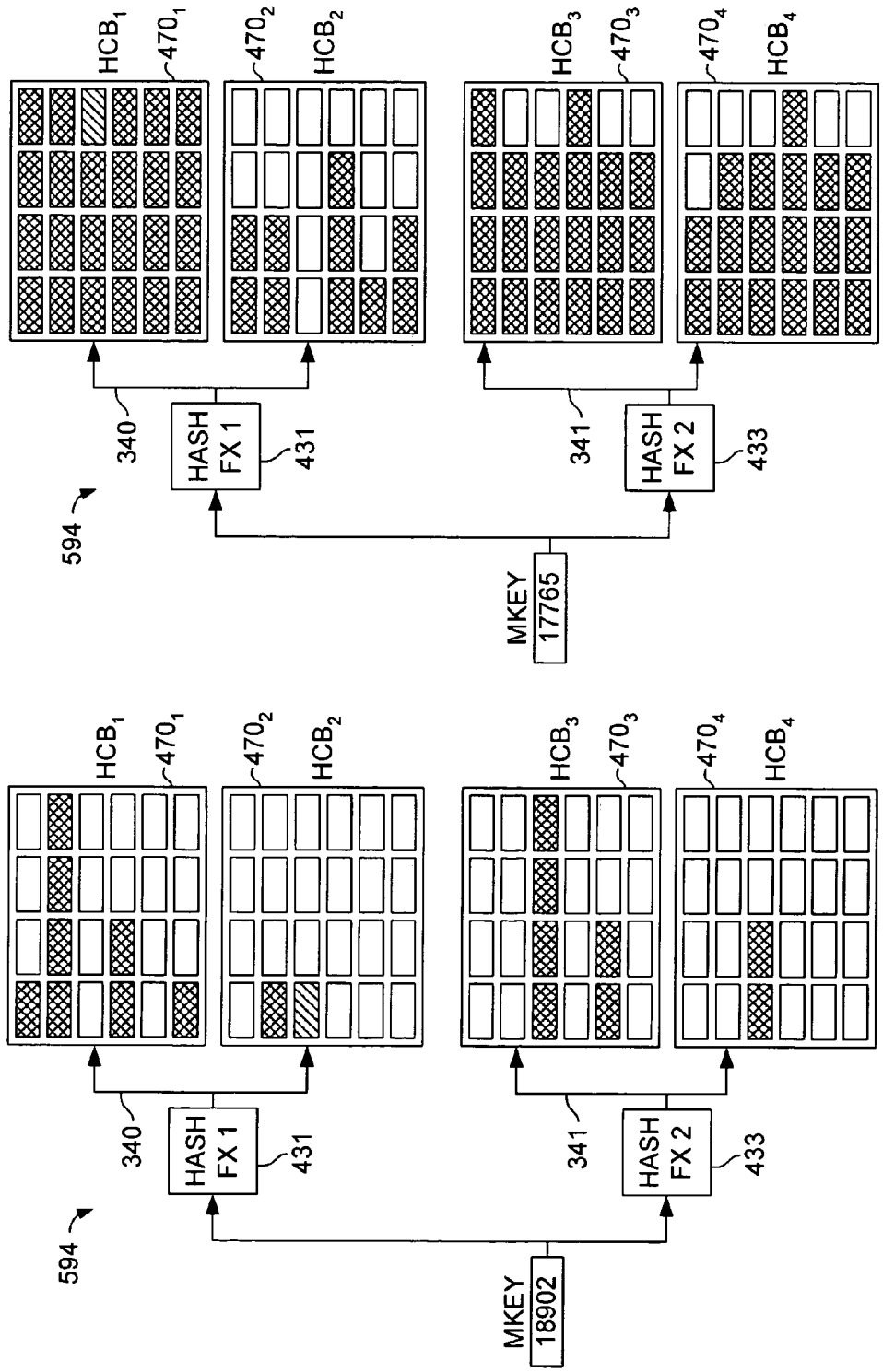
FIGS. 39 and 40 illustrate NFA operations within a hash CAM device that includes the NFA priority logic of FIG. 35.

FIGS. 39 and 40 illustrate NFA operations within a hash CAM device 594 that is identical to the exemplary hash CAM device 592 of FIGS. 37 and 38 except that the hash CAM device 594 includes the capacity-dependent NFA priority logic 580 of FIG. 35. Referring specifically to FIG. 39, hash CAM blocks 1, 2, 3 and 4 are all indexed at completely unfilled rows so that that the partial fill bit of the insert priority value for each hash CAM block is set. Because the fill level of hash CAM block 2 is lower than that of hash CAM blocks 1, 3 and 4, however (hash CAM block 2 contains only one entry, while hash CAM blocks 1, 3 and 4 each contain more than one entry), hash CAM block 2 outputs a numerically lower (higher priority) priority value than hash CAM blocks 1, 3 and 4 and is therefore selected for entry insertion.

In the example of FIG. 40, only hash CAM blocks 1, 2 and 4 are able to store the data value within the indexed row (hash CAM block 3 is conflicted). Hash CAM block 2 is the least filled of hash CAM blocks 1, 2 and 4, but is indexed at a completely empty row. Consequently, the most significant bit of the insert priority value output by hash CAM block 2 will be set. By contrast, hash CAM blocks 1 and 4 are indexed at partially filled rows and therefore will have a cleared most significant bit within their insert priority values. Thus, the insert priority values output by hash CAM blocks 1 and 4, will be numerically lower (higher priority) than the insert priority value output by hash CAM block 2, even though hash CAM block 2 is less filled than hash CAM blocks 1 and 4. Hash CAM blocks 1 and 4 will output equal priority values because each contains the same number of at least partly occupied rows (i.e., fill counter 585 of FIG. 35 will have been incremented each time an unfilled row within the binary CAM was loaded with a new hash index to enable storage of an entry within an unfilled row of the corresponding memory). Because hash CAM blocks 1 and 4 both output the same priority number, hash CAM block 1 is selected to store the entry according to a hardwired tie resolution policy that favors lower numbered hash CAM blocks. Different tie resolution policies may be implemented in alternative embodiments.

Although FIGS. 39 and 40 illustrate NFA examples using a least-filled insertion policy, a most-filled insertion policy (i.e., policy which favors a more-filled rather than a less filled hash CAM block for entry insertion purposes) may be applied instead. A most-filled insertion policy may be implemented, for example, by using an empty counter rather than the fill counter 585 within the NFA priority logic of FIG. 35. The empty counter may be preloaded to a predetermined value, then decremented in response to each binary CAM load operation (i.e., indicated by assertion of the INS signal) and incremented in response to each binary CAM delete operation (i.e., indicated by assertion of the DEL signal). Referring to FIG. 39, in such an embodiment, hash CAM block 1 would output a numerically lower (higher priority) priority value than hash CAM blocks 2, 3 and 4 because more of its rows are filled or at least partially filled (i.e., hash CAM block 4 has an occupied row count of 4, while hash CAM block 2 has an occupied row count of 2, and hash CAM blocks 2 and 4 each have an occupied row count of 1).

Indirect Hashing Using Binary CAM

Figure 41:
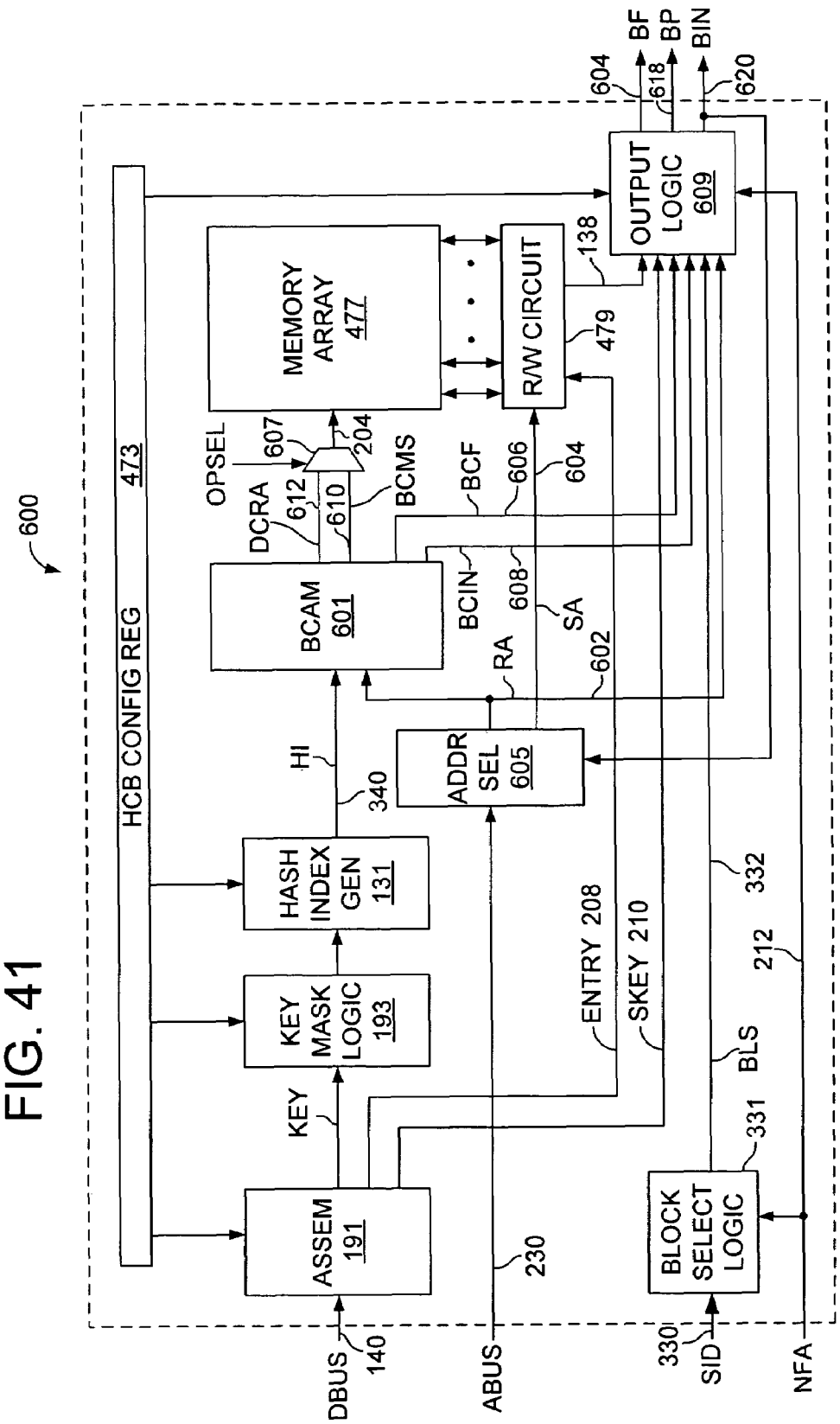
FIG. 41 illustrates another embodiment of a hash CAM block.

FIG. 41 illustrates another embodiment of a hash CAM block 600 which may be used within any of the multiple hash block CAM devices or single hash CAM block devices described above. The hash CAM block 600 includes an assembler circuit 191, key mask logic 193, hash index generator 131, block select logic 331 and configuration register 473, all of which operate as generally described above in reference to FIG. 31. The hash CAM block 600 additionally includes a binary CAM circuit 601 to perform a function referred to herein as indirect hashing. In indirect hashing, the hash index 340 generated by the hash index generator 131 is not used to index the memory 477 directly, but rather is compared with stored hash indices within the binary CAM 601 to identify a matching hash index within a storage row of the binary CAM 601, and to select a corresponding row within a memory array 477.

Figure 42:
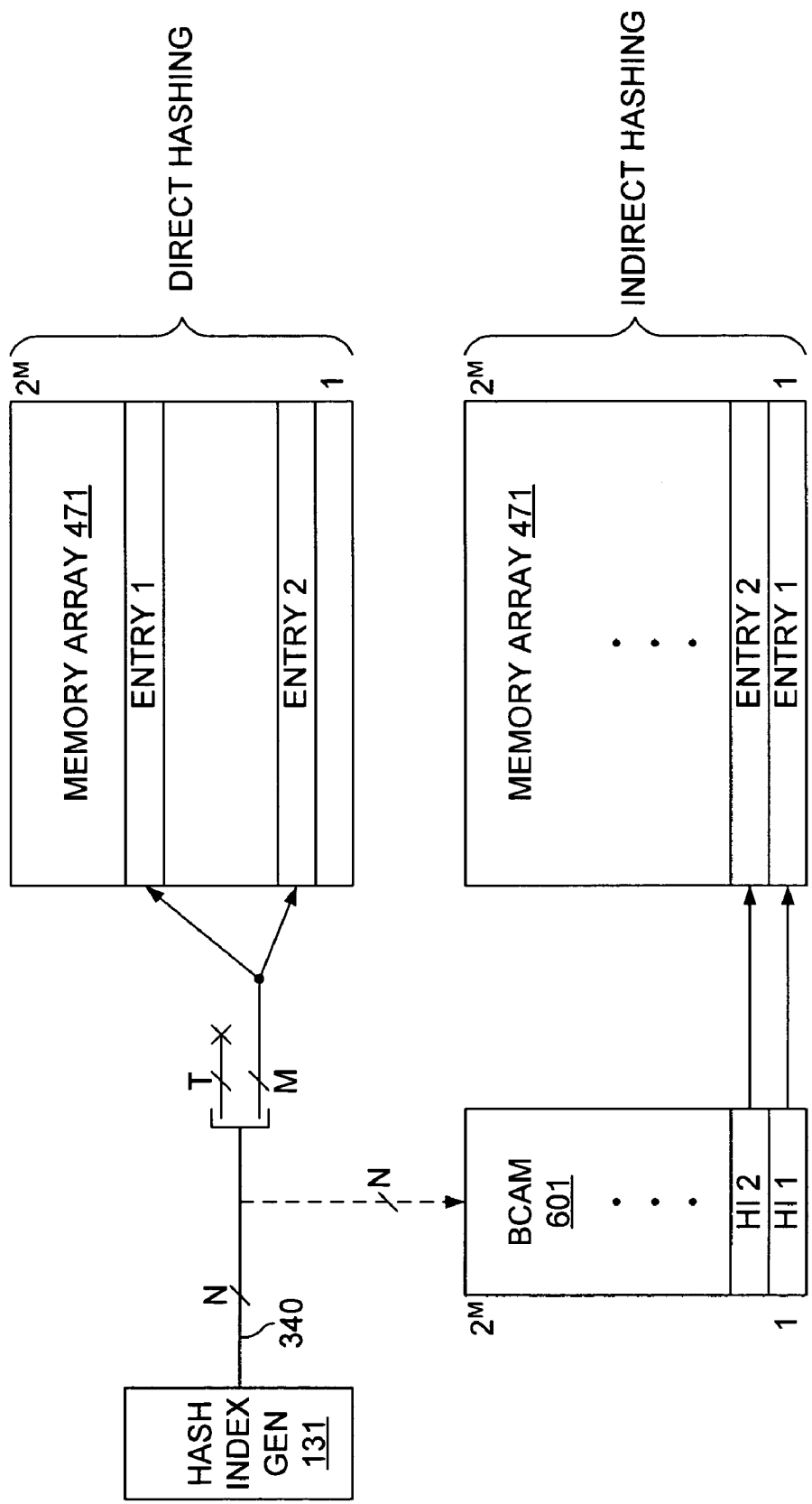
FIG. 42 illustrates the different results produced by direct hashing and indirect hashing.

FIG. 42 illustrates the different results produced by direct hashing, in which a hash index is used to address the memory array 477 directly, and indirect hashing achieved through use of the binary CAM 601. As shown, the hash index generator 131 generates a hash index 340 having N constituent bits. Because the memory Array 477 only has $2^M$ storage rows, however, only M of the N bits within hash index 340 may be used to directly address the memory array 477. That is, in a direct hashing scheme, either the hash index generator 131 generates a hash index having a number of bits that corresponds to the size of the memory to be addressed, or the hash index is truncated to the appropriate number of bits before addressing the memory array. The truncation of T bits from the N-bit hash index is shown in the direct hashing example of FIG. 42 (i.e., N=M+T). The truncation of T bits reduces the overall hashing space by a factor of $2^T$, thereby increasing the likelihood of collisions relative to indirect hashing. By contrast, in the indirect hashing approach, the full set of N bits may be used (or at least more than M bits) to select a row of the memory array 477, even though the memory array 477 has fewer than $2^N$ storage rows. As shown, the binary CAM 601 is used to store the full N-bit hash index within a selected row of CAM cells during an insert operation, the selected row of CAM cells corresponding to a row within the memory array in which the entry is inserted. In a search operation, the hash index generated by the hash index generator 131 is compared with each of the hash indices stored within the binary CAM 601 to determine whether the hash index has previously been loaded into the binary CAM 601. If a match is found, a match line corresponding to the row of the binary CAM 601 containing the matching hash index is activated. In one embodiment, the match line is used to drive a corresponding word line within the memory array. By this arrangement, a matching hash index within the binary CAM enables read or write access to the corresponding storage row within the memory array 477. Thus, the binary CAM effectively presents a larger hash index space to the address generation circuitry (i.e., the hash index generator 131) than is provided by the underlying memory array 477. Because the full hash index 340 may be used (that is, rather than a truncated hash index), the likelihood of collisions between incoming data values is substantially reduced (i.e., as compared with direct hashing). Further, as shown in FIG. 42, the binary CAM may be loaded in a predetermined manner (e.g., bottom to top, top to bottom, etc.) such that the full space within the memory array may be used. This is in contrast to the direct hashing approach in which the memory array may be filled only up to a certain percentage before collisions become so statistically likely that the hash CAM block is, for practical purposes, full.

In one embodiment, the hash index generator 131 generates a 16-bit hash index (a CRC value), the memory array contains 512 rows (i.e., addressable by a $\log_2(512)=9$ bit address), and the binary CAM stores 12 bits of the hash index, thus truncating the hash index by four, but not all seven extra bits. In an alternative embodiment, a ternary CAM may be used to store the full hash index together with mask information to mask out selected bits of the hash index. For example, a ternary CAM having a 16-bit storage width may be used to store a full 16-bit hash index, with any number of the hash index bits masked to produce, in effect, a smaller hash index. The hash index bits to be masked, if any, may be configured by a value stored within the configuration register of the hash CAM block. By this arrangement, different hash CAM blocks may be configured to use unmasked portions of a hash index to further reduce the likelihood of collisions in the CAM device. It should be noted that not all the CAM cells within such a ternary CAM device (i.e., ternary CAM device used to support indirect hashing) need to be ternary CAM cells. That is, each row within the ternary CAM device could include a number of binary CAM cells and a number of ternary CAM cells according to application needs.

Figure 43:
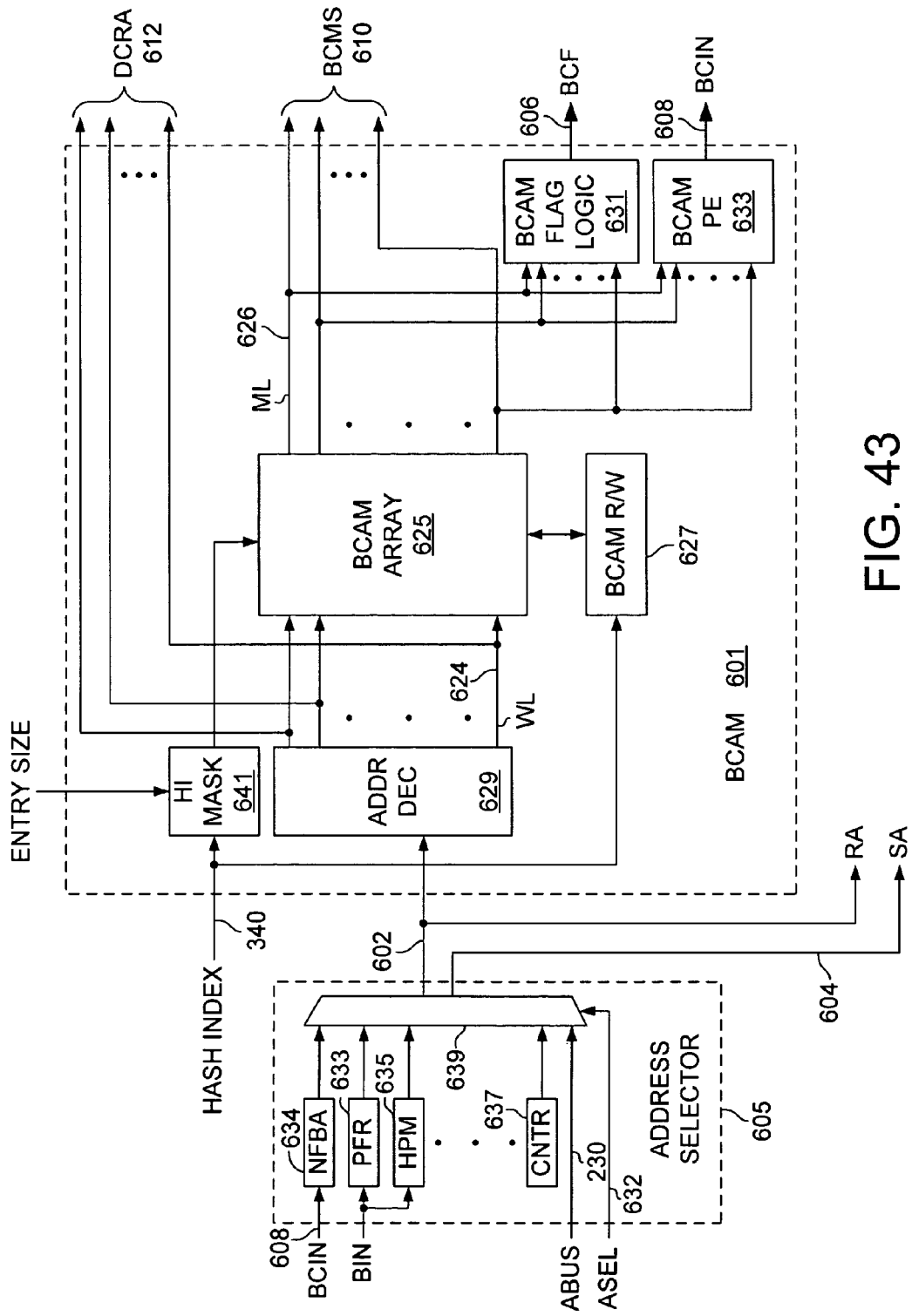
FIG. 43 illustrates an embodiment of the binary CAM and the address selector of FIG. 41.

In applications in which insertion policy favors insertion at partially filled rows, it may be desirable to increase the likelihood of a match within the binary CAM array 625 by masking selected bits of the hash index, effectively selecting a smaller hash index. In the embodiment of FIG. 43, a hash index mask circuit 641 is provided to mask selected bits of the hash index 340 in accordance with the entry size value within the block configuration register. As a specific example, for a x1 configuration, a truncated, 12-bit hash index 340 is output from the hash index generator 131 and four of the bits of the hash index 340 are masked by the hash index mask circuit 641 for x1 entries; two bits of the hash index 340 are masked by the hash index mask circuit 641 for x2 entries, and none of the bits of the hash index 340 are masked by the hash index mask circuit 641 for x4 entries. This hash index masking policy reflects the significance of partially filled rows for the x1, x2 and x4 configurations. That is, there can be no partially filled row in the x4 configuration (row is either entirely occupied or unoccupied), and partially filled rows are statistically more likely in the x1 configuration than the x2 configuration due to the fact that a partially filled row remains partially filled in the x1 configuration until it has been selected for entry insertion four times (versus two times for the x2 configuration). Different masking levels may be used in alternative embodiments, including embodiments having more or fewer entry segments and therefore different configurations in which partially filled rows are possible. Also, different hash index truncation selections may be enabled in different hash CAM blocks within a given device. For example, in one embodiment some of the hash CAM blocks include memory arrays (and binary CAM arrays) having 512 storage rows, while others of the hash CAM blocks include memory arrays (and binary CAM arrays) having 256 storage rows. Different hash index truncation selections may be programmed for the different hash CAM blocks according to the total addressable storage space (and therefore the storage capacity) of the memory array.

In an alternative embodiment, the hash index mask circuit 641 may be omitted and a ternary CAM array may be used in place of the binary CAM array 625. Mask values may then be stored with each hash index 340 loaded into the ternary CAM to effect the desired level of hash index masking. In another alternative embodiment, the hash index 340 is not masked for any of the entry size configurations (or to achieve truncation) so that the hash index mask circuit 641 may be omitted altogether.

Returning to FIG. 41, the binary CAM 601 is coupled to receive a hash index 340 from hash index generator 131 and outputs a decoded row address 612 (DCRA) and a set of binary CAM match signals 610 (BCMS) to a multiplexer 607. The multiplexer 607 is responsive to an operation select signal (OPSEL) to select either the decoded row address 612 or the binary CAM match signals 610 to drive the word lines of the memory array 477. For example, during a NFA operation or search operation, the binary CAM match signals 610 are selected by the multiplexer 607 to drive the word lines of the memory array 477. Accordingly, if a matching hash index is detected within the binary CAM 601 during an NFA or search operation, the asserted binary CAM match signal enables the corresponding row of the memory array 477 to be sensed by the sense amplifiers banks within the read write circuit 479 and provided to the output logic 609. During an insert operation (or other write operation), a row address 602 (RA) output from an address selector 605 is decoded within the binary CAM 601 to generate the decoded row address 612. If the insert operation involves loading a new hash index into the binary CAM 601, the hash index is loaded into the binary CAM row indicated by the decoded row address 612. If the insert operation involves loading a new entry into a partially filled row of the memory array (that is, a row for which a corresponding hash index is already stored in the binary CAM 601), a hash index is not stored in the binary CAM 601. In either case, the decoded row address 612 is selected by the multiplexer 607 to activate the corresponding word line within the memory array 477 and thereby enable an entry to be stored within the indicated storage row.

The binary CAM 601 also outputs a binary CAM index 608 (BCIN) and binary CAM flag 606 (BCF) to the output logic 609 where they are used to generate a block index 620 (BIN), block priority value 618 (BP) and block flag 616 (BF). The block index 620 is fed back to the address selector 605 to update selected address registers therein. It should be noted that, instead of outputting a decoded address to the memory array 477, a separate address decoder may be provided to receive an encoded address from binary CAM 601, and to decode the encoded address to activate the indicated word line within the memory array 477. In such an embodiment, the multiplexer 607 may receive the row address 602 output by the address selector (i.e., instead of the decoded row address 612) and the binary CAM index 608 output by the binary CAM 601 (i.e., instead of the binary CAM match signals). During an NFA or search operation, the binary CAM index 608 is selected to address the memory array 477, and during other operations (e.g., an insert operation), the row address 602 is selected to access the memory array 477.

In the embodiment of FIG. 41, the memory array 477 is a segmented array that operates in the manner described above in reference to FIG. 31. Accordingly, the address selector 605, in addition to outputting the row address 602 to the binary CAM 601, also outputs a segment address 604 (SA) to the read write circuit 479. The segment address is used to select one or more write driver or sense amplifier banks within the read/write circuit 479 to perform a write or read at the indicated segment(s) of the word-line selected row. As in the embodiment of FIG. 31, entry size information stored within the configuration register 473 is provided to the read/write circuit to control the number of memory segments accessed during a given insert, search or NFA operation. In an alternative embodiment, an unsegmented memory array (i.e., memory containing a single segment) may be used in place of memory array 477. Also, while memory array 477 is described below as having four segments and corresponding numbers of supporting circuits, more or fewer segments may be included within the memory array 477 in alternative embodiments. Further, in a single segment embodiment, compare logic (e.g., element 135 of FIG. 6) may be used in place of the output logic 609.

FIG. 43 illustrates an embodiment of the binary CAM 601 and the address selector 605 of FIG. 41. The binary CAM 601 includes an address decoder 629, binary CAM array 625, binary CAM read/write circuit 627, binary CAM flag logic 631, and binary CAM priority encoder 633. The address decoder 629 is coupled to receive the row address 602 from the address selector 605, and decodes the row address to activate an indicated one of word lines 624. The signals carried on word lines 624 constitute the decoded row address 612 and are output from the binary CAM 601 as shown. The binary CAM array 625 includes a plurality of rows of CAM cells each including a storage element and a compare circuit to enable an input hash index 340 to be simultaneously compared with the contents of each binary CAM row. The binary CAM read/write circuit 627 is used to store a hash index 340 in the binary CAM array 625 during a binary CAM load operation. The binary CAM read/write circuit 627 may also be used to read the contents of the binary CAM array 625, for example, for test purposes. During a NFA operation or a search operation, a hash index 340 is compared with the contents of each row of CAM cells within the binary CAM array 625 to generate a plurality of binary CAM match signals 610. Each binary CAM match signal indicates whether the contents of the corresponding binary CAM row matches the hash index, and is output via a respective one of the binary CAM match lines 626 (ML). The binary CAM flag logic 631 and the binary CAM priority encoder 633 are each coupled to the binary CAM match lines 626 to receive the binary CAM match signals 610. The binary CAM flag logic 631 outputs the binary CAM flag 606 (BCF) according to whether a match is detected within the binary CAM 601 during a search or NFA operation. The binary CAM priority encoder 633 outputs the binary CAM index 608 (BCIN) according to which, if any, of the binary CAM match signals 610 is asserted. Thus, the binary CAM index 608 is a row address that corresponds to a row of CAM cells within the binary CAM array 625 that contain a hash index that matches the input hash index 340. In one embodiment, the binary CAM priority encoder 633 is a multiplexer circuit that selects one of a plurality of row address values according to which of the binary CAM match signals 610, if any, is asserted during a binary CAM search operation. In an alternative embodiment, the binary CAM priority encoder 633 is a lookup table (e.g., a read only memory) that is indexed by binary CAM match signals such that an asserted one of the binary CAM match signals 610 selects a corresponding row address value to be output from the lookup table as the binary CAM index 608. Note that, in an embodiment of the binary CAM in which only one of binary CAM match signals 610 is asserted for a given search (i.e., no multiple match) the priority encoder 633 may be replaced by an encoder circuit that encodes the asserted one of the match signals 610 into a row address. The encoder circuit may be implemented, for example, by a multiplexer circuit or a lookup table as discussed above.

During a load operation in the binary CAM 601, a hash index 340 is stored within a selected row of CAM cells within the binary CAM array 625, and validity values for each of the CAM rows are output on the match lines to indicate whether the corresponding row of CAM cells within the binary CAM array 625 are occupied. The binary CAM flag logic 631 generates the binary CAM flag 606 according to the state of the validity values. If the validity values indicate that all the rows of the binary CAM array 625 are occupied by valid hash indices, the binary CAM array 625 is full, and the binary CAM flag 606 is deasserted to indicate the full condition. The binary CAM priority encoder 633 also operates on the validity signals to generate a binary CAM index 608 that is indicative of a next free address within the binary CAM array 625. That is, the binary CAM priority encoder 633 generates an address of the highest priority location within the binary CAM array 625 indicated to be unoccupied by a corresponding validity signal.

In one embodiment, the binary CAM index 608 generated during a binary CAM load operation is buffered in a next free binary CAM address (NFBA) register 634 within the address selector 605. As discussed below, if no match is detected within the binary CAM array 625 during a subsequent NFA operation, the address value within the NFBA register 634 is selected by multiplexer 639 to be output as row address 602 and is selected by output logic 609 of FIG. 41 to be a row index portion of the block index 620.

The address selector 605 additionally includes a partially filled row (PFR) register 633, a highest priority match (HPM) register 635 and an address counter 637 (CNTR), all of which are used to store address values. The partially filled row register 633 is used to store the block index 620 generating during a NFA operation that indexes a partially filled row (i.e., as opposed to a NFA operation in which no match is detected in the binary CAM 601). The HPM register 635 is used to store the block index 620 generated during a search operation that results in a match detection. Address counter 637 may be selected by multiplexer 639 to provide a sequence of ascending or descending indices to the binary CAM 601 and memory array 477, for example, to enable the binary CAM 601 and memory array 477 to be sequentially loaded with entries (e.g., during system startup). In alternative embodiments more or fewer address sources may be included within and/or selected by the address selector 605. For example, an error address register or test address generator may be included within the address selector 605 and selected by the multiplexer 639 to provide a sequence of error check addresses to the binary CAM 601 and/or memory array 477. In the embodiment of FIG. 43, the multiplexer 639 is responsive to address select information 632 (ASEL) from an instruction decoder to select one of the address sources. In one embodiment, an address bus 230 is also coupled to a input port of the multiplexer 639 to enable externally generated addresses to be selected to address the binary CAM array 601 and/or the memory array 477. The address selector 605 outputs the row address portion 602 (RA) of the selected address to the address decoder 629 within the binary CAM 601 and also to the output logic 609 of FIG. 41. The address selector 605 also outputs a segment address portion 604 (SA) of the selected address to the read/write circuit 479 of FIG. 41. As discussed above, the segment address 604 is used to control access to individual segments within the memory array during insert, read and other memory access operations.

Figure 44:
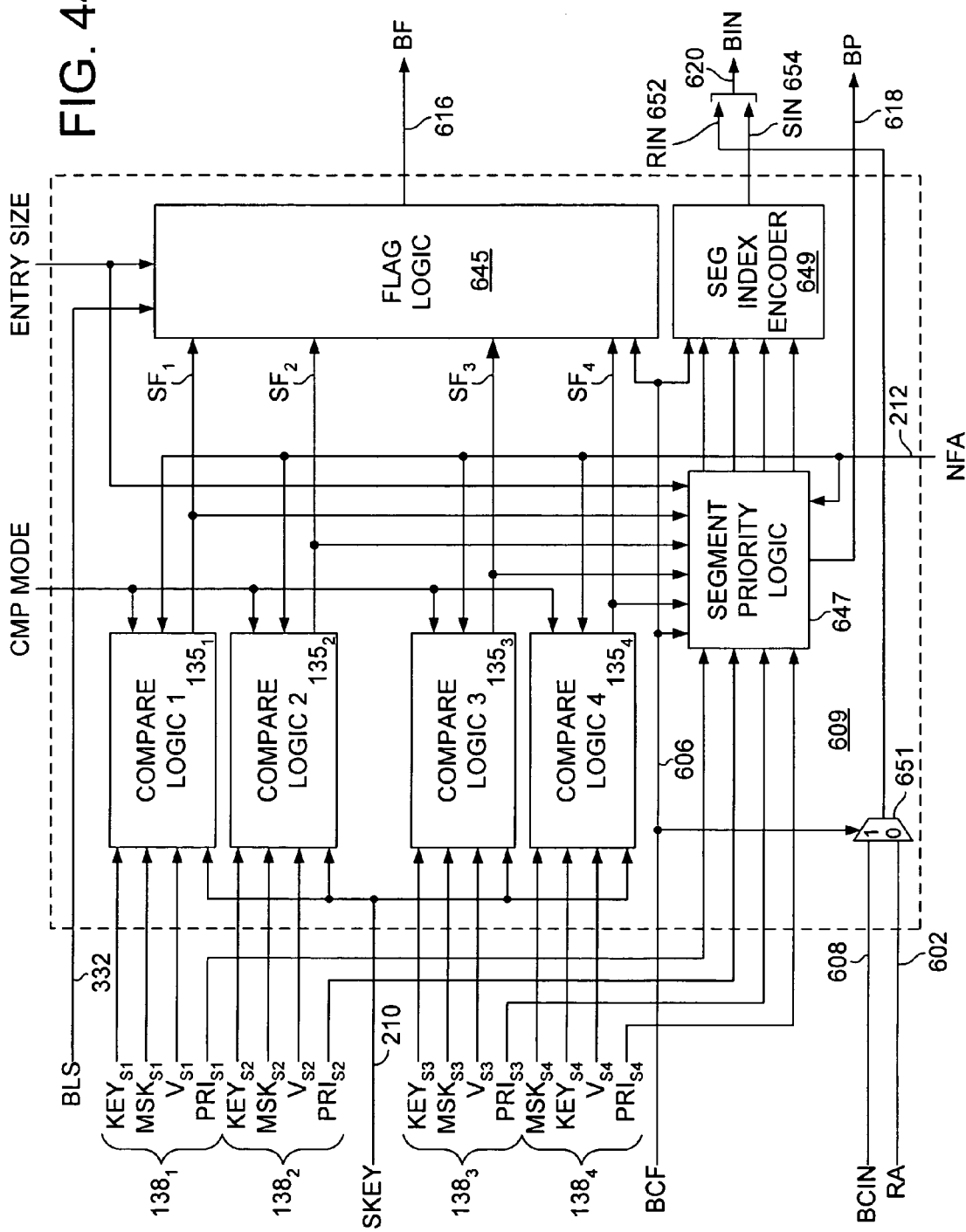
FIG. 44 illustrates an embodiment of the output logic of FIG. 41.

FIG. 44 illustrates an embodiment of the output logic 609 of FIG. 41 (other embodiments may be used). The output logic 609 includes compare logic circuits $135_1$-$135_4$, flag logic 645, segment priority logic 647 and segment index encoder 649, all of which perform the same general functions as corresponding circuit blocks within the output logic 475 of FIG. 32. Also, like the output logic 475 of FIG. 32, the output logic 609 receives the segment entries $138_1$-$138_4$, search key 210, block select signal 332 and NFA signal 212 as inputs. The output logic 609 additionally receives the binary CAM flag 606 (BCF), binary CAM index 608 (BCIN) and row address 602 (RA) as inputs. The binary CAM flag 606 is input to the segment priority logic 647 and also to the flag logic 645 and segment index encoder 649. The binary CAM index 608 and row address 602 are alternatively selected to be the row index component 652 of the block index 620 depending upon whether the binary CAM flag 606 is asserted. During a NFA operation, the next free binary CAM address is selected (e.g., from the NFBA register 634 within the address selector 605 of FIG. 43) to drive the row address 602 so that the multiplexer 651 effectively selects either the binary CAM index 608 or the next free binary CAM address to be the row index 652. Thus, if during a NFA operation, no match is found within the binary CAM (meaning that the hash index has not previously been stored in the binary CAM), the binary CAM flag 606 is not asserted and the multiplexer 651 selects the next free binary CAM address to be the row index 652. If the binary CAM flag is asserted during the NFA operation (meaning that the hash index has previously been stored within the binary CAM), the binary CAM index 608 is indicative of the location of a matching hash index within the binary CAM and is selected to be the row index 652.

Still referring to FIG. 44, the compare logic circuits $135_1$-$135_4$ operate as described above in reference to FIG. 32 to generate segment flags $SF_1$-$SF_4$. Each segment flag corresponds to a respective segment within the segmented memory and indicates, during a NFA operation, an empty/occupied status of the segment. During a search operation, each segment flag indicates whether the content of the corresponding segment matches the search key 210 (or portion thereof).

FIG. 45 illustrates the flag logic 645 of FIG. 44 according to one embodiment. The flag logic 645 receives the segment flags SF1-SF4 and entry size signals, x1, x2 and x4 as inputs and includes the logic gates 501, 503, 505, 507, 509, 511, 513, 515 and 517 described above in reference to FIG. 33. The flag logic additionally receives the binary CAM flag 606 and NFA signal 212 and includes a storage element 667 (a D-flip flop in this example) to store a buffered binary CAM flag 662 in response to a write strobe signal 660 (WSTB). Logic gates 501, 511 and 517 operate as described in reference to FIG. 33 to output a logic high signal if the x1 signal is high (i.e., x1 mode selected) and any of segment flags $SF_1$-$SF_4$ are high (indicating a match detection during a search operation, or detection of an unoccupied segment during a NFA operation). Because the segment flags are only meaningful if a binary CAM match was detected during a search or NFA operation (otherwise, no match signal was asserted by the binary CAM to select an entry to be input to the output logic 609) and if the CAM block is allocated to the entry type pool or insertion pool indicated by the corresponding search or NFA instruction, the output of logic OR gate 517 is ANDed with the binary CAM match flag 606 and the block select signal in AND gate 661. The output of AND gate 661, if high, will cause OR gate 663 to assert the block flag 616. Logic gates 503, 505, 507, 513 and 517 also operate as described in reference to FIG. 33 to output a logic high signal if the x2 signal is high and either pair of segment flags $SF_1/SF_2$ or $SF_3/SF_4$ indicate a x2 match/empty condition, and logic gate 503, 505, 507, 509 and 515 operate as described in reference to FIG. 33 to output a logic high if the x4 signal is high and all four segment flags $SF_1$-$SF_4$ are asserted (i.e., to indicate a x4 match/empty condition). Because the output of OR gate 517 is ANDed with the block select signal 332 and the binary CAM flag 606, as in the x1 mode, the block flag 616 will be asserted in response to a match/empty detection in the x2 and x4 modes only if the block select signal 332 is high and a match is detected in the binary CAM (i.e., binary CAM flag 606 high).

The flag logic 645 includes an additional path for assertion of the block flag 616 in the event that the binary CAM flag 606 is not asserted during a NFA operation, but the binary CAM is not full. That is, if the binary CAM flag 606 is not asserted during the NFA operation then no matching index was located within the binary CAM; a result indicating that the hash CAM block is not conflicted. Accordingly, so long as the binary CAM is not full, the new hash index (i.e., the storage index generated in response to the entry candidate) may be stored in the next free address of the binary CAM and the entry candidate may be stored in the corresponding row of the memory. In the embodiment of FIG. 45, the write strobe signal 660 is asserted (e.g., by an instruction decoder) during a binary CAM load operation; an operation during which the binary CAM flag 606 is low if the binary CAM is full and high if the binary CAM is not full. Thus, the buffered binary CAM flag 662 indicates whether the binary CAM is full. The buffered binary CAM flag 662, block select signal, and NFA signals 212 are supplied to non-inverting inputs of AND gate 665, and the binary CAM flag 606 is supplied to an inverting input of AND gate 665. Consequently, AND gate 665 outputs a high signal to OR gate 663 (resulting in assertion of the block flag 616) if the hash CAM block is selected to participate in a NFA operation (block select signal 332 and NFA signal 212 are high) in which no match is detected in the binary CAM (binary CAM flag 606 is low) and the binary CAM is not full (buffered binary CAM flag 662 is high).

FIG. 46 illustrates a NFA priority logic embodiment 670 that may be included within the segment priority logic 647 of FIG. 44 (other embodiments may be used). The NFA priority logic 670 generates an insert priority value 672 in the manner described in reference to the NFA priority logic 580 of FIG. 35, except that OR gate 671 is provided to force partial fill bit 674 to a logic high state (thereby indicating a completely empty row) if the binary CAM flag 606 is not high. That is, if no match is detected in the binary CAM during a NFA operation, an ensuing entry insertion within the hash CAM block (i.e., if the hash CAM block is selected for entry insertion) will occur in a completely unfilled row. If a match is detected in the binary CAM, the binary CAM flag 606 will be high to enable AND gate 573 to control the state of the partial fill bit 674. AND gate 573 will drive the partial fill bit 674 high if any of the segment flags $SF_1$-$SF_4$ indicate an empty segment.

The fill counter 585 within priority logic 670 is incremented in response to a binary CAM load (indicated by a BCWR signal) and decremented in response a binary CAM delete (indicated by a BCDEL signal). By this arrangement, the fill counter 585 indicates the number of rows within the memory array which are at least partially filled. As discussed above, different fill measures may be used in alternative embodiments, and the fill count may be omitted from the insert priority value 672 altogether.

FIG. 47 illustrates an embodiment of the segment index encoder 649 of FIG. 44 (other embodiments may be used). The segment index encoder 649 operates similarly to the segment index encoder 493 of FIG. 36, except that an additional multiplexer 675 is provided to force the segment index 654 to zero if the binary CAM flag 606 is not asserted. Thus, if no match is found within the binary CAM during a NFA operation, any subsequent insertion into the memory array will occur within a completely unfilled row and therefore will be directed to a predetermined segment of the row (in this example, the segment indicated by segment address 00b). Note that, in an alternate embodiment, the binary CAM flag 606 may be inverted, then logically ORed with index select signal $IS_1$ to achieve the same result achieved by the addition of multiplexer 675.

FIG. 48 is a flow diagram of a NFA operation within a hash CAM device that includes N hash CAM blocks each according to FIG. 41. At $691_1$-$691_N$, concurrent NFA operations are performed within each of the N hash CAM blocks. In one embodiment, a NFA operation is also performed within the overflow CAM block at $691_{N+1}$ (i.e., concurrently with operations $691_1$-$691_N$) to determine whether the overflow CAM block includes any storage rows that are at least partly unoccupied and that have been tagged with an entry type that matches the class code specified by the NFA instruction. If such a storage row is detected, the overflow CAM outputs a predetermined priority value and asserts its block flag. This operation of the overflow CAM is discussed below in greater detail.

Still referring to FIG. 48, at 693 the block flags are priority encoded according to their corresponding block priority values to generate a block identifier (BID). The block index that corresponds to the block identifier is selected as the block index component of the device index (i.e., $BIN_{SEL}$). At 695, the block identifier and selected block index are output as the device index (DIN), and the device flag is generated, for example, by ORing the block flags from the hash CAM blocks and the overflow CAM block. At 697, the device flag is evaluated to determine whether a CAM block (hash CAM block or overflow CAM block) within the CAM device is able to store the entry candidate. If the device flag is not asserted, the hash CAM device is unable to store the entry (699). If the device flag is asserted, the entry is inserted at the CAM block and memory location indicated by the device index (701). The entry may be inserted at the indicated location without further host instruction (i.e., CAM device automatically inserts the entry in response to assertion of the device flag), or, alternatively, in response to a separate insert instruction from a host device.

FIG. 49 is a flow diagram of a NFA operation within an $i^{th}$ one of the hash CAM blocks of FIG. 41, i being any integer value from 1 to N. At 709, the class code of the NFA instruction (CC) is compared with the entry type of the CAM block ($ET_i$), and the mask code of instruction (MC) is compared with the key mask of the CAM block ($KM_i$). If the class code does not match the entry type or the mask code does not match the key mask, the block flag is deasserted at 727 and the NFA operation within the hash CAM block is concluded. If the class code matches the entry type and the mask code matches the key mask, a key is generated at 711 and used to generate a hash index ($HI_i$) at 713. At 715, the binary CAM is searched for a match with the hash index generated at 713. If a matching hash index is detected within the binary CAM at 717, the corresponding row of the memory array is output to the output logic to determine whether the row is full (719). If the row is not full, a partially filled row has been detected. Accordingly, at 723, the binary CAM fill count is output as the block priority value (the partial fill bit being cleared to 0), the block flag is asserted, and the binary CAM index (BCIN) and segment index (i.e., address of an unoccupied segment within the partially filled row) are output as the block index. If the row is full, the hash CAM block is conflicted and the block flag is deasserted at 727.

If a match is not detected within the binary CAM (717), then at 721 a buffered binary CAM flag (stored during the most recent binary CAM load operation) is inspected to determine whether the binary CAM is full. If the binary CAM is full, the block flag is deasserted at 727. If the binary CAM is not full, then at 725 the binary CAM fill count and a logic high partial fill bit (indicated by the summation of 200 hex and the fill count in the example of FIG. 49) are output as the block priority value, the block flag is asserted, and the next free binary CAM address (NFBA) and predetermined segment index (00 in this example) are output as the block index.

FIG. 50 is a flow diagram of an insert operation within hash CAM device that includes multiple hash CAM blocks each according to FIG. 41. At 741, the block ID component of a device index generated during the NFA operation of FIG. 48 is compared with the block ID of the overflow CAM ($BID_{OFC}$) to determine whether the entry candidate is to be inserted within the overflow CAM. If so, then at 743 the entry is stored in the CAM array of the overflow CAM at the row and segment indicated by the block index component ($BIN_{SEL}$) of the NFA-generated device index. If the block ID does not match the overflow CAM block ID, then the block ID corresponds to a hash CAM block ID, and the binary CAM flag of the hash indicated hash CAM block is evaluated at 745. If the binary CAM flag is set, then a matching hash index was located within the binary CAM and, at 747, the entry is stored in the hash CAM block memory at the row and segment indicated by block index component of the NFA-generated device index. If the binary CAM flag is not set, then no matching hash index was located within the binary CAM of the indicated hash CAM block. Accordingly, at 749, the NFA-generated hash index is stored at the next free address of the binary CAM (NFBA) of the indicated hash CAM block; at 751, the entry is stored in the hash CAM block memory at a predetermined segment (e.g., segment 1) of the row indicated by the next free binary CAM address; at 753, the next free binary CAM address register is updated with the binary CAM index generated during the binary CAM load (that is the address of the next free binary CAM location); and at 755, the row fill count is incremented.

FIG. 51 is a flow diagram of a search operation within an $i^{th}$ one of the hash CAM blocks of FIG. 41, i being any integer value from 1 to N (note that a device level search may be performed as described in reference to FIG. 23). At 761, the class code of the search instruction (CC) is compared with the entry type of the CAM block ($ET_i$). If the class code does not match the entry type, the block flag is deasserted at 777 and the search operation within the hash CAM block is concluded. If the class code matches the entry type, a key is generated at 763 and used to generate a hash index ($HI_i$) at 765. At 767, the binary CAM is searched for a match with the hash index generated at 765. If a matching hash index is detected within the binary CAM at 769, the contents of the corresponding row of the memory array are output to the output logic for comparison with the search key (771). If, at 773, the row of the memory array is determined to contain a valid entry that matches the search key, then a match has been detected. Accordingly, at 775, the block flag for the hash CAM device is asserted (e.g., $BF_i=1$), the binary CAM index and segment address of the matching entry ($SA_{ME}$) are output as the block index ($BIN_i$), and the priority value stored within the matching entry ($PRI_{ME}$) is output as the block priority ($BP_i$). If row does not contain a valid entry that matches the search key, then the block flag is deasserted at 777 to indicate that no match was detected.

Overflow Cam Having Search-Based NFA Function

Figure 52:
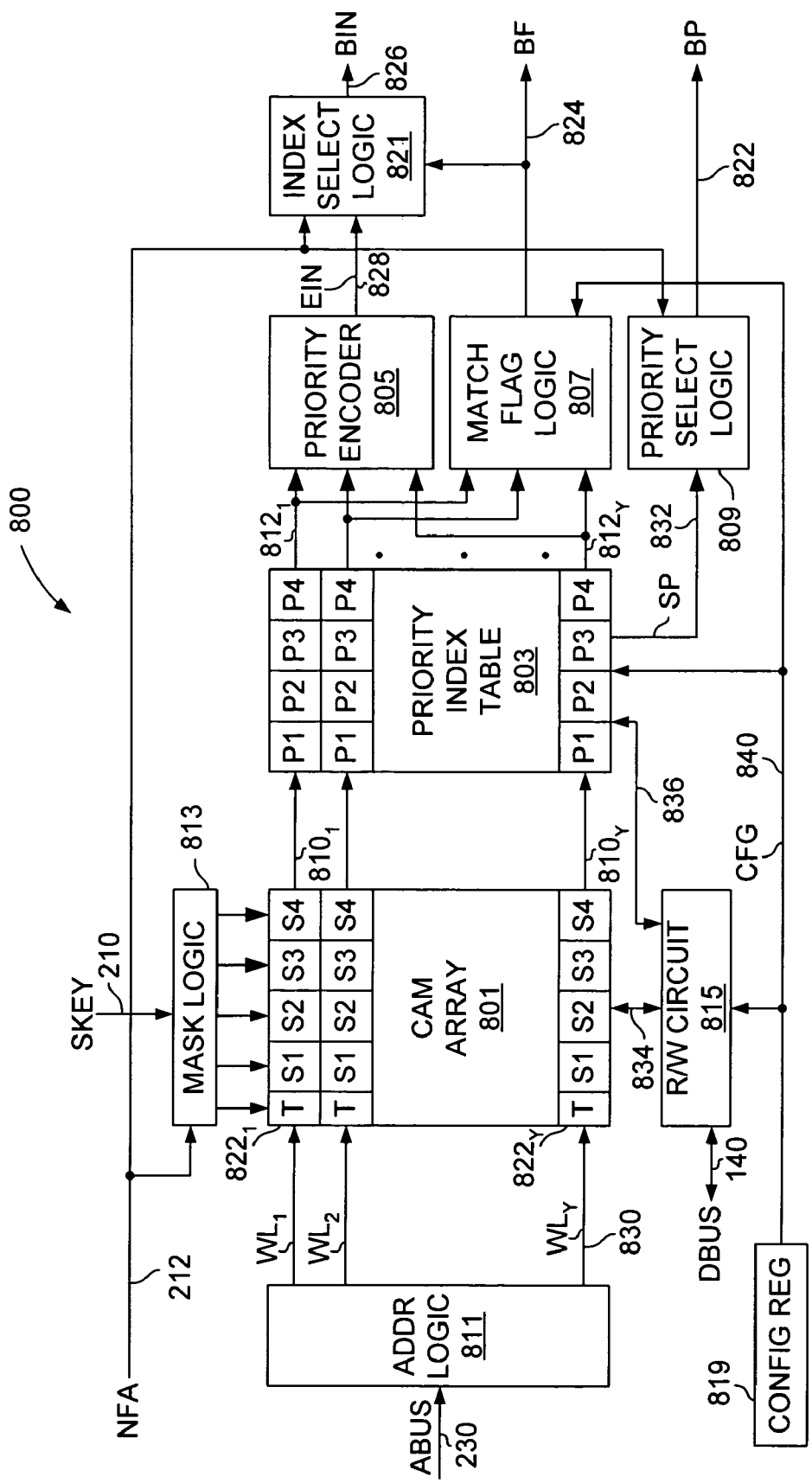
FIG. 52 illustrates an embodiment of an overflow CAM block having a programmable data storage width and a programmable priority function.

FIG. 52 illustrates an embodiment of an overflow CAM block 800 having a programmable data storage width and a programmable priority function. The overflow CAM block 800 includes a CAM array 801, address logic 811, mask logic 813, priority index table 803, priority encoder 805, read/write circuit 815, match flag logic 807, index select logic 821, priority select logic 809 and block configuration register 819. The configurable CAM array includes Y rows $822_1$-$822_Y$ of CAM cells with each row segmented into a tag (T) segment and four entry segments (S1-S4). More or fewer segments may be provided in alternative embodiments, and the tag segment may be omitted. Each of the CAM cells includes storage for at least one data bit, and a compare circuit to compare the data bit with a corresponding bit of a search key 210. The CAM cells may be binary CAM cells, ternary CAM cells (i.e., CAM cells that permit selective masking of mismatch conditions), range compare cells, or any combination of binary, ternary and/or range compare CAM cells. One or more of the row segments may also include a different number of CAM cells than others of the row segments. For example, in one embodiment, the tag segment includes four CAM cells to store three tag bits and a validity bit, while each of the entry segments, S1-S4, includes more than three CAM cells.

The CAM array 801 can be configured into different width by depth configurations by programming an entry size value into the configuration register 819. The entry size information is output as a set of one or more signals 840 (CFG) to configuration dependent circuit blocks within the overflow CAM block 800. In the exemplary embodiment shown in FIG. 52, each row of CAM cells within the CAM array 801 may be configured to store four data entries that each span a single entry segment (x1 configuration), two data entries that each span two entry segments (x2 configuration), or a single entry that spans all four entry segments (x4 configuration). In alternative embodiments, the overflow CAM block 800 may have more or fewer segments and/or more or fewer configuration options. Also, other types of configuration information may be programmed within configuration register 819 in alternative embodiments.

When an entry is loaded into the CAM array 801, the address logic 811 decodes an address received via bus 230 to assert an indicated one of the word lines 830 ($WL_1$-$WL_Y$), and the read/write circuit 815 drives an entry onto array bit lines 834 of the appropriate entry segment or segments (as discussed above, a segment address portion of the incoming address may be used in conjunction with the configuration value to select one or more entry segments to be written). A priority value may be loaded into the priority index table 803 (e.g., by the operation of read/write circuit 815 to drive a priority value onto priority bit lines 836) concurrently with the loading of the corresponding entry within the CAM array 801 or at a different time. In the x1 configuration, for example, entries stored within segments S1-S4 of a given row of the CAM array 801 correspond to priority values stored within priority storage circuits P1-P4 in the priority index table 803. In one embodiment, the priority values used in the x1, x2 and x4 configurations are the same size (i.e., have the same number of constituent bits). Consequently, in the x1 embodiment, each of the four priority storage circuits P1-P4 is used to store a priority value that corresponds to an entry in a corresponding one of entry segments S1-S4, while in the x2 configuration, only two of the priority storage circuits are used to store priority values (i.e., to correspond to respective entries that span two entry segments), and in the x4 configuration, only one of the priority storage circuits is used to store a priority value (i.e., to indicate the priority of a corresponding x4 entry). In the x2 and x4 configurations, the unused priority circuits may be disabled or loaded with null data (e.g., minimum priority values). In alternative embodiments, differently sized priority values may be used for different CAM array configurations, and all or a portion of one priority storage circuit may be concatenated with another priority storage circuit to enable storage of larger sized priority values.

The priority values stored within the priority index table 803 indicate the relative priorities of corresponding entries within the CAM array 801 and may be assigned in ascending priority order or descending priority order. During a search operation, search key 210 is simultaneously compared with all the entries within the CAM array 801 to generate a set of match signals $810_1$-$810_Y$, each indicating whether an entry or entries within a corresponding row of the CAM array 801 matches the search key 210. The priority values within the priority index table 803 that correspond to key-matching entries within the CAM array 801 (i.e., match-qualified priority values) are compared with one another to determine a highest priority match-qualified priority value. The highest priority match-qualified priority value is output from the priority index table 803 as a search priority value 832 (SP) and is received by the priority select logic 809. The priority select logic 809 selects, according to the state of NFA signal 212, either the search priority value 832 or an insert priority value to be output as the block priority value 822. More specifically, during an NFA operation, when the NFA signal 212 is high, the priority select logic 809 outputs an insert priority value, and during a search operation, when the NFA signal is low, the priority select logic 809 outputs the search priority value 832.

The priority index table additionally outputs a set of qualified match signals 812 to the priority encoder 805 and match flag logic 807. Each of the qualified match signals corresponds to a row of the priority index table 803 (and therefore to a row of CAM array 801) and is asserted if a match-qualified priority value equal to the search priority value 832 is stored in the priority index table row.

Figure 53:
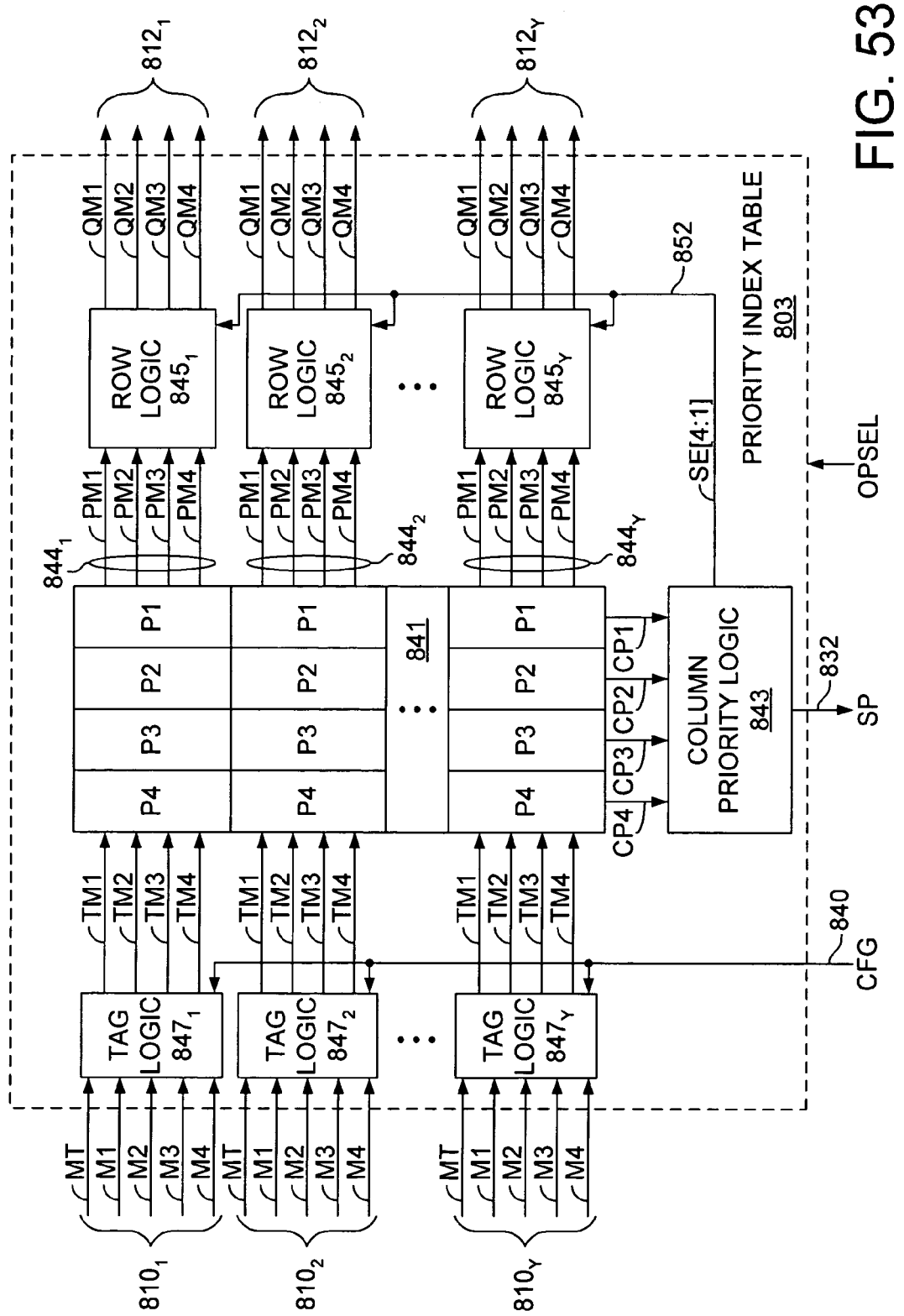
FIG. 53 illustrates an embodiment of the priority index table of FIG. 52.

FIG. 53 illustrates an embodiment of the priority index table 803 of FIG. 52 (other embodiments may be used). The priority index table 803 includes a segmented priority number storage array 841 (referred to herein as a priority array), tag logic circuits $847_1$-$847_Y$, column priority logic 843, and row logic circuits $845_1$-$845_Y$. The priority index table 803 receives priority values from, and outputs priority values to read/write circuit 815 of FIG. 52 (e.g., via bit lines not shown in FIG. 53). During a search or insert operation in the CAM array, the priority index table 803 receives Y sets of match signals $810_1$-$810_Y$ from the CAM array 801 and generates Y corresponding sets of qualified match signals $812_1$-$812_Y$ in accordance an operation select signal, OPSEL (generated, for example, by the instruction decoder 302 of FIG. 15) and the entry size information, CFG 840.

Each of the Y tag logic circuits 847 receives a respective match signal 810 from a corresponding row of the CAM array. In one embodiment, each of the match signals 810 includes five component match signals MT and M1-M4, that correspond to the tag segment and entry segments S1-S4, respectively. Each of the tag logic circuits $847_1$-$847_Y$ outputs a respective set of four tag match signals, TM1-TM4, with each of the tag match signals being asserted if (1) a tag value stored in the tag segment matched a class code value associated with the search key (i.e., the class code value (CC) discussed above in reference to FIG. 17), and (2) an entry stored in the corresponding entry segment (or, in the x2 and x4 configurations, in a group of two or four entry segments) matched the search key. The entry size information, CFG 840, is input to the tag logic circuits $847_1$-$847_Y$ to qualify the detection of a match condition.

In the embodiment of FIG. 53, the priority array 841 includes Y rows of priority cells, each segmented into four priority storage circuits P1-P4. During a compare operation, each row of priority storage circuits receives a respective set of four tag match signals, TM1-TM4 from a corresponding tag logic circuit and outputs a corresponding set of four prioritized match signals 844 (PM1-PM4). Each asserted tag match signal is used within the priority array to enable a corresponding priority storage circuit to participate in a priority value compare operation with other such enabled priority storage circuits within the same column of priority storage circuits (the enabled priority storage circuit and priority value stored therein being referred to herein as a match-selected priority storage circuit and match-qualified priority value, respectively). The priority value compare operation within each column of priority storage circuits (i.e., $P1_1$-$P1_Y$, $P2_1$-$P2_Y$, etc.) is referred to herein as a column priority comparison and produces a respective one of column priority values CP1-CP4 (i.e., the highest priority of the match-qualified priority values within the column) and results in assertion of a prioritized match signal 844 for each match-qualified priority value that is equal to the column priority value. As an example, if, during a compare operation, there is a match-qualified priority value within each of the four columns of priority storage circuits of the priority array 841, then four column priority values will be output from the priority array 841 to the column priority logic 843, and at least four prioritized match signals will be asserted (i.e., at least one for each column of priority storage circuits). More than one prioritized match signal may be asserted for a given column if the column contains more than one match-qualified priority value equal to the column priority value, thus providing a potential source of multiple-match indications.

Figure 54:
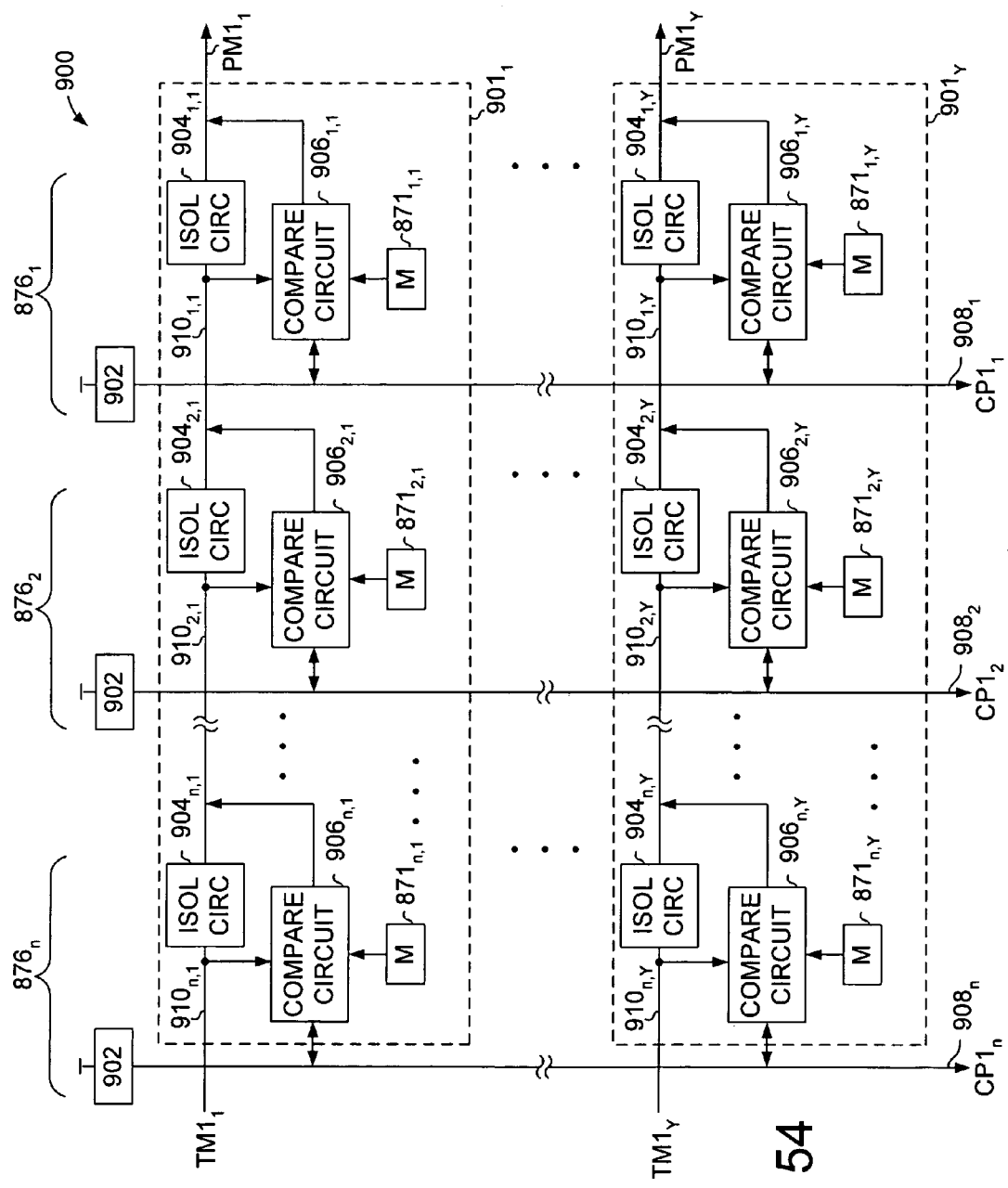
FIG. 54 shows a priority index table that is one embodiment of two priority storage circuits of the priority array of FIG. 53.

FIG. 54 shows priority index table 900 that is one embodiment of two priority storage circuits, $901_1$ and $901_Y$, of priority array 841 of FIG. 53. Each priority storage circuit includes a chain of n priority cells, with each cell including a compare circuit 906, isolation circuit 904 and storage element 871. Each compare circuit 906 is connected in a wired-OR configuration with the other compare circuits in its respective column by one of priority signal lines $908_1$-$808_n$. Each priority signal line may be pre-charged towards a power supply voltage (or any other predetermined voltage) by a pre-charge circuit 902. Each compare circuit 906 may be any digital or analog compare circuit that compares the priority value bit stored in the corresponding storage element 871 with the priority value bits stored in every other storage element 871 of the same column (i.e., bits $871_{1,1}$-$871_{1,Y}$ are compared; bits $871_{2,1}$-$871_{2,Y}$ are compared, and so forth). Additionally, each compare circuit 906 monitors the comparison result of the more significant priority value bits through the logical states of match line segments 910. Match line segments 910 are coupled between match lines that carry incoming tag match signals $TM1_1$-$TM1_Y$ and match lines that carry outgoing prioritized match signals $PM1_1$-$PM1_Y$ by isolation circuits 904. The isolation circuits 904 isolate the comparison results generated for less significant priority bit locations from affecting the comparison results generated for more significant priority bit locations. The isolation circuits 904 may also work together with the comparison circuits 906 to control the state of the match line segments 910.

Figure 55:
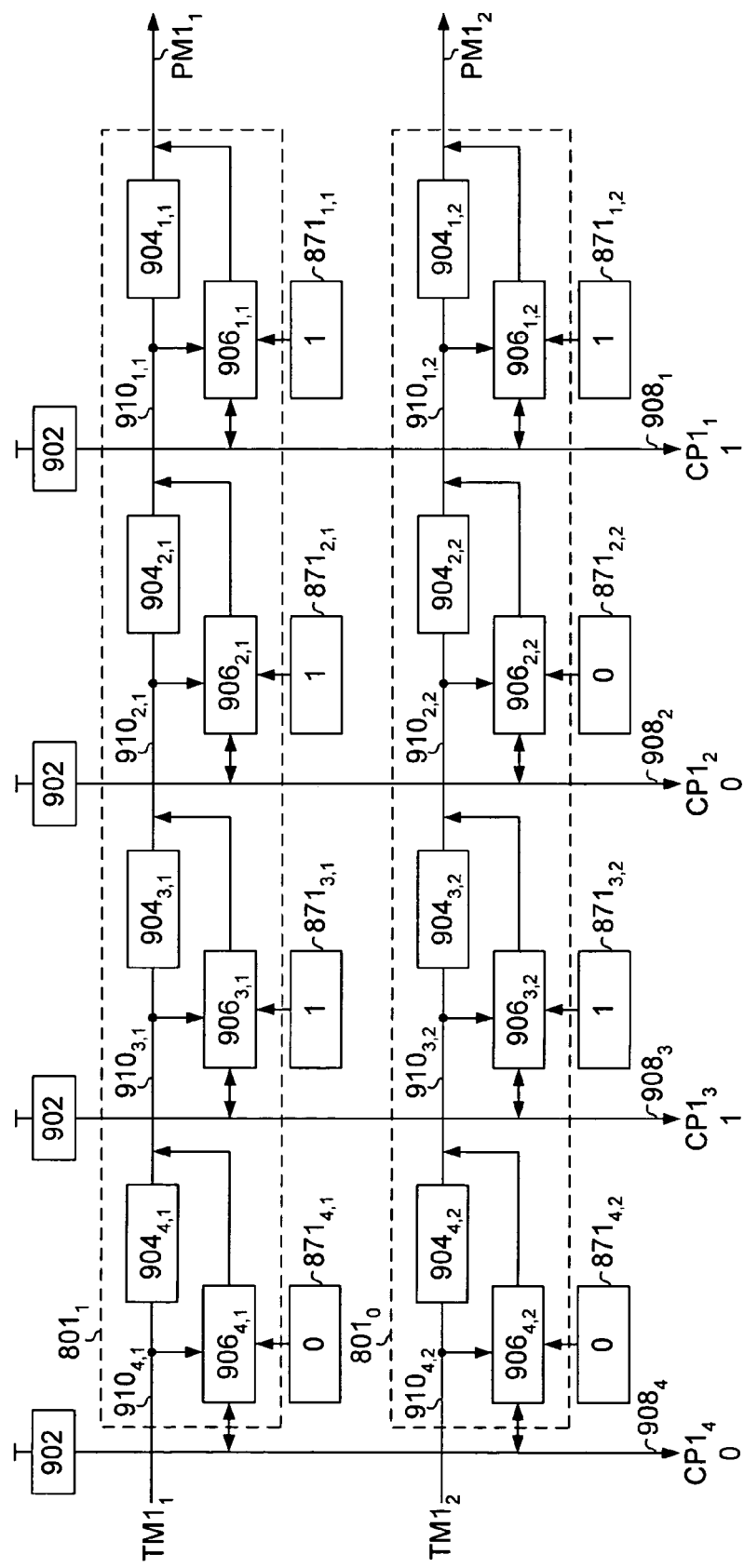
FIG. 55 illustrates an exemplary operation of the priority index table of FIG. 54.

The operation of priority index table 900 can be illustrated with an example shown in FIG. 55. In this example, priority index table 900 comprises a 2×4 matrix of rows and columns. For other embodiments, any numbers of rows and columns can be used. Row one stores priority number 0110 having the decimal equivalent of the number 6, and row two stores priority number 0101 having the decimal equivalent of the number 5. For this example, the corresponding row of the CAM array contains segment entries that result in assertion of tag match lines $TM_1$ and $TM_2$. Also, for this example, the priority numbers are stored in ascending priority order such that 0101 is the more significant (i.e., "higher priority") priority number between 0101 and 0110.

Compare circuits $906_{1,1}$-$906_{4,2}$ determine that 0101 is the more significant priority value, and cause $PM1_2$ to be asserted as follows. The most significant bit $CP1_4$ is resolved first. When any memory element 871 stores a logic zero and the corresponding match line segment 910 is asserted, the corresponding priority signal line 908 is discharged. Thus, each of compare circuits $906_{4,2}$ and $906_{4,1}$ discharge signal line $908_4$ such that $CP1_4$ is a logic zero. Additionally, compare circuit $906_{4,2}$ compares the state of priority signal line $908_4$ with the priority number bit stored in $871_{4,2}$, and determines that both have the same logic state. This causes compare circuit $906_{4,2}$ not to affect the logical state of match line segment $910_{3,2}$ such that match line segment $910_{3,2}$ has the same logic state as match line segment $910_{4,2}$ ($TM1_2$). Similarly, compare circuit $906_{4,1}$ compares the state of priority signal line $908_4$ with the priority number bit stored in $871_{4,1}$ and determines that both have the same state. This causes compare circuit $906_{4,1}$ not to affect the logical state of match line segment $910_{3,1}$ such that match line segment $910_{3,1}$ has the same logic state as match line segment $910_{4,1}$ ($TM1_1$).

The next most significant bit $CP1_3$ is then resolved. Memory elements 871 that store a logic one do not discharge their corresponding priority signal lines 908. Since memory elements $871_{3,2}$ and $871_{3,1}$ both store logic one states, signal line $908_3$ remains pre-charged such that $CP1_3$ is a logic one. Additionally, compare circuit $906_{3,2}$ compares the state of priority signal line $908_3$ with the priority number bit stored in $871_{3,2}$, and determines that both have the same logic state. This causes compare circuit $906_{3,2}$ not to affect the logical state of match line segment $910_{2,2}$ such that match line segment $910_{2,2}$ has the same logic state as match line segment $910_{3,2}$. Similarly, compare circuit $906_{3,1}$ compares the state of priority signal line $908_3$ with the priority number bit stored in $871_{3,1}$ and determines that both have the same logic state. This causes compare circuit $906_{3,1}$ to not affect the logical state of match line segment $910_{2,1}$ such that match line segment $910_{2,1}$ has the same logic state as match line segment $910_{3,1}$.

$CP1_2$ is resolved next. Since memory element $871_{2,2}$ stores a logic zero and match line segment $910_{2,2}$ is asserted, compare circuit $906_{2,2}$ discharges priority signal line $908_2$. This causes $CP1_2$ to be a logic zero. Additionally, compare circuit $906_{2,2}$ compares the logic zero state of priority signal line $908_2$ with the logic zero stored in $871_{2,2}$ and allows match line segment $910_{1,2}$ to have the same state as match line segment $910_{2,2}$. Compare circuit $906_{2,1}$, however, compares the logic zero on priority signal line $908_2$ with the logic one stored in memory element $871_{2,1}$, and de-asserts match line segment $910_{1,1}$. When a match line segment is de-asserted, all subsequent compare circuits for that row will de-assert the remaining match line segments of the row such that the corresponding prioritized match signal $PM1_1$ will be de-asserted. When the prioritized match signal is de-asserted for a particular segment, this indicates that the most significant priority number is not stored in that segment. Additionally, when the remaining match line segments are de-asserted for a row, the compare circuits for that row do not discharge the remaining priority signal lines regardless of the logic states stored in the corresponding memory elements of that row. For example, compare circuit $906_{1,1}$ does not discharge priority signal line $908_1$ even though memory element $871_{1,1}$ stores a logic zero. Additionally, isolation circuits $904_{4,1}$, $904_{3,1}$, and $904_{2,1}$ isolate the de-asserted match line segment $910_{1,1}$ from match line segment $910_{4,1}$, $910_{3,1}$, and $910_{2,1}$ such that $CP1_4$, $CP1_3$, and $CP1_2$ are not affected by the de-assertion of match line segment $910_{1,1}$.

Lastly, the least significant bit $CPI_1$ is resolved. Compare circuit $906_{1,2}$ alone determines $CPI_1$ since compare circuit $906_{1,1}$ cannot discharge priority signal line $908_1$. Since memory element $871_{1,2}$ stores a logic one and match line segment $910_{1,2}$ is asserted, compare circuit $906_{1,2}$ leaves priority signal line $908_1$ pre-charged, and $CP1_1$ is a logic one. Additionally, compare circuit $906_{1,2}$ allows prioritized match signal $PM1_2$ to have the same state as match line segment $910_{1,2}$. Since match line segment $910_{1,2}$ is asserted, $PM1_2$ will be asserted indicating that the most significant priority number is stored in that row.

Thus, when the priority comparison is completed, bits $CP1_4$-$CP1_1$ indicate that the most significant priority number stored in the priority index table is 0101, and prioritized match signal $PM1_2$ is asserted to signal that 0101 is stored in row two.

For the example described above with respect to FIG. 55, the most significant priority number is the lowest number such that 0101 is the most significant number between 0101 and 0110. For another embodiment, the priority numbers are stored in descending priority order such that 0110 is the most significant priority number between 0101 and 0110.

Any circuits may be used for compare circuits 906 and/or isolation circuits 904 to implement the priority comparison illustrated above. Table 2 shows one example of a truth table for implementing each compare circuit 906, where X (column) and Y (row) are any integers. Other truth tables may be used (and corresponding logic generated accordingly) including those that logically complement one or more of the signals indicated in Table 2. Any logic or circuitry may be used to implement the truth table of Table 2.

TABLE 2

| STATE | 908 | 871 | $910_{X,Y}$ | $910_{X-1,Y}$ |
|---|---|---|---|---|
| 0 | 0 | 0 | 0 | 0 |
| 1 | 0 | 0 | 1 | 1 |
| 2 | 0 | 1 | 0 | 0 |
| 3 | 0 | 1 | 1 | 0 |
| 4 | 0 | 0 | 0 | 0 |
| 5 | 1 | 0 | 1 | 0 |
| 6 | 1 | 1 | 0 | 1 |
| 7 | 1 | 1 | 1 | 0 |

FIG. 56 shows one embodiment of a circuit 930, referred to herein as a priority logic element or priority cell, for implementing the truth table of Table 2. The priority cell 930 includes compare circuit 933, isolation circuit 931, and memory element 871. Compare circuit 933 is one embodiment of compare circuit 906, and isolation circuit 931 is one embodiment of isolation circuit 904. The priority cell 930 may be used to implement all the priority cells in the priority index table.

Compare circuit 933 includes inverter 944, transistors 936 and 938 connected in series between priority signal line 908 and ground, and transistors 940 and 942 connected in series between match line segment $910_{i-1}$ and ground. N-channel transistor 936 has its drain coupled to signal line 908, its gate coupled to match line segment $910_i$, and its source coupled to the drain of n-channel transistor 938. Transistor 938 has its gate coupled to receive the logical complement of the priority number bit (/D) stored in memory element 871, and its source coupled to ground. N-channel transistor 940 has its drain coupled to match line segment $910_{i-1}$, its gate coupled to signal line 908 via inverter 944, and its source coupled to the drain of N-channel transistor 942. Transistor 942 has its gate coupled to receive the priority number bit (D) stored in memory element 871, and its source coupled to ground. Any of transistors 936, 938, 940, and 942 can be replaced with other types of transistors and the logic adjusted accordingly.

Isolation circuit 931 includes inverters 932 and 934. For alternative embodiments, only one inverter may be used and the logic of the next compare circuit adjusted accordingly. For other embodiments, other isolation circuits such as one or more AND, OR, or XOR logic gates or pass gates may be used.

Reflecting on the operation of priority cell 930, it can be seen that at least two principal functions are performed. First, the compare circuit 933 pulls down the column priority signal line 908 if (1) the incoming match line segment 910 is high (thereby indicating that priority cell 930 is enabled to participate in the bitwise priority comparison with other priority cells in the same column), and (2) the priority number bit is the lowest valued priority number bit in the column (i.e., the priority number bit, D, is a 0). Second, the priority cell 930 selectively enables or disables the next less significant priority cell from affecting the bitwise priority comparison for its column by setting the state of the outgoing match line segment $910_{i-1}$. Specifically, the priority cell 930 pulls down the outgoing match line segment $919_{i-1}$ to disable the next less significant priority cell from affecting the bitwise priority comparison for the next less significant column if (1) the incoming match line segment $910_i$ is low (i.e., causing $910_{i-1}$ to be pulled down via isolation circuit 931) or (2) the column priority signal line 908 settles to a low state and the priority number bit, D, is a 1 (i.e., priority cell 930 is a loser of the column priority comparison). In a priority table having Y rows (priority cell 930 being at column i, row j), the above described functions may be described by the following Boolean expressions:

$$/CP_i = (910_{i,1} * /D_{i,1}) + (910_{i,2} * /D_{i,2}) + \ldots + (910_{i,Y} * /D_{i,Y}) \quad (1)$$

$$/910_{i-1,j} = /910_{i,j} + (D_{i,j} * /CP1_i) \quad (2)$$

Substituting (1) for $CP1_i$ in expression (2) yields:

$$/910_{i-1,j} = /910_{i,j} + [D_{i,j} * \{(910_{i,1} * /D_{i,1}) + (910_{i,2} * / D_{i,2}) + \ldots + (910_{i,Y} * /D_{i,Y})\}]$$

Thus, if the incoming match line segment $910_i$ is high and the priority number bit, D, is a 1, the outgoing match line segment $910_{i-1}$ may not settle to its final state until all (or a significant number) of the priority cells within the same column have completed their comparisons of priority number bits and input match line segment states. Because of this potentially long settling time, it becomes possible for the outgoing match line segment $910_{i-1}$ to temporarily be high, before ultimately being pulled low. Consequently, the next less significant priority cell within may be enabled to temporarily pull the next less significant column priority signal line low (i.e., $CP1_{i-1} = 0$) before finally being disabled by the low going match line segment $910_{i-1}$. While an array of the priority cells 930 is self-correcting and will ultimately output the correct set of priority number bits as the column priority value and will assert the proper prioritized match signals, the temporary transition of one or more priority cells to an incorrect state requires time to correct. That is, transistor states require time to be reversed, and signal lines require time to charge/discharge, thereby slowing the overall generation of prioritized match signals and determination of a column priority number.

FIG. 57 illustrates an alternate embodiment of a priority cell 945 that includes timing circuitry to prevent the priority cell 945 from affecting the state of its column priority signal line 908 until the state of the incoming match line segment $910_i$ has settled. The priority cell 945 includes an isolation circuit 931, compare circuit 948, and memory element 871, all coupled in the manner described in reference to FIG. 56 to match line segments $910_i$ and $910_{i-1}$ and column priority signal line 908. The compare circuit 948 is identical to the compare circuit 933 except that a ripple control transistor 946 is coupled between the source of transistor 938 and ground. A gate terminal of ripple control transistor 946 is coupled to an enable signal line 941 ($EN_i$) so that, until a ripple enable signal is asserted on line 941 (i.e., driving line 941 high), compare circuit 948 is disabled from affecting the state of the column priority signal line 908. Thus, even if transistors 936 and 938 are switched on (and therefore poised to pull line 908 low), the compare circuit 948 will not affect the state of the column priority signal line 908 until the ripple enable signal is asserted on line 941. Because other priority cells within the same column also include a ripple control transistor 946 having a gate terminal coupled to line 941, the state of the column priority signal line 908 will remain unaffected (i.e., line 908 will remain precharged to a high logic level via circuit 902 in this example). Further, by providing separate enable signal lines 941 for each column of priority cells, and asserting respective ripple enable signals on the lines 941 at staggered times (i.e., one after another, progressing from most to least significant column), the priority index table can be made to generate a set of prioritized match signals and a column priority value without any priority cells transiently entering an incorrect state. Overall, a priority index table implemented with priority cells 945 may exhibit faster operation than a priority array implemented using the priority cells 930 of FIG. 56. Also, because the state of each column priority signal line 908 is settled before a less significant column priority signal line is affected, isolation circuit 931 may be omitted from priority cell 945 (i.e., a single shared match line may be coupled to each of the priority cells in a given row).

FIG. 58 is a waveform diagram of four ripple enable signals, RE1-RE4, that may be used to control a priority index table containing four columns of priority cells according to FIG. 57. As shown, ripple enable signal RE4 goes high at time T1 to enable the priority cells in the most significant column of priority cells to set the state of the most significant column priority signal line (i.e., pull down or not pull down line 908 of FIG. 57) and to set the states of their respective row match lines (i.e., pull down or not pull down line 910 of FIG. 57). After a predetermined time, $T_R$, ripple enable signal RE3 goes high to enable the priority cells in the next less significant column to set the state of the next less significant column priority signal line and to set the states of their respective row match lines (i.e., if not already pulled down). Ripple enable signals RE2 and RE1 are similarly asserted at subsequent, staggered $T_R$ intervals to enable the operation of their respective columns of priority cells.

In one embodiment, $T_R$ is a fixed value that corresponds to a time required for a column of priority cells to resolve the state of the column priority signal line (e.g., resolution time plus a tolerance value). Alternatively, $T_R$ may be a programmable value within the CAM device (e.g., stored in the configuration register 819 of FIG. 53 or other volatile or nonvolatile storage) that may be set once (e.g., production time setting according to supply voltage level, empirically determined operating speed of the device (e.g., binning), customer specification, etc.), or may be established during device run-time (e.g., as part of device initialization or periodically to compensate for changes in operating conditions such as supply voltage and temperature).

A predetermined time after ripple enable signal RE1 has been asserted, $T_C$, the priority number comparison is completed and all the ripple enable signals may be deasserted in preparation for the next priority number comparison. In the example of FIG. 58, each of the ripple enable signals is a pulse that is phase offset from the others of the pulses by time $T_R$ so that both the assertion and deassertion times of the ripple enable signals is staggered. Although $T_C$ is depicted in FIG. 58 as being a longer time than $T_R$, $T_C$ may alternatively be equal to or shorter than $T_R$.

Referring again to FIG. 53, the column priority logic 843 compares the column priority values received from the priority array 841 to generate a search priority value, SP, that is the highest priority one of the column priority values. The column priority logic 843 further generates a set of four segment enable signals 852 SE[4:1], each segment enable signal 852 being asserted or deasserted according to whether a corresponding one of the four column priority storage circuits contains a priority value equal to the search priority value. Thus, in the embodiment of FIG. 53, if only one column of priority storage circuits contains a priority value equal to the search priority value, then only one of the four segment enable signals 852 will be asserted. Conversely, if more than one column of priority storage circuits contains a priority value equal to the search priority value, then more than one of the four segment enable signals 852 may be asserted. The row logic circuits $845_1$-$845_Y$ receive respective sets of the prioritized match signals $844_1$-$844_Y$ from the priority array 841 and output, according to the segment enable signals 852, respective sets of qualified match signals $812_1$-$812_Y$, each set of qualified match signals including four component match signals, QM1-QM4. In one embodiment, the column priority logic 843 is implemented in the same manner as the search priority logic 550 of FIG. 34, except that the segment flag signals and OR gates 541, 543, 545 and 547 are omitted (i.e., the column priority values are input directly to the comparators; the outputs of AND gates 555, 557, 559 and 561 corresponding to the segment enable signals 852 (SE[4:1]). In alternative embodiments, other circuits may be used to implement the column priority logic 843 including, without limitation, a priority array as described in reference to FIGS. 52-54 in which the priority values are supplied from priority array 843 rather than being self contained.

Figure 59:
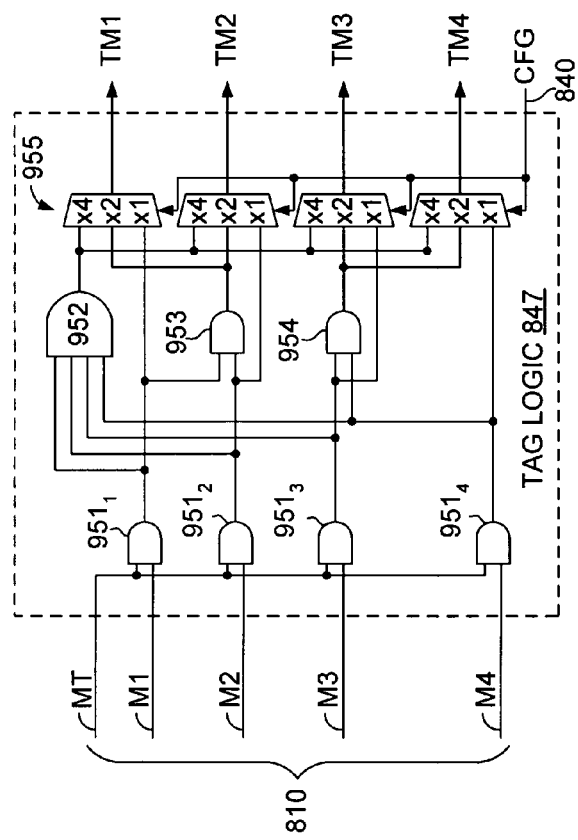
FIG. 59 illustrates an embodiment of the tag logic of FIG. 53.

FIG. 59 illustrates an embodiment of the tag logic 847 of FIG. 53. The tag logic 847 includes AND gates $951_1$-$951_4$, 952, 953 and 954, and multiplexer bank 955. The tag logic 847 receives a row match signal 810 from a corresponding row of the CAM array, the row match signal 810 including tag segment match signal (MT) and entry segment match signals (M1-M4) as discussed. The tag logic 847 includes four AND gates $951_1$-$951_4$ each of which receives the tag segment match signal (MT) at a first input and a respective one of the entry segment match signals (M1-M4) at a second input. The output of each of the AND gates $951_1$-$951_4$ is output to a x1 port of a respective one of the multiplexers 955 so that, when the entry size information 840 (CFG) indicates a x1 mode, the outputs of AND gates $951_1$-$951_4$ are selected to be the tag match signals TM1-TM4, respectively. Thus, in the x1 configuration, tag match signal TM1 is asserted if the tag segment match signal (MT) (i.e., indicating that the tag matched a class code for the search key) and the entry segment 1 match signal (M1) (i.e., the entry in segment 1 matched the search key) are both asserted. The tag match signals TM2, TM3 and TM4 are similarly asserted if the tag segment match signal (MT) is asserted and entry segment match signals M2, M3 and M4, respectively, are asserted.

If the entry size information 840 indicates a x4 configuration, the output of AND gate 952 is selected to drive each of the tag match signals TM1-TM4. AND gate 952 performs a logical AND of the outputs of all the AND gates $951_1$-$951_4$ and therefore outputs a logic high signal only if all the incoming segment match signals (MT and M1-M4) are high. Thus, in the x4 condition, all the tag match signals TM1-TM4 are asserted (i.e., to a high logic state in this example) if (1) the stored tag matches the class code associated with the search key, and (2) a x4 entry stored in segments 1-4 matches the search key (as indicated by assertion of signals M1-M4). If the stored tag does not match the class code, or any of the entry segment match signals indicate a mismatch condition, all the tag match signals TM1-TM4 are deasserted to indicate a mismatch.

If the entry size information 840 indicates a x2 configuration, the output of AND gate 953 is selected to drive tag match signals TM1 and TM2, and the output of AND gate 954 is selected to drive tag match signals TM3 and TM4. AND gate 953 performs a logical AND of the outputs of AND gates $951_1$ and $951_2$ and therefore outputs a logic high signal if (1) the stored tag matches the class code associated with the search key, and (2) a x2 entry stored in segments 1 and 2 matches the search key (as indicated by assertion of signals M1 and M2). If the stored tag does not match the class code or if either of entry segment match signals M1 and M2 indicate a mismatch condition, tag match signals TM1 and TM2 are both deasserted to indicate a mismatch. AND gate 954 performs a logic AND of the outputs of AND gates $951_3$ and $951_4$ and therefore outputs a logic high signal if (1) the stored tag matches the class code associated with the search key, and (2) a x2 entry stored in segments 3 and 4 matches the search key (as indicated by assertion of signals M3 and M4). If the stored tag does not match the class code or if either of entry segment match signals M3 and M4 indicate a mismatch condition, tag match signals TM3 and TM4 are both deasserted to indicate a mismatch.

Note that for all entry size configurations, the tag match signals TM1-TM4 are deasserted if the tag segment match signal is deasserted (indicating a mismatch between the stored tag and class code for the search value). In alternative embodiments, the tag segment may be used to qualify the entry segment match signals for only a set of one or more of the entry size configurations, with the set of configurations being fixed or programmable (e.g., by a configuration setting within register 819 of FIG. 52). In another alternative embodiment, the match the tag segment may be omitted from the CAM array 801 and the tag logic 847 omitted from the priority index table 803.

Figure 60:
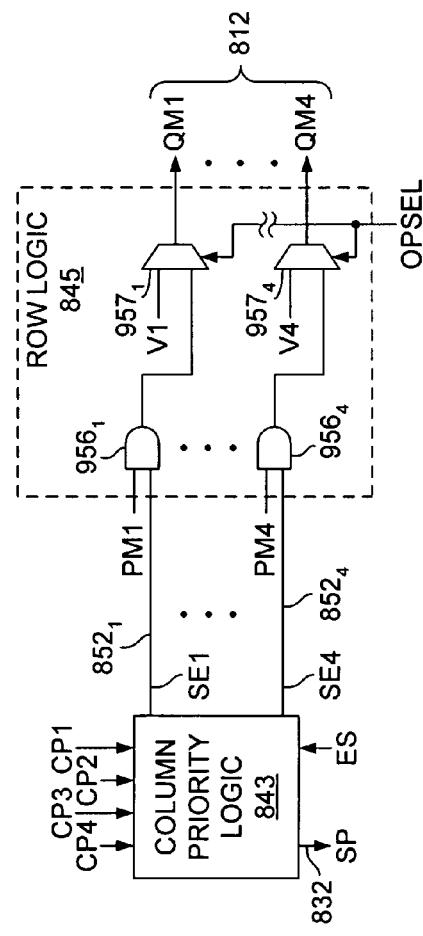
FIG. 60 illustrates an embodiment of the row logic of FIG. 53.

FIG. 60 illustrates an embodiment of the row logic 845 of FIG. 53. As discussed above, the column priority logic 843 compares the column priority values (CP1-CP4) received from the priority array to generate a plurality of segment enable signals 8521-8524 (SE1-SE4), each segment enable signal 852 indicating whether the corresponding column priority value is equal to the search priority value 832 (SP) (i.e., a highest priority one of the column priority values). The row logic 845 includes AND gates $956_1$-$956_4$ to logically AND the prioritized match signals PM1-PM4 output from a given row of the priority array with the segment enable signals SE1-SE4. The output of each logic AND gate 956 is coupled to a first input port of a respective one of multiplexers $957_1$-$957_4$, so that, when an operation select signal (OPSEL) indicates a search operation or NFA operation, the outputs of AND gates $956_1$-$956_4$ are selected to be the qualified match signals 812 (QM1-QM4). Thus, during a search or NFA operation, qualified match signal QM1 will be asserted if the corresponding prioritized match signal (PM1) is asserted and segment enable signal SE1 is asserted. That is, qualified match signal QM1 will be asserted if PM1 indicates that the corresponding priority value is equal to the column priority value for column 1 of the priority array, and SE1 indicates that the priority value is equal to the search priority 832 (i.e., the priority value is an intra-column and inter-column winner of priority comparisons). Qualified match signals QM2, QM3 and QM4 are similarly asserted if their corresponding priority values are intra-column and inter-column winners of priority comparisons.

Still referring to FIG. 60, if the operation select signal (OPSEL) indicates a write to the CAM array, then validity values V1-V4 are selected by multiplexers $957_1$-$957_4$ to be output as qualified match signals QM1-QM4 instead of the signals generated by AND gates 956. In one implementation, the validity values are active low signals which, if high, indicate that the corresponding entry segment within the CAM array does not have a valid entry stored therein. That is, the validity values may be interpreted as active high unoccupied (empty) signals. Accordingly, when the validity values are selected to be output as the qualified match signals, QM1-QM4, the qualified match signals effectively represent a set of empty flags for the CAM array. The empty flags may be used within the priority encoder 805 of FIG. 52 to generate an index of a next free address within the CAM array 801. In one embodiment, the validity values are formed by one or more bits stored in the CAM array 801 within the corresponding entry segment. In an alternative embodiment, to facilitate circuit layout, validity storage circuits are provided both in the CAM array and in a location physically near the multiplexers 957. In the latter embodiment, the validity values stored in the validity storage circuits located near the multiplexers 957 mirror the values stored within the CAM array and are used to drive the qualified match signals when a write operation is selected. In an embodiment in which a predetermined entry value (e.g., code) is used to indicate the presence or absence of a valid entry within an entry segment, the multiplexers 957 may be omitted altogether.

Referring again to FIG. 52, the match flag logic 807 generates a block flag 824 (BF) for the overflow CAM device 800 according to the states of the qualified match signals 812 and the block configuration signal 840 (CFG). In one embodiment, for example, the match flag logic 807 asserts the block flag 824 in accordance with the following Boolean expression (the '+' symbol indicates a logical OR operation and the '·' symbol indicates a logical AND operation):

$$BF = x1 \cdot [(QM1_1 + QM1_2 + \ldots + QM1_Y) + (QM2_1 + QM2_2 + \ldots + QM2_Y) + (QM3_1 + QM3_2 + \ldots + QM3_Y) + (QM4_1 + QM4_2 + \ldots + QM4_Y)] +$$

$$x2 \cdot [(QM1_1 \cdot QM2_1) + (QM1_2 \cdot QM2_2) + (QM1_Y \cdot QM2_Y) + (QM3_1 \cdot QM4_1) + (QM3_2 \cdot QM4_2) + \ldots (QM3_Y \cdot QM4_Y)] +$$

$$x4 \cdot [(QM1_1 \cdot QM2_1 \cdot QM3_1 \cdot QM4_1) + (QM1_2 \cdot QM2_2 \cdot QM3_2 \cdot QM4_2) + (QM1_Y \cdot QM2_Y \cdot QM3_Y \cdot QM4_Y)]$$

Any logic circuit that produces the above Boolean result may be used to implement the black flag logic, and, in alternative embodiments, different Boolean expressions may be used. For example, in an embodiment in which qualified match signals QM2 and QM4 are ignored in x2 mode and qualified match signals QM2, QM3 and QM4 are ignored in x4 mode, the block flag signal may be asserted in accordance with the following Boolean expression:

$$BF = x1 \cdot [(QM1_1 + QM1_2 + \ldots + QM1_Y) + (QM2_1 + QM2_2 + \ldots + QM2_Y) + (QM3_1 + QM3_2 + \ldots + QM3_Y) + (QM4_1 + QM4_2 + \ldots + QM4_Y)] +$$

$$x2 \cdot [(QM1_1 + QM1_2 + \ldots + QM1_Y) + (QM3_1 + QM3_2 + \ldots + QM3_Y)] +$$

$$x4 \cdot (QM1_1 + QM1_2 + \ldots + QM1_Y)$$

Still referring to FIG. 52, the priority encoder 805 generates an address, referred to as an entry index 828 (EIN), that corresponds to the row and segment of the priority index table (and therefore to corresponding row and entry segment of the CAM array 801) indicated by an asserted qualified match signal 812. If more than one qualified match signal $812_1$-$812_Y$ is asserted, hardwired tie resolution logic within the priority encoder 805 generates an index that corresponds to the lowest numbered row and entry segment for which a qualified match signal is asserted. Alternative tie resolution techniques may be used in alternative embodiments, including, but not limited to, providing logic to resolve ties in favor of higher numbered rows or providing configurable tie resolution logic to enable programmable selection between multiple different tie resolution policies. In either case, the entry index 828 generated by the priority encoder is provided to the index select logic 821 which selects, according to the state of the NFA signal 212 and a block flag signal 824, either the entry index 828 or a previously stored version of the entry index to be output as the block index 826 (BIN) for the overflow CAM 800.

Figure 61:
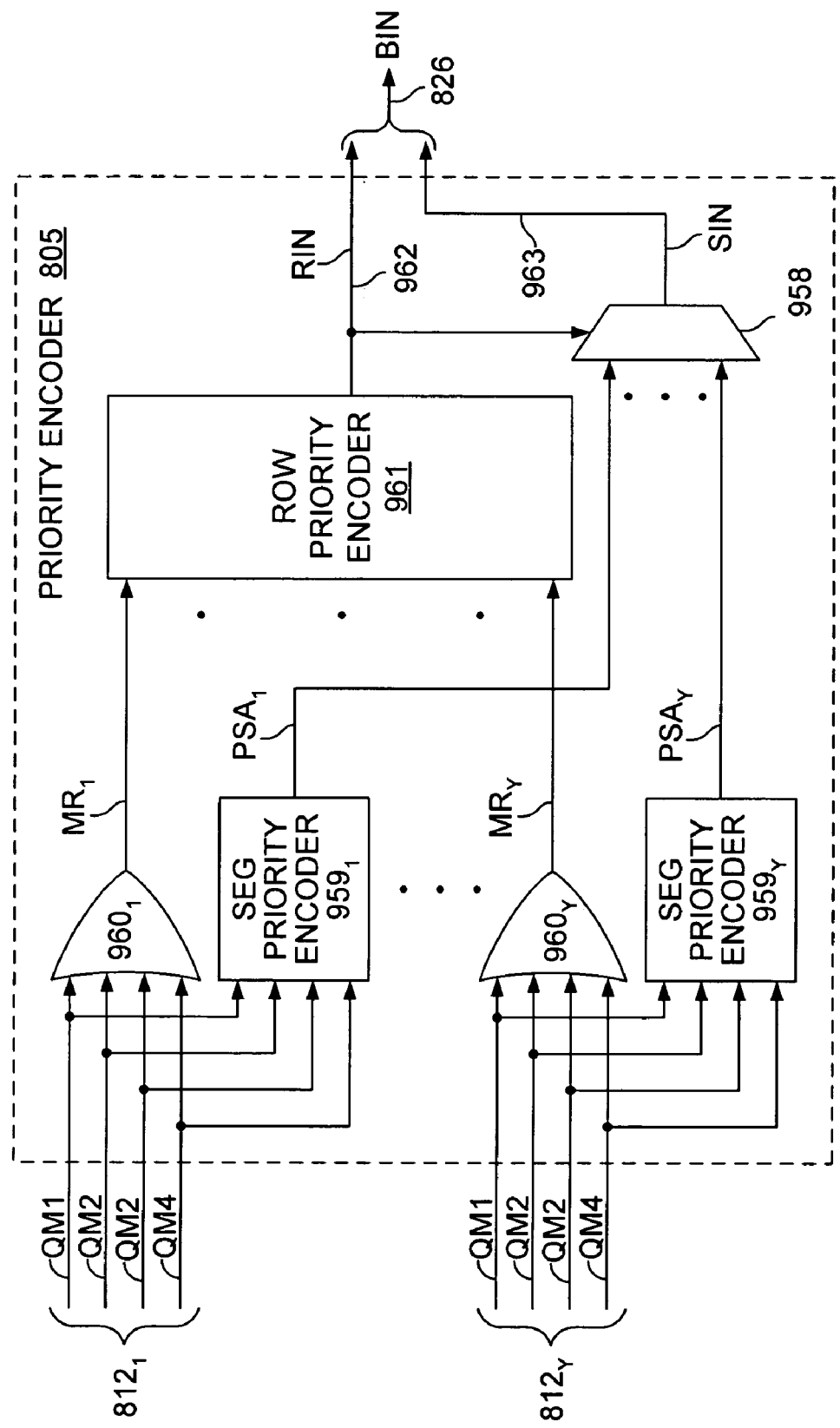
FIG. 61 illustrates an embodiment of the priority encoder 805 of FIG. 52.

FIG. 61 illustrates an embodiment of the priority encoder 805 of FIG. 52 (other embodiments may be used). The priority encoder 805 includes OR gates $960_1$-$960_Y$, segment priority encoders $959_1$-$959_Y$, row priority encoder 961 and multiplexer 958. Each of the OR gates $960_1$-$960_Y$ receives a respective set of qualified match signals, QM1-QM4 (each set forming a respective one of qualified match signals $812_1$-$812_Y$), and outputs a corresponding one of row match signals $MR_1$-$MR_Y$ to the row priority encoder 961. Thus, the row priority encoder 961 receives Y row match signals (MR), each indicating whether any of the qualified match signals $QM_1$-$QM_4$ for the corresponding row are asserted. The row priority encoder 961 performs an encoding operation to generate a row index 962 (RIN) (i.e., row address) that corresponds to the row of the CAM array indicated by an asserted one of the row match signals MR. In one embodiment, if two or more of the row match signals MR are asserted (i.e., a multiple match condition), the row priority encoder 961 generates a row index 962 that corresponds to the lowest numbered one of the indicated rows (i.e., the row having the lowest physical address of the indicated rows). In alternative embodiments, different row prioritizing policies may be used to resolve multiple match conditions (e.g., selecting the row having the highest physical address).

Each of the segment priority encoders $959_1$-$959_Y$ also receives a respective set of qualified match signals QM1-QM4 and performs an encoding operation to generate a respective prioritized segment address PSA. In one embodiment, if two or more of qualified match signals QM1-QM4 are high, the segment priority encoder 959 generates a prioritized segment address that corresponds to the lowest numbered one of the qualified match signal (i.e., the qualified match signal that corresponds to the CAM array segment having the lowest physical address as compared with other segments within the same row). By this arrangement, the prioritized segment address generated in response to a match detection in the x4 configuration (i.e., all qualified match signals asserted) will indicate segment 1 (e.g., PSA=00 binary), and the prioritized segment address generated in response to a match detection in the x2 condition (at least one pair of match signals asserted) will indicate segment 1 or segment 3 (e.g., PSA=00 or 10), as the case may be. Also, in the event of multiple matches within a single row in either the x1 or x2 configuration, the address of the lowest numbered segment will be output as the prioritized segment address. In alternative embodiments, different segment prioritizing policies may be used to generate prioritized segment addresses.

The multiplexer 958 receives Y prioritized segment addresses ($PSA_1$-$PSA_Y$) from the segment priority encoders $959_1$-$949_Y$ and selects, according to the row index 962, one of the prioritized segment address to be output as a segment index 963 (SIN). Thus, the segment index 963 is the prioritized segment address that corresponds to the row that yielded the row index 962. Together the row index 962 and segment index 963 form the block index 826 for the overflow CAM block.

Figure 62:
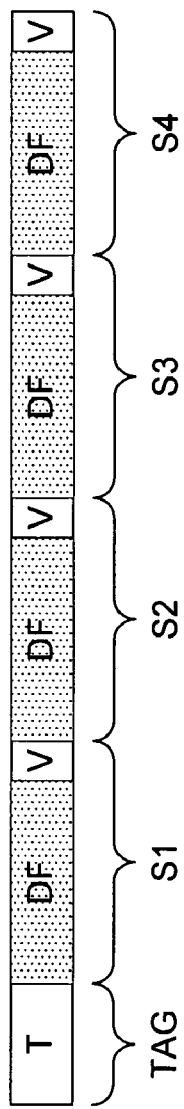
FIG. 62 illustrates the format of a NFA mask according to one embodiment.

Referring again to FIG. 52, the mask logic 813 is used to provide a global masking of the search key (e.g., masking of selective bits within the search key according to host-supplied or host-selected mask values). During an NFA operation, the NFA signal 212 is high and is used within the mask logic 813 to select a NFA mask to be applied to the incoming search key. FIG. 62 illustrates the format of a NFA mask according to one embodiment (other embodiments may be used). The NFA mask includes a tag field (TAG) and four entry segment fields (S1-S4), with each entry segment field including a validity field (V) and a data field (DF). In the embodiment of FIG. 62, the NFA mask is used during an NFA operation to mask the data field components of each entry segment field (as indicated by the shaded areas), and to unmask the tag field, and unmask the validity field components of each segment field. Thus, during an NFA operation, the class code associated with an entry candidate may be compared with the tag field within each row of the CAM array 801, and a predetermined logic value (e.g., logic 1) may compared with each of the four segment validity values within each row to learn whether the CAM array 801 contains a partially filled row that is tagged with the specified class code. That is, the tag segment match signal (MT of FIG. 59) will be high for a given row if the corresponding tag segment contains a tag that matches the specified class code, and each of the entry segment match signals (M1-M4) will be high if the validity value within the corresponding entry indicates an unoccupied status. Because the tag segment match signal is ANDed with the entry segment match signals to produce the tag match signals TM1-TM4, the tag match signals, if asserted, indicate an empty state for an entry segment of the CAM array for which the corresponding tag segment matches the class code.

Figure 63:
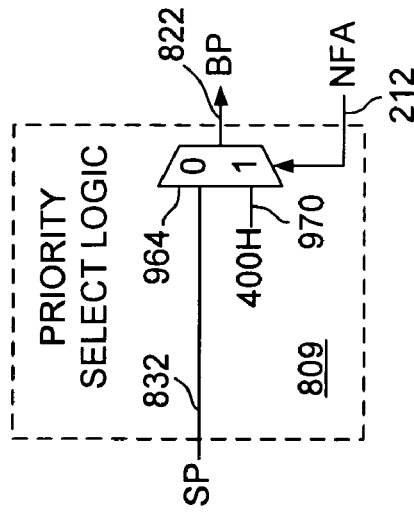
FIG. 63 illustrates an embodiment of the priority select logic of FIG. 52.

Referring to FIG. 63, the priority select logic 809 includes a multiplexer 964 to select, according to the state of the NFA signal 212, either the search priority value 832 (SP) output from the priority index table 803 of FIG. 52, or a predetermined priority value 970 to be output as the block priority value 822. In one embodiment, the predetermined priority value 970 is output during an NFA operation (i.e., when NFA signal 212 is high) to enable the overflow CAM to be selected for entry insertion should none of the hash CAM blocks output a higher priority insert priority value (i.e., as described above in reference to FIG. 48). More specifically, in the exemplary embodiment of FIG. 63, a priority value of 400 hex is output as the predetermined insert priority value for the overflow CAM so that, the overflow CAM will output a numerically higher (i.e., lower priority) priority value than a hash CAM block having a completely or partially unfilled row. In alternative embodiments, the overflow CAM block may output different insert priority values including, without limitation, a priority value indicative of a fill level of the overflow CAM block, a priority value indicative of whether all the entry segments within the row indicated by the block index are empty (or, conversely, that at least one of the entry segments is filled; a partially filled row status), a priority value that indicates both a partially filled row status and a block fill level, etc.

Figure 64:
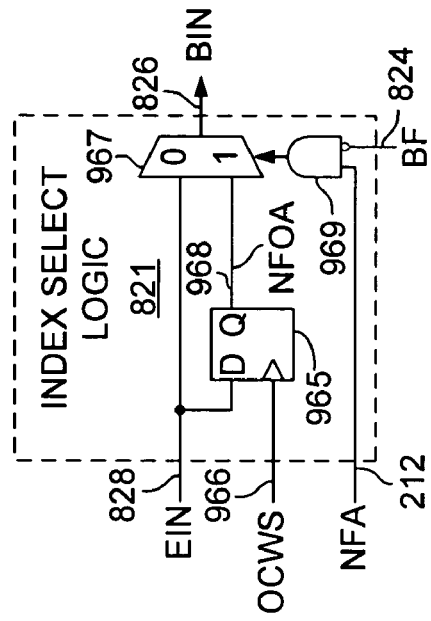
FIG. 64 illustrates an embodiment of the index select logic of FIG. 52.

FIG. 64 illustrates an embodiment of the index select logic 821 of FIG. 52 (other embodiments may be used). The index select logic includes a multiplexer 967, storage element 965 and AND gate 969. The entry index 828 from the priority encoder is input to a first input port of the multiplexer 967 and also to a data input of the storage element 965. During an overflow CAM load operation the entry index 828 will be generated based on the validity values for the CAM array entries (i.e., as represented by the qualified match signals) and therefore will represent the highest priority available location (i.e., next free address) within the overflow CAM. Because the NFA signal 212 will be low during the load operation, the logic AND gate 969 will output a low signal to select the entry index 828 to be output as the block index 826 (BIN). Also, the instruction decoder (not shown in FIG. 64) will generate an overflow CAM write strobe signal 966 (OCWS) to strobe the entry index (i.e., next free overflow CAM address) into the storage element 965. During a search operation, the entry index 828 will be generated based on the qualified match signals and therefore will indicate the CAM array location containing the highest priority key-matching entry. Because the NFA signal 212 will be low during the search operation, the logic AND gate 969 will output a low signal to select the entry index 828 to be output as the block index 826.

During an NFA operation, the NFA signal 212 is high, enabling AND gate 969 to select, according to the state of the block flag 824, either the entry index 828 or the next free overflow CAM address 968 (stored within storage element 965) to be output as the block index 826. More specifically, if the block flag is high during a NFA operation (i.e., indicating an unoccupied entry segment(s) within a row containing a tag that matches the class code associated with the entry candidate) the inversion at the block flag input to the AND gate 969 causes the output of AND gate 969 to be low and therefore to select the entry index 828 (i.e., the index of an empty entry segment within the CAM array) to be output as the block index 826. If the block flag is low during a search operation, then no match was detected (indicating that no row contained both a tag that matched the class code and an empty entry segment), and the output of the logic AND gate 969 is high to select the next free overflow CAM address 968 to be output as the block index 826. Thus, during an NFA operation, an entry index 828 is output for a partially (or completely) empty row having a tag that matches the class code associated with the entry candidate, and the next free overflow CAM address 968 is output if there is no such row.

System Structure and Operation

FIG. 65 illustrates a system 980 that includes a host processor 975 (e.g., general purpose processor, digital signal processor, network processor, application-specific integrated circuit (ASIC), etc.), program store 979, CAM device 977 according to one of the embodiments described herein, and associated storage 111. The system device may be, for example, a network switch or router, or any other type of device in which the compare capability of the CAM device 977 may be used.

The host processor 975 executes program code stored within program store 979 (which may include one or more semiconductor storage devices or other storage media) and issues addresses, comparands, and instructions to the CAM device 977 via the address, data and instruction buses, respectively (i.e., ABUS 230, DBUS 140 and IBUS 200), and receives status and other information from the CAM device 1701 via a result bus (RBUS 990). In particular, the host processor 975 issues instructions to program or select the entry types, key masks, hash function selections, entry sizes, compare modes, fill policies and other programmable or selectable features of one or more CAM blocks within the CAM device 977, as discussed above. In the embodiment of FIG. 64, flag signals 992 (e.g., device-level match flag, multiple match flag, full flag, etc.) are output directly to the host processor 975, however, the flag signals 992 (or a single flag signal) may alternatively or additionally be output to the host processor 975 via the result bus 990, for example in a status word. The device index 976 may be output to an associated storage (e.g., associated storage 111, which may be included within the same integrated circuit (IC) or IC package as the CAM device 977 and/or host processor 975) and/or to the host processor 975. The information output from the associated storage 111 (i.e., in response to the device index 976) may be provided to the host processor 975 (e.g., via path 978), or other processor or control device within the system 980.

In alternative embodiments, one or more of the buses (e.g., ABUS, DBUS, IBUS, or RBUS) may be omitted and the corresponding information time-multiplexed onto another of the buses. Further, the CAM device 977 and host processor 975 may be implemented in distinct integrated circuits (ICs) and packaged in distinct IC packages, or in a single IC (e.g., in an ASIC, system-on-chip, etc.), or in an IC package that includes multiple ICs (e.g., a multi-chip package, paper-thin package, etc.). Also, the system 980 may include multiple CAM devices 977 each programmed with a respective set of configuration values. For example, in one embodiment, system 980 includes multiple CAM devices according to hash CAM device 190 of FIG. 6, along with an overflow CAM device. During a search or NFA operation, each of the CAM devices may be operated in parallel to generate a match address or insertion address.

Numerous functions described as being implemented within the CAM devices of FIGS. 3-64 may alternatively be implemented by the host processor 975 in response to instructions (i.e., software or firmware) stored within the program store 979. For example, in one embodiment the fill level of the binary CAM (or ternary CAM) within each hash CAM block is tracked by host processor 975 under program control. Each time a hash CAM block is selected for entry insertion at an unfilled row (an event that involves loading a new hash index into the binary CAM), the binary CAM fill count value for the hash CAM block is incremented. Similarly each time a binary CAM entry is deleted (e.g., due to deletion of an entry or entries in a corresponding row of the memory array), the binary CAM fill count value for the hash CAM block is decremented. Prior to selecting a hash CAM block for entry insertion at an unfilled row (a circumstance indicated by a device priority value having, for example, a logic high partial fill bit), the host processor inspects the binary CAM fill count value for the hash CAM block to determine if the count value has reached a maximum (i.e., completely full) level. If the count value indicates a full binary CAM, the host processor does not store the candidate entry in the indicated hash CAM block. Other functions within the CAM devices of FIGS. 3-64 may similarly be implemented by the host processor 975 under program control.

Hash CAM Device Having Block-Write Function

Figure 66:
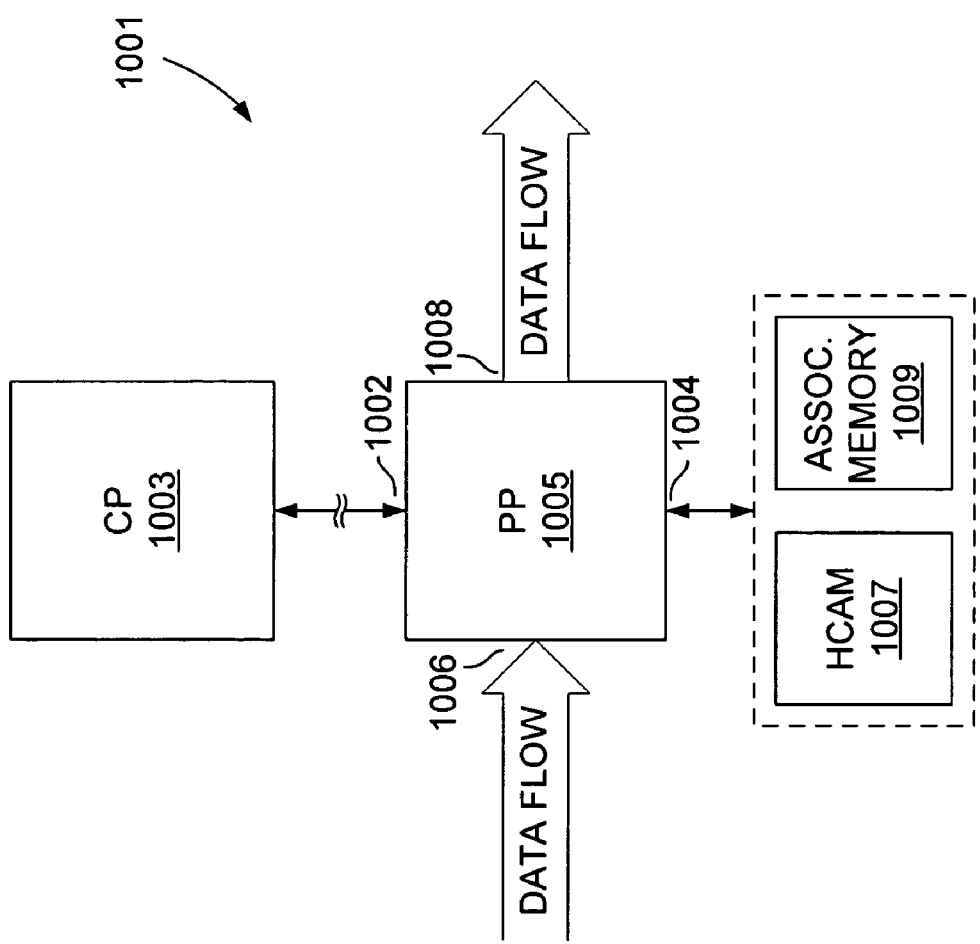
FIG. 66 illustrates a network switching system that includes a hash CAM device according to an embodiment of the invention.

FIG. 66 illustrates a network switching system 1001 that includes a hash CAM device 1007 according to an embodiment of the invention. The switching system 1001 may be a network switch or router, or any other device for classifying and/or forwarding traffic in a communications network. In addition to the hash CAM device 1007, the switching system

1001 includes a control processor 1003 (CP), packet processor 1005 (PP) and associated memory 1009, and may further include other components not shown (e.g., line cards having ingress and egress ports to enable receipt and transmission of data packets; switch fabric for transferring packets between ingress and egress ports in response to destination or policy information output by the associated storage; etc.). In general, the control processor 1003 is responsible for configuring and controlling resources within the switching system 1001, and the packet processor 1005 is responsible for managing data flow. More specifically, the control processor 1003 configures and maintains a searchable database within the hash CAM 1007 and corresponding set of associated data values within the associated memory 1009, while the packet processor 1005 issues search commands to the hash CAM 1007 and performs packet forwarding and/or classification operations based on values output from the associated memory 1009. In one embodiment, the control processor 1003 is a general purpose processor that executes stored program code (e.g., stored in a memory component of the processing system, not shown in FIG. 66) to carry out the configuration and maintenance operations required to operate the switching system 1001. A special purpose processor, application-specific integrated circuit (ASIC) or other type of control device may alternatively be used to implement the control processor 1003. Similarly, in one embodiment, the packet processor 1005 is implemented by a network processing unit (NPU) that executes stored program code to carry out data flow operations within the switching system. In alternative embodiments, a general purpose processor, ASIC or other type of control device may be used to implement the packet processor 1005. Also, while the control processor 1003 and packet processor 1005 are depicted in FIG. 66 as being separate integrated circuit (IC) devices, the functions performed by the two processors may alternatively be performed within a single IC device.

Still referring to FIG. 66, the packet processor includes a data input interface 1006 for receiving packet traffic, and a data output interface 1008 for forwarding packet traffic, for example, to a next-stage processor, line card, switch fabric or other system component. The packet processor 1005 additionally includes a control interface 1002 coupled to the control processor 1003 via one or more signaling paths and/or interconnect components (e.g., bus bridges), and a database interface 1004 coupled to the hash CAM 1007 and associated memory 1009. During selected operations, referred to herein as control operations, the packet processor 1005 receives command, data and address values from the control processor 1003 and forwards such values, with or without translation, to the hash CAM 1007 and/or associated memory 1009. In other operations, most notably search operations, the packet processor 1005 issues commands and data to the hash CAM 1007 in response to packet traffic received at the data input interface 1006.

Figure 67:
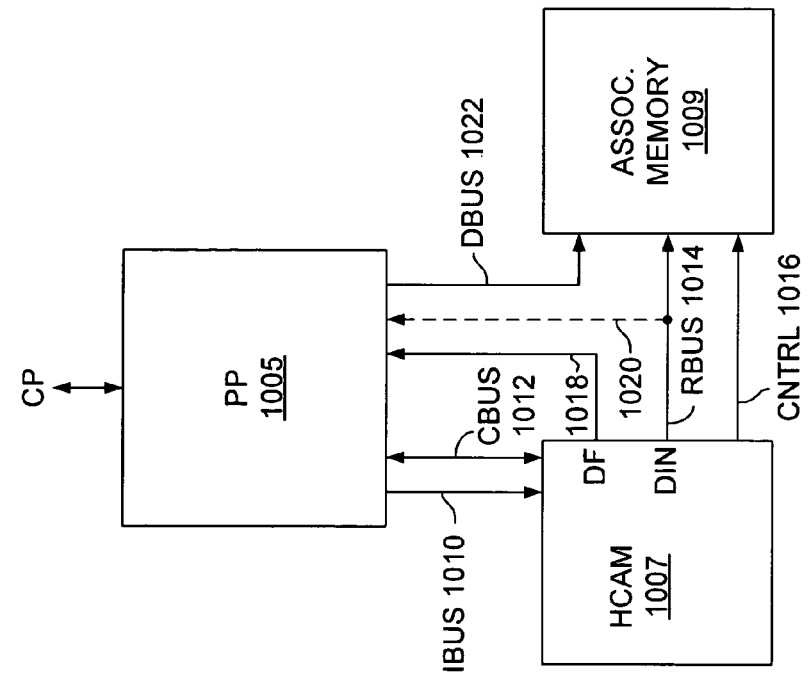
FIG. 67 illustrates an exemplary interconnection of the packet processor, hash CAM and associated memory of FIG. 66.

FIG. 67 illustrates an exemplary interconnection of the packet processor 1005, hash CAM 1007 and associated memory 1009 of FIG. 66. The packet processor 1005 is coupled to the hash CAM 1007 via an instruction bus 1010, comparand bus 1012, flag line 1018 and, optionally, a result bus 1014. The packet processor 1005 outputs commands to the hash CAM 1007 via the instruction bus 1010, and outputs search values, candidate entries, configuration values, addresses and other sorts of information to the hash CAM 1007 via the comparand bus 1012. The hash CAM 1007 responds to selected commands by returning address values and status information to the packet processor 1005 via the comparand bus 1012. The flag line 1018 is used to convey the results of search and NFA operations to the packet processor 1005, and the result bus 1014 is used to convey device indices (e.g., match addresses and NFA values) to the associated memory 1009. As indicated by dashed line 1020, the result bus 1014 may optionally be coupled to the packet processor 1005 to enable the packet processor to receive device indices generated during search and/or NFA operations. Alternatively, the device indices generated during such operations may be returned to the packet processor 1005 via the comparand bus 1012, thereby saving pins on the packet processor 1005 and simplifying signal path routing.

In the embodiment of FIG. 67, the hash CAM 1007 outputs a set of control signals to the associated memory 1009 via a control path 1016 to enable read and write access to the associated memory 1009 at the address presented on the result bus 1014. A data bus 1022 is coupled between the associated memory 1009 and the packet processor 1005 to allow data transfer to and from the associated memory during write and read operations, respectively. By this arrangement, data values may be written to and read from the associated memory at an address supplied on the result bus 1014 (e.g., device indices) in coordination with write/read control signals supplied on the control path 1016. In one embodiment, the associated memory 1009 is a static random access memory device (static RAM) having, for example, chip select, write enable, and address strobe inputs coupled to receive corresponding chip select, write enable and address strobe signals from the hash CAM 1007 (i.e., via the control path 1016). Virtually any type of memory may alternatively be used to implement the associated memory 1009 including, without limitation, dynamic RAM, non-volatile memories such as electrically erasable programmable read only memories (EEPROMs, including flash EPROMs), and non-semiconductor memory devices such as devices that record data on optical and magnetic media. Also, while the control signals are depicted in FIG. 67 as being supplied to the associated memory 1009 solely by the hash CAM 1007, one or more of the control signals may alternatively be supplied to the associated memory 1009 by the packet processor 1005 or another device.

During operation of the system of FIGS. 66 and 67, the control processor 1003 occasionally outputs commands to perform write and delete operations to the packet processor 1005 which, in turn, forwards the commands to the hash CAM 1007. In general, a write operation involves insertion of an entry into the searchable database within the hash CAM 1007, and storage of an associated data value within the associated memory 1009. Insertion of an entry into the searchable database within the hash CAM 1007, in turn, involves execution of a NFA operation to determine an insertion address for a candidate entry, followed by an insert operation to store the candidate entry within the hash CAM 1007 at an address determined by the NFA operation (i.e., at an insertion address). In one embodiment, the control processor 1003 additionally maintains a backup copy of the searchable database, referred to herein as a shadow database, within a separate storage device (e.g., system memory or non-volatile storage) to enable recovery from corruption events. In such an embodiment, a write operation additionally involves returning the insertion address (i.e., the address value generated during the NFA operation) to the control processor 1003 to enable the control processor 1003 to update the shadow database. As discussed above, path 1020 may be used to supply the insertion address to the control processor 1003 (i.e., via the packet processor 1005), or the comparand bus 1010 may be used to return the insertion address.

Figure 68:
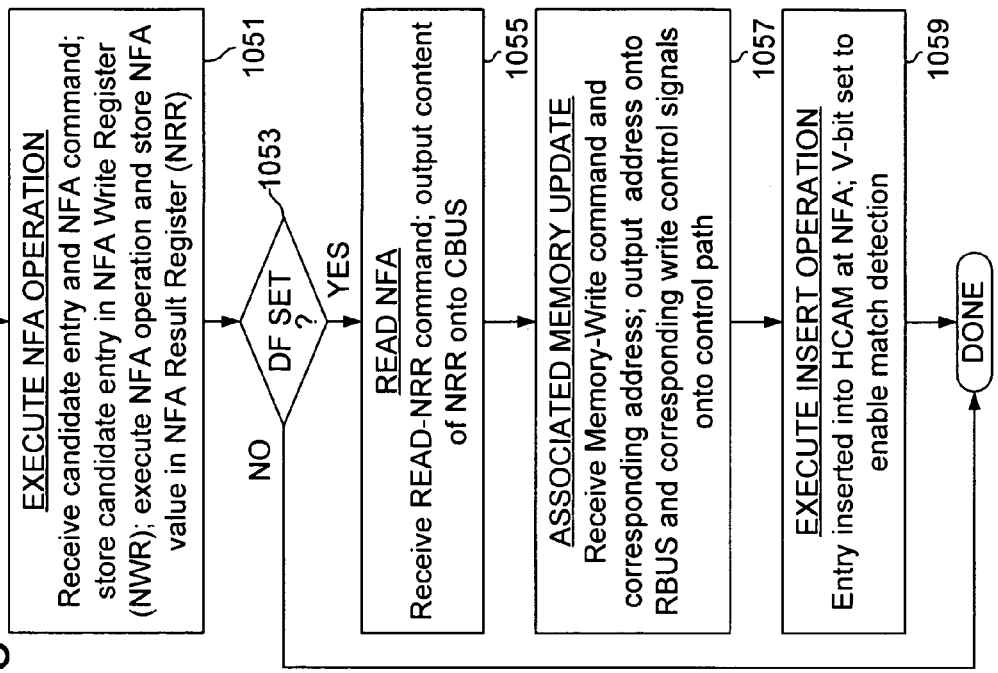
FIG. 68 illustrates a write operation from the perspective of the hash CAM of FIGS. 66 and 67.

FIG. 68 illustrates an exemplary two-phase write operation (also referred to herein as a two-phase load operation) from the perspective of the hash CAM 1007 of FIGS. 66 and 67. Initially, at 1051, the hash CAM receives an NFA command via the instruction bus, and a corresponding candidate entry via the comparand bus. The hash CAM stores the candidate entry in a NFA write register, and executes the NFA operation, generating a device index that constitutes the insertion address, a device flag that indicates whether the insertion address is valid (i.e., whether the hash CAM has an available location in which the candidate entry may be inserted), and a device priority value that indicates the relative priority of the insertion address. Together, the insertion address, corresponding device flag, and selected bits of the device priority value constitute an NFA value which is stored in a NFA result register (NRR). The device flag is output to the packet processor via the flag line (i.e., signal line 1018 of FIG. 67) and is forwarded to the control processor. If the device flag is not set (i.e., determined to be deasserted at 1053), the hash CAM is unable to store the candidate entry, and the write operation is concluded. If the device flag is set, the control processor issues a NRR-read command to the hash CAM via the packet processor to initiate a read NFA operation. In the NFA read operation (1055), the hash CAM receives the NRR-read command and responds by outputting the NFA value from the NFA result register onto the comparand bus. The packet processor receives the NFA value via the comparand bus and forwards the NFA value to the control processor via the control interface. The control processor updates the shadow memory based on the NFA value, then returns the NFA value to the packet processor along with a corresponding memory-write command and an associated data value. The packet processor responds to the memory-write command by outputting the associated data value to the associated memory via the data bus, and forwarding the memory-write command and NFA value to the hash CAM. Referring to block 1057 of FIG. 68, the hash CAM receives the memory write command and corresponding NFA value (i.e., via the instruction bus and the comparand bus, respectively) and, in response, forwards the NFA value to the result bus and issues write control signals on the control path to enable storage of the associated data value within the associated memory at the address indicated by the NFA value. Note that, in an alternative embodiment, the NFA value need not be supplied to the hash CAM with the memory-write command and, instead, the NFA value may be output from the NFA result register to the result bus in response to the memory-write command. After issuing the memory-write command, the control processor issues an insert command to the hash CAM via the packet processor. Accordingly, at 1059, the hash CAM receives the insert command from the packet processor and, in response, stores the content of the NFA write register (i.e., the candidate entry) within the hash CAM memory array at the address indicated by the NFA value within the NFA result register, setting the validity-bit within the memory array entry to enable match detection. Referring briefly to FIG. 41, in the event that the NFA value corresponds to an empty storage row within the memory array 477 of a hash CAM block, the hash index generated during the NFA operation is stored within the binary CAM 601 at the binary CAM row indicated by the row index component of the NFA value. This storage operation is omitted in a hash CAM block embodiment not having a binary CAM (e.g., the hash CAM block 319 of FIG. 16). More generally, hash CAM block embodiments described hereinafter as including a binary CAM may alternatively be implemented without such binary CAM and the corresponding binary CAM operations omitted. The hash CAM block may be any of the hash CAM block embodiments disclosed herein.

Reflecting on the write operation of FIG. 68, it should be noted that the execution of the insert operation (1059) after execution of the associated memory update (1057), prevents an intervening search operation from producing a match detection on an inserted entry before the corresponding associated data value has been stored within the associated memory. That is, the order of operations in the write operation of FIG. 68 prevents premature match detections and is therefore said to be an interlocked write operation. Alternatively, a non-interlocked write operation may be performed by executing the insert operation (1059) before the associated memory update (1057). This may be beneficial, for example, in an embodiment in which the hash CAM includes control logic to carry out an NFA operation and conditional entry insertion (i.e., conditioned on successful NFA determination) in response to a single command (e.g., in the unified load embodiment described above). The window of time in which a premature match may be detected is small enough that premature matches should be infrequent and, if the nature of the packet stream permits loss of an occasional packet (e.g., due to improper routing or classification), premature matches may be tolerated. Alternatively, a validity bit may be associated with each associated memory storage location to enable detection of invalid associated data values (i.e., in the case of a premature match). Similarly, an invalidity code may be stored (e.g., all bits of lookup value are 0 or some other bit pattern which may be distinguished from valid data) within each unused storage location within the associated memory to enable detection of invalid associated data values.

The single-entry write operation illustrated in FIG. 68 may be repeated as many times as necessary to achieve a multi-entry write operation. Depending on the overall system architecture however, it may be desirable to reorder one or more of the operations to permit a direct memory access (DMA) controller to handle command and data transfer instead of the control processor, thereby freeing the control processor to perform other functions. In one embodiment, for example, the control processor is a multi-gigahertz processor having an integral DMA controller (a discrete DMA controller may also be provided) and is coupled to the packet processor via a relatively slow-speed bus (e.g., a peripheral component interconnect (PCI) bus). In such a system, enabling the DMA controller to manage write operations directed to the hash CAM and associated memory frees the control processor from idling for substantial intervals while awaiting completion of PCI bus transfers. One particularly efficient way to manage such write operations, is to program the DMA controller or similar device to insert a block of candidate entries into the hash CAM and to store a corresponding block of associated data values in the associated storage. Unfortunately, simple repetition of the single-entry write operation of FIG. 68 does not lend itself to such a block transfer technique for a number of reasons. First, one or more entry insertions into the hash CAM may fail (i.e., due to collisions within the hash CAM blocks and unavailability of an overflow location within the overflow CAM block); a circumstance handled by reading the device flag generated during each NFA operation, then conditionally updating the associated memory according to whether the device flag is set. Commercially available DMA controllers (including integrated DMA controllers) often are not designed to carry out such conditional operations, limiting the effectiveness of using the DMA controller to carry out the block transfer. Another difficulty with applying the single-entry write operation of FIG. 68 to a block transfer under DMA control is that the NFA value is read after each NFA operation; an operation generally desirable to maintain the shadow database, but also an operation that involves executing a read from the hash CAM in between writes to the hash CAM. Many commercially available DMA controllers, though capable of executing sequences of write operations and sequences of read operations, are not designed to execute a read operation within a sequence of write operations. In one embodiment, both of these issues are avoided by providing a modified hash CAM architecture in which a sequence of NFA values generated during a block insertion operation, including the sequence of device flag states, are stored within a first-in, first-out (FIFO) storage buffer within the hash CAM, referred to herein as a NRR FIFO. By this arrangement, a DMA controller may be programmed to insert a block of entries into the hash CAM, then programmed to read the resulting queued block of NFA values from the NRR FIFO. Finally, based on the device flag state within each NFA value, the DMA controller may be programmed to store a block of associated data values within the associated memory.

Figure 69:
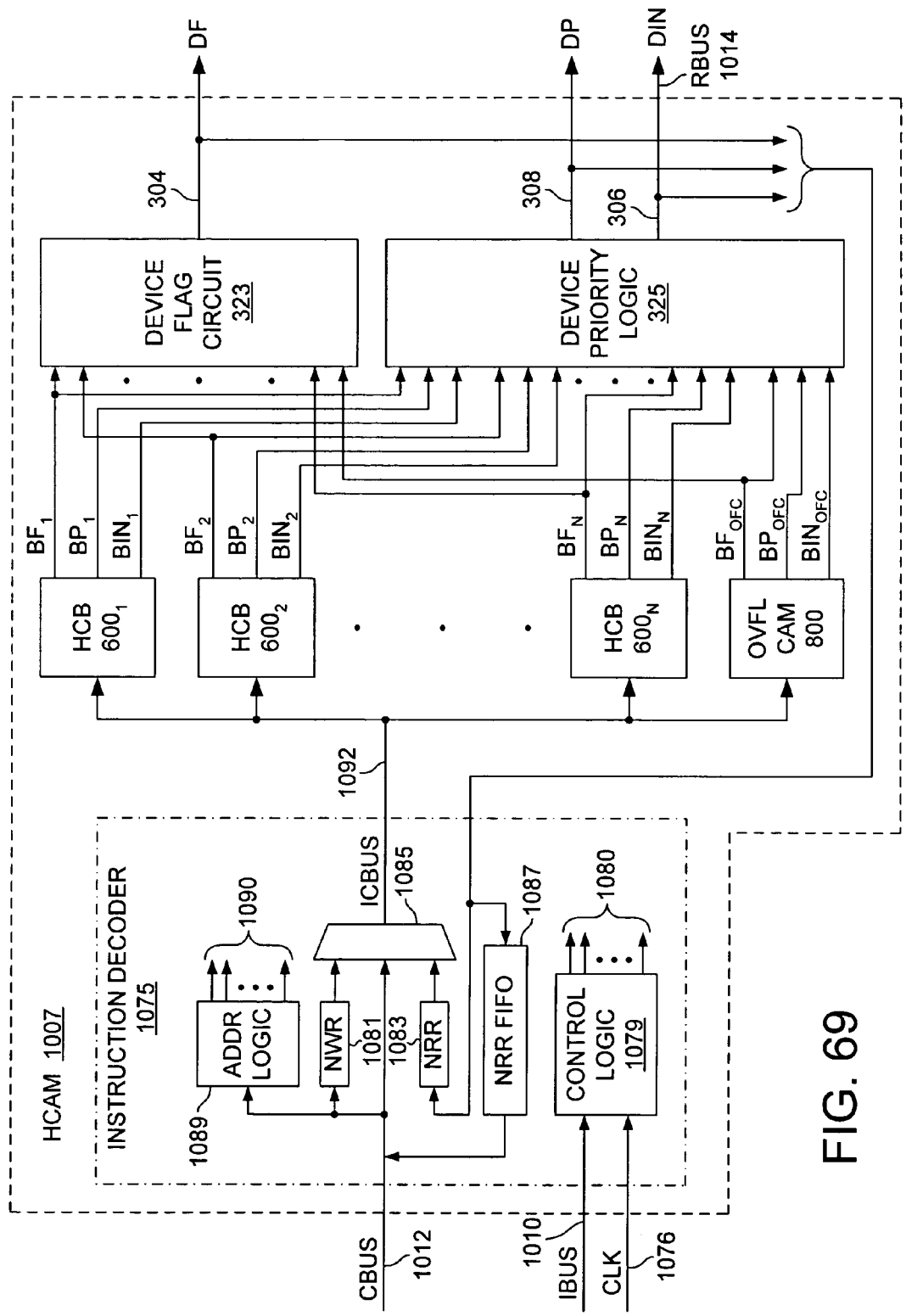
FIG. 69 illustrates a hash CAM according to an embodiment of the invention.

FIG. 69 illustrates a hash CAM 1007 according to an embodiment of the invention. The hash CAM 1007 includes an instruction decoder 1075, N hash CAM blocks $600_1$-$600_N$, an overflow CAM block 800, a device flag circuit 323 and device priority logic 325. The hash CAM blocks $600_1$-$600_N$ operate generally as described above in reference to FIGS. 41-51. That is, each hash CAM block 600 responds to a candidate entry and NFA signal by generating a block flag (BF) that indicates whether the hash CAM block 600 has an available storage location in which to store the candidate entry, a block index (BIN) that indicates a row address and segment address of the storage location, and block priority value (BP) that indicates the relative priority of the storage address. The overflow CAM block 800 operates generally as described above in reference to FIGS. 52-64, and similarly generates a block flag, block index and block priority value. The block flag signal from each of the hash CAM blocks $600_1$-$600_N$ and the overflow CAM block 800 is supplied to the device flag circuit 323 and to the device priority logic 325. The device flag circuit 323 generates a device flag 304 according to whether any of the block flag signals are asserted, thereby indicating whether the candidate entry may be stored within the hash CAM 1007. The block indices and block priority values from the hash CAM blocks $600_1$-$600_N$ and the overflow CAM block 800 are supplied to the device priority logic 325 which outputs, as a component of a device index 306, a highest priority one of the block indices for which the corresponding block flag signal is asserted. The device index 306 additionally includes a block identifier component which identifies the CAM block ($600_1$-$600_N$, 800) that sourced the highest priority block index.

The instruction decoder 1075 includes a NFA write register 1081 (NWR), NFA result register 1083 (NRR), NRR FIFO 1087, control logic 1079, address logic 1089, and multiplexer 1085. The control logic 1079 receives commands from the packet processor by sampling the instruction bus 1010 in response to a clock signal (CLK) supplied via a clock line 1076. The control logic 1079 outputs control signals and timing signals (shown generally in FIG. 69 by arrows 1080) to other circuit blocks within the hash CAM as necessary to execute the incoming commands. The NFA write register 1081 and address logic 1089 are coupled to receive values from the comparand bus 1012, and the NFA result register 1083 and NRR FIFO 1087 are coupled to receive NFA values from the device flag circuit 323 and device priority logic 325 (i.e., the device flag, device index and selected bits of the device priority value generated in response to an NFA operation). Note that the component circuit blocks depicted within the instruction decoder 1075 may alternatively be disposed elsewhere within the hash CAM 1007.

In one embodiment, address values, configuration values, candidate entries, and search values are input to the hash CAM 1007 via the comparand bus 1012 in time-multiplexed, multi-phase transfers. Address values are transferred to the hash CAM 1007 during an address phase of the multi-phase transfers, and corresponding configuration values, candidate entries and search values are input to the hash CAM in a data phase of the multi-phase transfers. Command information is received in the control logic 1079 concurrently with the multi-phase comparand bus transfers. The control logic 1079 responds to incoming commands by issuing select signals to multiplexer 1085, thereby enabling selected registers, and/or the comparand bus 1012 to drive an internal comparand bus 1092 (ICBUS) as necessary to carry out configuration, NFA, insert and search operations. In one embodiment, the internal comparand bus 1092 is used to perform time-multiplexed transfer of address and data values (i.e., search values, candidate entries, configuration values, etc.) to the CAM blocks. One or more circuits (not shown in FIG. 69) are provided at the front end of the CAM blocks to distribute the multiplexed transfers onto the separate address and data paths shown, for example, in the hash CAM block embodiment of FIG. 41, and into the separate address, data and search key paths shown in the overflow CAM block embodiment of FIG. 52. In one embodiment, each of the hash CAM blocks $600_1$-$600_N$ is implemented substantially as described in reference to FIGS. 41-51, except that the partially filled row register 663 of FIG. 43 may be omitted (i.e., due to the provision of the NFA result register 1083 to store the NFA value). The overflow CAM 800 is implemented substantially as described in reference to FIGS. 52-64.

In an NFA operation, an address that specifies the NFA write register 1081 is transferred to the hash CAM 1007 during an address phase of a comparand bus transfer and latched within the address logic 1089. The address logic, in response, asserts one of a plurality of select signals 1090 to select the NFA write register 1081 to receive a candidate entry during a data phase of the comparand bus transfer. The control logic 1079 receives the corresponding NFA command concurrently with the multi-phase transfer of the NFA write register address and candidate entry, and, in response, issues a select signal to the multiplexer 1085 to enable the candidate entry to be transferred to each of the CAM blocks $600_1$-$600_N$ and 800 via the internal comparand bus 1092. The control logic 1079 also asserts the NFA signal 212 described in reference to FIGS. 41-64 to indicate that an NFA operation is to be performed. The CAM blocks $600_1$-$600_N$ and 800, device flag circuit 323 and device priority logic 326 operate as described above to generate a NFA value (i.e., device index, device flag and device priority value). In addition to outputting the NFA value on the flag line and result bus (and, optionally, on a priority value path), the NFA value is stored in the NFA result register 1083 and in the NRR FIFO 1087 in response to a control signal from the control logic 1079. If the device flag 304 indicates that the hash CAM 1007 is able to store the candidate entry (temporarily registered within the NFA write register 1081), the control processor issues an insert command to the hash CAM 1007 via the packet processor. The insert command is received within the control logic 1079, which responds by selecting the NFA result register 1083 to drive the internal comparand bus 1092 during an address phase of a multi-phase transfer, and by selecting the NFA write register 1081 to drive the internal comparand bus 1092 during a data phase of the multi-phase transfer. By this operation, the block ID portion of the device index stored within the NFA result register 1083 is provided to select one of the CAM blocks, and the remaining portion of the device index is used to select a storage row and segment for storage of the candidate entry output from the NFA write register 1081. As discussed below, the device priority information within the NFA value is used to determine whether the corresponding device index corresponds to an empty row within a hash CAM block 600 and, if so, to enable a hash index generated based on the candidate entry to be stored within the binary CAM entry that corresponds to the device-index-selected storage row within the hash CAM block.

Figure 70:
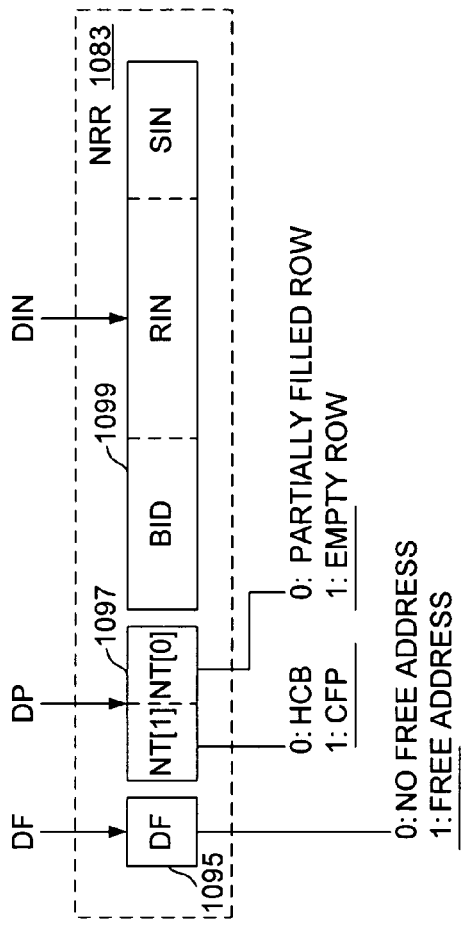
FIG. 70 illustrates the NFA result register of FIG. 69 according to an embodiment of the invention.

FIG. 70 illustrates an exemplary embodiment of the NFA result register 1083 of FIG. 69. The NFA result register 1083 includes storage for three components of a NFA value: a device index component 1099 that corresponds to the device index output from the device priority encoder; a device flag component 1095 that corresponds to the device flag output from the device flag logic; and an NFA type component 1097 (NT) that corresponds to selected bits of the device priority value output from the device priority encoder. In the embodiment of FIG. 70, the NFA type component 1097 includes two bits: an overflow bit, NT[1] and an empty bit, NT[0]. The over flow bit, if set, indicates that the overflow CAM block is the source of the block index portion (i.e., row index, RIN, and segment index, SIN) of the device index component 1099. The empty bit, if set, indicates that the device index corresponds to an empty row within a bash CAM block. In one embodiment, selected bits of the device priority value are selected to form the NFA type component 1097. For example, a selected bit of the device priority value may be set if the overflow CAM block is selected to source the block index component of the device index (e.g., as shown in FIG. 63) and therefore may be used to drive the overflow bit of the NFA type component. Similarly, as shown in FIG. 49, a selected bit of the device priority value may be set to indicate that the device index corresponds to an empty row within a hash CAM block, and therefore may be used to drive the empty bit of the NFA type component. Note that, in an alternative embodiment, combinations of bits within the device priority value may be used to generate the empty bit within the NFA type component 1097. Also, the block ID field (BID) within the device index component 1099 may be used to generate the overflow bit (e.g., the overflow bit may be set or reset according to whether the block ID field corresponds to the overflow CAM block).

When an insert command is issued to the hash CAM of FIG. 69, the candidate entry stored within the NFA write register 1081 is conditionally transferred to a storage location indicated by the NFA value within the NFA result register 1083. More specifically, if the device flag component of the NFA value is set, then the candidate entry is stored within the CAM block, row and segment indicated by the device index component of the NFA value. If the NFA type component of the NFA value indicates that the candidate entry is being stored within an empty row of a hash CAM block 600 (i.e., NT[1:0]=01), then the hash index generated for the candidate entry (which may be buffered within the identified hash CAM block) is stored, at least in part, in the binary CAM for the hash CAM block 600. In one embodiment, the NFA type component may be used to generate the write strobe signal (WSTB) for latching the binary CAM flag signal (BCF) in storage element 667 of FIG. 45, and may also be used to strobe the next free binary CAM address into the NFBA register 634 of FIG. 43. As discussed above in reference to FIGS. 43-51, the next free binary CAM address may be generated, within a given hash CAM block, by outputting the validity bits of the binary CAM rows onto the match lines (see match lines 626 of FIG. 43) during a BCAM load operation. Alternatively, each NFA operation may be a two-stage operation in which a search for the next free BCAM address is performed in a first stage (i.e., by outputting the binary CAM validity bits onto the match lines 626 of FIG. 43), and a search for a hash index match within the binary CAM is performed in a second stage. The order of execution of the two stages of the NFA operation may be reversed in alternative embodiments.

Returning to FIG. 69, if a sequence of NFA operations and corresponding insert operations are performed within the hash CAM 1007, the resulting sequence of NFA values are queued in the NRR FIFO 1083. The head of the NRR FIFO 1083 (i.e., the NRR FIFO location containing the least recently stored NFA value) is coupled to the comparand bus 1012 to enable the NRR FIFO 1083 to be read entry by entry, after a corresponding sequence of NFA operations and insert operations has been performed. By this arrangement, the need to perform a NFA read operation (see 1055 of FIG. 68) after each NFA operation is avoided.

Figure 71:
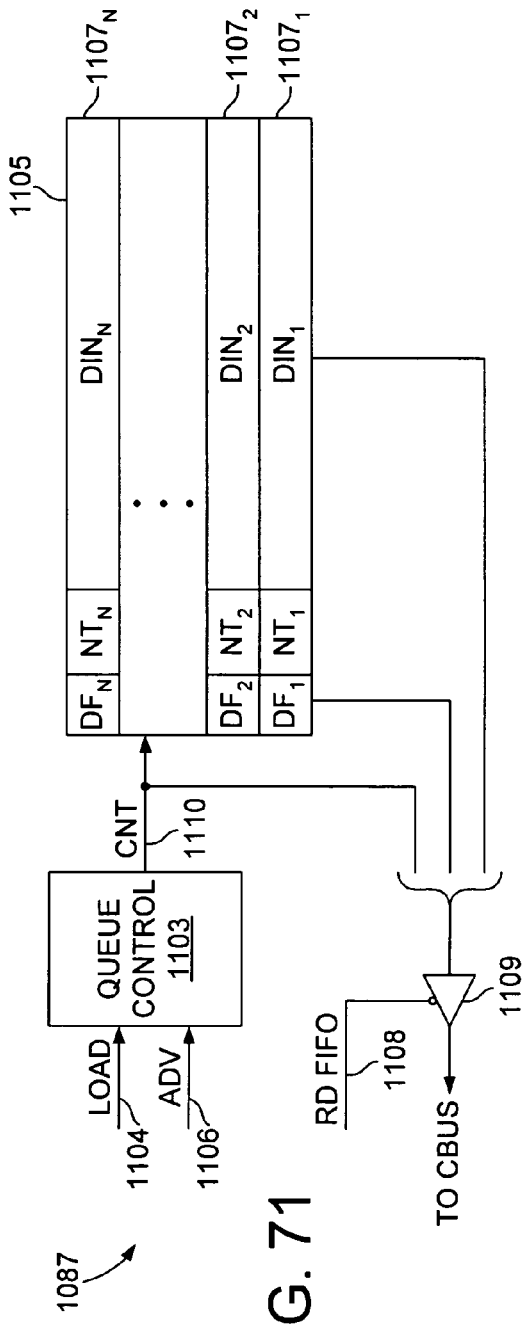
FIG. 71 illustrates the NRR FIFO of FIG. 69 according to an embodiment of the invention.

FIG. 71 illustrates the NRR FIFO 1087 of FIG. 69 according to an embodiment of the invention. The NRR FIFO includes N storage registers $1107_1$-$1107_N$, queue control logic 1103, and an output driver 1109. The queue control logic 1103 responds to a load signal 1104 (LOAD) from the control logic (i.e., element 1079 of FIG. 69) by enabling an NFA value to be stored in a tail storage register of the storage registers 1107, and incrementing a count value 1110 to select a higher numbered one of the storage registers 1107 to be the new tail storage register. The queue control logic 1103 additionally responds to an advance signal 1106 (ADV) from the control logic by shifting the contents of the storage registers 1107 forward toward the head storage register $1107_1$, the value present at the head storage register $1107_1$ (i.e., the head entry) being overwritten by the value shifted forward from register $1107_2$, effectively expelling the head entry and establishing a new head entry. In one embodiment, the output driver 1109 is a tri-state driver that is enabled by a read FIFO signal 1108 (RD FIFO) from the control logic to drive the head entry (i.e., the NFA value within register $1107_1$) and the count value 1110 onto the comparand bus. When the read FIFO signal 1108 is deasserted, the output nodes of the output driver 1109 are set to a high impedance state to enable other transfers over the comparand bus.

Note that outputting the count value 1110 along with the NFA value from register $1107_1$ enables the control processor (or other read requestor) to determine the number of NFA values remaining in the NRR FIFO 1087 (i.e., the queue depth). A reset signal, not shown, may be supplied to the queue control logic 1103 to enable the count value 1110 to be reset during system initialization or in the event of an error, effectively clearing the NRR FIFO 1087.

In one embodiment, each of the storage registers 1107 has the same format as the NFA result register 1083 of FIG. 70 and, during a load operation, the tail storage register of the NRR FIFO 1087 and the NFA result register are concurrently loaded with the same NFA value. Note that, because the storage registers 1107 and NFA result register have the same format, the NFA result register may be omitted and the NRR FIFO storage register containing the most recently loaded NFA value used to source the NFA value for entry insertion purposes. In embodiments of the invention in which a candidate entry spans more than one storage segment within a CAM block, however, the device index component of the NFA value within the NFA result register is auto-incremented as each segment of the candidate entry is loaded, thereby selecting the next storage segment within identified CAM block. In such embodiments, storing the NFA value separately in the NFA result register and NRR FIFO 1087 preserves the original NFA value for a subsequent NRR FIFO read operation. Note that multiple NFA write registers (i.e., element 1081 of FIG. 69) may be provided to hold the constituent segments of a segment-spanning entry.

It should be noted that the NRR FIFO 1087 of FIG. 71 is but one of many possible NRR FIFO embodiments. For example, in an alternative embodiment, rather than shifting entries forward within storage registers 1107, a read pointer and write pointer may be used to implement a circular buffer. In such an embodiment, the read pointer indicates the head of the FIFO and is incremented in a read operation, and the write pointer indicates the tail of the FIFO and is incremented in a write operation. Modulo arithmetic is used to wrap the pointers at either extreme of the buffer range. The queue control logic 1103 may generate the count value based on a difference between the read and write pointer values, or may include a separate counter which is incremented in response to a FIFO load and decremented in response to a FIFO read. In another embodiment, a last-in-first-out (LIFO) storage structure, sometimes called a stack, may be used instead of a FIFO. In such an embodiment, the most recently entered NFA value is the first read from the LIFO structure (i.e., popped from the stack) and the least recently entered NFA value is the last read from the LIFO structure. The control processor may be programmed to map (i.e., correlate) each NFA value read from the LIFO structure to the appropriate hash CAM entry and associated data value in reverse order (e.g., the $i^{th}$ NFA value read from the hash CAM after a block of N insert operations corresponds to the $(N-i)^{th}$ entry inserted into to the hash CAM). In general, any ordered-entry storage structure (i.e., FIFO, LIFO or any other storage structure in which entries are output from the storage structure in an order determined by (but not necessarily the same as) the order in which they were stored) may be used in place of the NRR FIFO of FIGS. 71 and 69 without departing from the spirit and scope of the invention.

Figure 72:
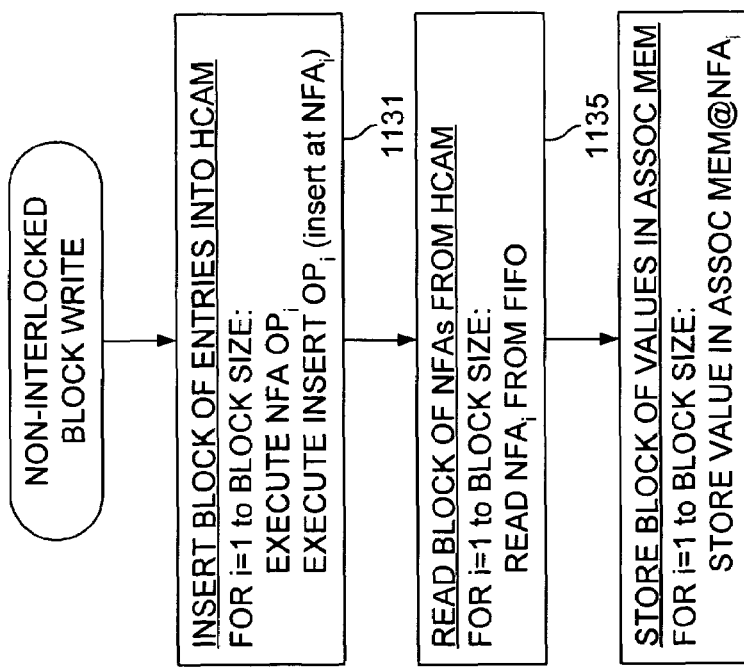
FIG. 72 illustrates a block write operation using the hash CAM of FIG. 69.

FIG. 72 illustrates a block write operation using the hash CAM of FIG. 69. At 1131, a block of entries are inserted into the hash CAM by executing an NFA operation followed by an insert operation for each candidate entry. That is, letting index variable i range from 1 to the number of entries to be inserted (i.e., the block size), an NFA operation is executed for candidate entry$_i$ to store the candidate entry within the NFA write register and to capture the resulting NFA value in the NFA result register and NRR FIFO, then an insert operation is performed for candidate entry$_i$ to transfer the candidate entry from the NFA write register to the CAM block (i.e., hash CAM block or overflow CAM block) location indicated by the device index within the NFA result register. By repeating this NFA/insert sequence for each candidate entry in the block, a number of NFA values (i.e., according to the block size) are queued in the NFA FIFO.

Because the block insertion operation of 1131 involves a sequence of writes to the hash CAM without intervening reads, the block insertion operation is well suited to execution by a DMA controller. That is, for each candidate entry, the DMA controller writes the candidate entry to NFA write register to initiate the NFA operation, then writes a command to transfer the candidate entry from the NFA write register to the hash CAM memory location indicated by NFA result register to complete the entry insertion (i.e., an indirect write relative to the NFA result register). The DMA controller may be programmed to repeat this sequence of writes for a block of candidate entries stored, for example, in a main memory or other storage, thereby freeing the control processor to perform other tasks.

In one embodiment, the DMA controller programmed to carry out the block insertion operation 1131 is capable of executing chained DMA operations. A chained DMA operation is one in which multiple primitive DMA operations are executed one after another (i.e., in a chain) to achieve a more complex DMA operation. Each primitive DMA operation within a DMA chain involves transfer of one or more values between a fixed address and a relative address, the relative address having an initial value that is incremented (or decremented) after each value transferred. In the case of the block insertion operation 1131, for example, a first primitive DMA operation may be used to transfer an entry candidate from a relative location within system memory to the fixed address of the NFA write register. Such a transfer initiates an NFA operation within the hash CAM device and causes the relative address within the DMA controller to be incremented (or decremented) after the transfer to point to the next entry candidate to be inserted within the hash CAM as part of the overall block write operation. After the NFA operation initiated by the first primitive DMA transfer is completed, a second primitive DMA operation is executed to transfer an insert command to the hash CAM device, the insert command indicating that the entry candidate stored within the NFA write register is to be written to the address indicated by the NFA result register. By chaining the first and second primitive DMA operations a number of times in succession according to the number of candidate entries to be inserted, a single chained DMA operation may be used to perform the block insert operation 1131 of FIG. 72.

Many commercially available DMA controllers do not support chained DMA transfers and therefore are not well suited to performing the block insertion operation 1131 of FIG. 72. In one embodiment, a command buffer is provided within the hash CAM to establish a single address that can be written to initiate both NFA and insert operations. To initiate an NFA operation, the control processor or DMA controller outputs a composite value to the hash CAM command buffer, the composite data value including a candidate entry and a command that indicates that the candidate entry is to be written to the NFA write register. Control circuitry within the hash CAM responds to the composite value by transferring the candidate entry to the NFA write register, thereby initiating the NFA operation. The control processor or DMA controller outputs a second composite value to the hash CAM command buffer to initiate the insert operation. That is, the second composite value includes a command that indicates that the content of the NFA write register is to be written to a location within the hash CAM indicated by the device index component of the NFA value. Because both the first and second composite values are written to a fixed address within the hash CAM, the overall insertion operation 1131 of FIG. 72 may be carried out as a sequence of primitive DMA operations. That is, a DMA controller may be programmed to transfer a sequence of composite values from a contiguous range of memory addresses (i.e., base address plus progressively incremented count value) to the fixed address of the command buffer within the hash CAM device. Each pair of composite values includes a first composite value having an NFA command and candidate entry as constituent values, and a second composite value having an insert command as its constituent value (the second composite value may also include a portion of the candidate entry such as a mask field, or segment of a multi-segment entry). Thus, to perform a block insertion of N candidate entries, 2N composite values are transferred by the DMA controller to the command buffer within the hash CAM. In one embodiment, the command buffer is implemented as a first-in-first-out storage circuit (i.e., a command FIFO) so that multiple composite values may be buffered within the command buffer, even though an operation commanded by a preceding composite value has not been completed.

At 1135, the block of NFA values generated during the block entry insertion is read from the hash CAM by repeatedly reading the NFA value at the head entry of the NRR FIFO and advancing the NRR FIFO contents. Because this block read sequence involves a transfer of NFA values from a single read address within the hash CAM (i.e., an address that selects the NRR FIFO to drive the comparand bus), to a contiguous sequence of memory locations in another storage (e.g., main memory), the block read sequence is also well suited to execution by a DMA controller. The DMA controller may be programmed to read an NFA value from the NRR FIFO, store the NFA value in a memory location indicated by a DMA pointer (i.e., address value), increment the DMA pointer, then repeat for the next NFA value within the NRR FIFO. The head entry within the NRR FIFO may be read prior to execution of the block read operation 1135 to confirm or determine the number of NFA values queued within the NRR FIFO and to program the DMA controller accordingly.

At 1137, a block of associated data values is stored in the associated memory at storage locations indicated by the NFA values read from the NRR FIFO. This operation also involves a sequence of writes (writing the NFA value to the hash CAM along with an associated-memory write instruction, and outputting an associated data value to the associated memory) and therefore is also suited to execution by a DMA controller. Thus, the three block transfer operations depicted in FIG. 72 (1131, 1135 and 1137) may each be performed by a DMA controller that has been programmed to repeatedly execute the indicated transfer sequence in accordance with the block size.

The block write operation illustrated by FIG. 72 is referred to herein as a non-interlocked block write due to the storage of associated data values after insertion of corresponding entries within the hash CAM. That is, because the candidate entries are inserted prior to storage of associated data values, premature matches are possible. In one embodiment, premature matches are prevented by including a validity bit in each storage location within the associated memory, the validity bit indicating an invalid state until the storage location is loaded with an associated data value. By this arrangement, a premature match detection may be detected by the packet processor through evaluation of the validity bit output from the associated memory. That is, for each search operation that produces a match in the hash CAM, the packet processor evaluates the validity bit of the corresponding associated data value, and declines to carry out the requested forwarding or classification operation if the validity bit indicates that an invalid associated data value has been read. Alternatively, instead of a validity bit, an unused, reserved bit pattern may be stored within storage locations of the associated memory and used to signify invalidity.

Figure 73:
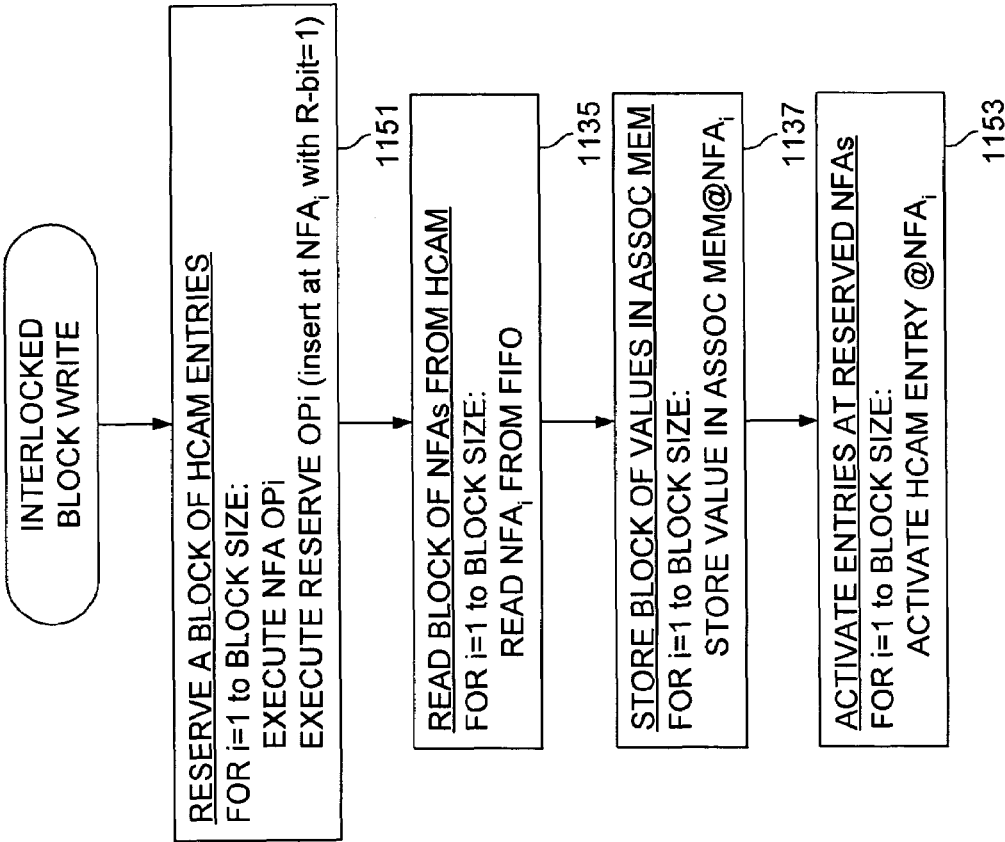
FIG. 73 illustrates an alternative block write operation that is interlocked to prevent premature match detection.

FIG. 73 illustrates an alternative block write operation that is interlocked to prevent premature match detection. Initially, at 1151, a block of hash CAM entries are reserved by executing an NFA operation followed by a reserve operation for each candidate entry of a block of N candidate entries. The reserve operation is a special type of insert operation in which a candidate entry is inserted at a hash CAM storage location indicated by the NFA result register, but with a reserve bit set to prevent match detection (i.e., bit line for a reserve bit is driven high during entry storage to set the reserve bit). That is, a subsequent NFA operation will determine the hash CAM storage location to be unavailable for entry insertion purposes (i.e., the storage location is reserved), but a subsequent search operation that resolves to the hash CAM storage location will not yield a match indication. In one embodiment, depicted in FIG. 74, the reserve bit (R) is included within each segment 1170 of the memory array within each hash CAM block and the overflow CAM block, and is set to a high state to reserve the segment.

Figures 74, 75:
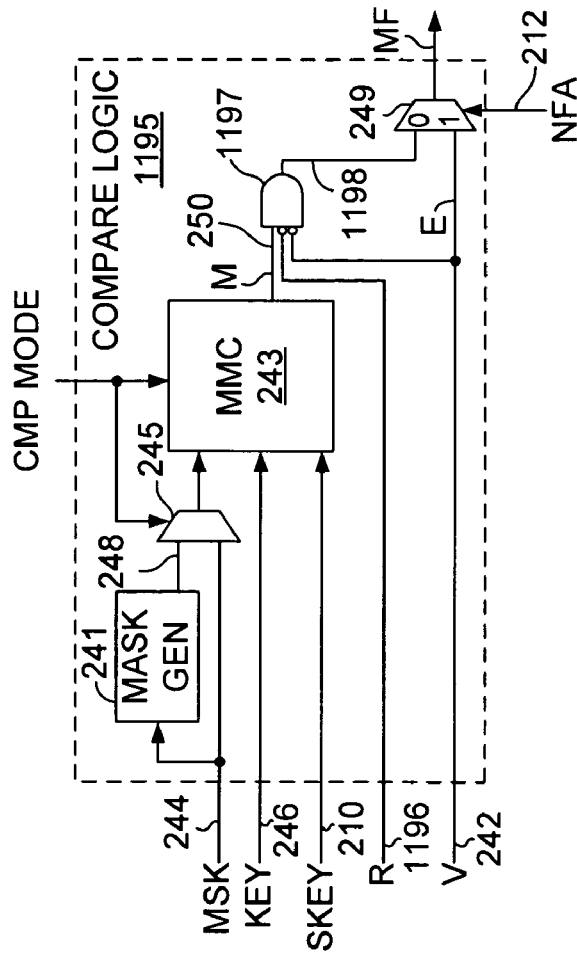
FIG. 74 illustrates an exemplary format for a hash CAM entry having a reserve bit.
FIG. 75 illustrates a compare logic circuit 1195 that may be used in conjunction with the reserve bit shown in FIG. 74.

FIG. 75 illustrates a compare logic circuit 1195 that may be used in conjunction with the reserve bit shown in FIG. 74. The compare logic circuit is substantially similar to the compare logic 135 of FIGS. 6 and 9, except that AND gate 247 is replaced by a three-input AND gate 1197, the third input being an inverting input coupled to receive the reserve bit 1196. By the operation of multiplexer 249, the reserve bit plays no role in an NFA operation. That is, in an NFA operation, the validity bit, if set to 0 to indicate a valid entry, prevents assertion of the match flag (or the segment flag, as shown in FIG. 44) and, if set to 1, enables assertion of the match flag (or segment flag). By contrast, in a search operation, the reserve bit, if high to indicate a reserved entry, prevents assertion of a qualified match signal 1198. All other components and signals illustrated in FIG. 75 correspond to like numbered components and signals in FIGS. 6 and 9.

Returning to FIG. 73, the interlocked block write operation proceeds with a block read operation 1135 and a block storage operation 1137, each of which is performed as discussed in reference to FIG. 72. At 1153, a block of activate operations are performed to reset the reserve bit within the reserved hash CAM storage locations, thereby enabling match detection with the entries in those locations. In one embodiment, each activate operation is initiated by issuing an activate command and an NFA value to the hash CAM (the NFA value being available by virtue of the block NFA read at 1135). The hash CAM responds to the activate command by driving a low signal on the bit line coupled to the reserve bit within the addressed storage location, and enabling the reserve bit to be driven low by assertion of the word line for the addressed storage location. The sequence of activate operations may also be performed by a DMA controller. Because the block activate operation 1153 is performed after the block storage operation at 1137, premature match detections are prevented.

It should be noted that the ordered-entry storage structure 1087 used to support block write operations in the hash CAM of FIG. 69 is not limited to use within hash CAM devices, but rather may be applied within any type of CAM device to facilitate block write operations. That is, NFA values generated in response to a sequence of entry insertion operations in any type of CAM device may be buffered in an ordered-entry storage (e.g., FIFO, LIFO, etc.), then read out at a later time to enable corresponding updates to a shadow database and/or associated memory.

Reducing Overflow Storage Consumption Through Entry Relocation

As described above in reference to the hash CAM embodiments of FIGS. 14, 15 and 69, candidate entries that cannot be stored in the hash CAM blocks (i.e., colliding entries) are stored instead in the overflow CAM block. If the fill rate within the overflow CAM block exceeds the deletion rate, the overflow CAM block will eventually fill to capacity. This is an undesirable condition as the hash CAM as a whole is unable to store the next colliding entry and therefore appears to the control processor to be full, regardless of the actual fill level of the hash CAM blocks.

Figure 76:
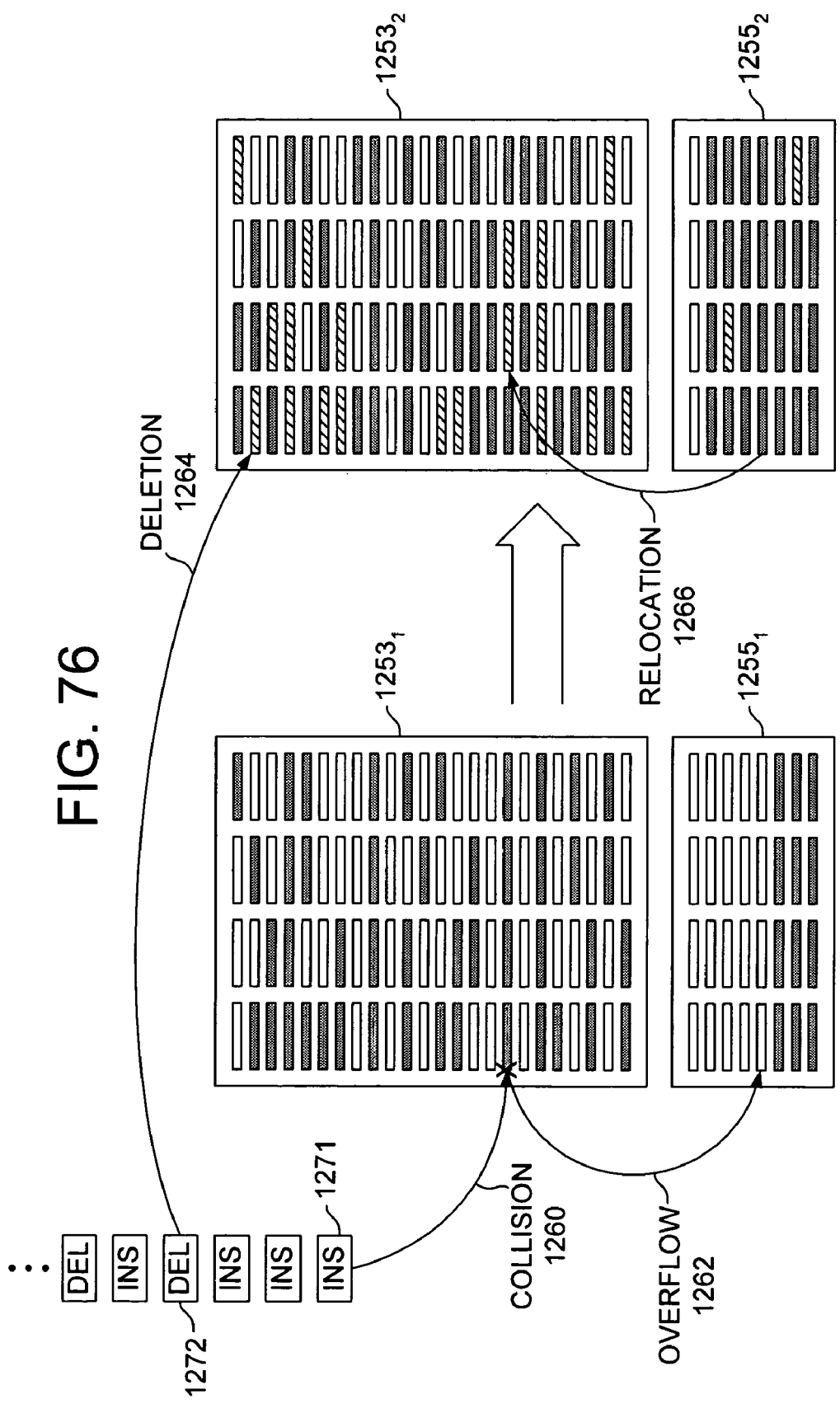
FIG. 76 illustrates an entry relocation operation according to an embodiment of the invention.

FIG. 76 illustrates an operation, referred to herein as entry relocation, for reducing storage consumption within the overflow CAM block, and thereby reducing the likelihood of a CAM-full indication. Starting from an initial condition in which a storage array $1255_1$ within the overflow CAM block (referred to herein as the overflow storage array) is relatively unfilled, a candidate entry is attempted to be inserted (i.e., in response to an insert command 1271) within memory arrays of a number of hash CAM blocks referred to collectively herein as the primary array $1253_1$. Due to a collision 1260 with previously stored entries within the primary array $1253_1$ (illustrated in FIG. 76 by shaded rectangles), the candidate entry is inserted instead in the overflow array as indicated by arrow 1262. Over time, an incoming stream of insert and delete operations transforms the primary and overflow arrays $1253_1$ and $1255_1$ to the states shown at $1253_2$ and $1255_2$, respectively. That is, the overflow array $1255_2$ is filled to near capacity, and a number of locations within the primary array $1253_2$ and the overflow array $1255_2$ are freed by deletion operations 1264 (the freed locations being designated in FIG. 76 by striped rectangles). At this point, any overflow array entries that correspond to freed locations within the primary array may be relocated from the overflow array $1255_2$ to the primary array $1255_1$. That is, an overflow entry which yields a hash index to a freed location within the primary array may be relocated to the freed location. This operation is illustrated graphically in FIG. 76 by arrow 1266 and is referred to herein as a relocation operation.

In general, an entry relocation operation involves a number of component operations within a hash CAM and, if included, within the associated memory. In the hash CAM, relocation of an entry from the overflow array to the primary array (i.e., to the memory array within one of the hash CAM blocks) involves obtaining the entry to be relocated (i.e., the relocation candidate), performing an NFA operation to determine a destination address for the relocation candidate, inserting the relocation candidate at the destination address, and a deleting the relocation candidate from its source address within the overflow CAM block. The NFA operation and corresponding insertion are referred to collectively herein as a reinsertion operation and may be performed before or after the deletion at the relocation source address. A reinsertion operation is successful if the destination address for the reinsertion is within the primary storage array (i.e., memory array of a hash CAM block), and unsuccessful if the destination address is within the overflow storage array (i.e., the relocation candidate has produced a collision within the primary storage array and has been inserted a second time within the overflow array).

In the associated memory, a relocation operation involves obtaining the data value stored in the associated memory at the relocation source address, storing the data value within the associated memory again at the destination address determined in the hash CAM reinsertion operation, and deleting the data value from the associated memory at the relocation source address.

In embodiments of the invention, relocation operations are systematically attempted for each entry within the overflow storage array. In one embodiment, a host processor (e.g., the control processor or packet processor of FIG. 66) executes a sequence of relocation operations under program control. In an alternative embodiment, control logic within the hash CAM carries out reinsertion operations in the background (i.e., when relocation resources are not needed for other time-critical operations), then notifies the host processor when a reinsertion has been successful (i.e., reinsertion into a hash CAM block). The host processor responds to the notification by performing a relocation operation within the associated memory, then instructing the hash CAM to delete the now-redundant entry at the relocation source address within the overflow CAM block.

Figure 77:
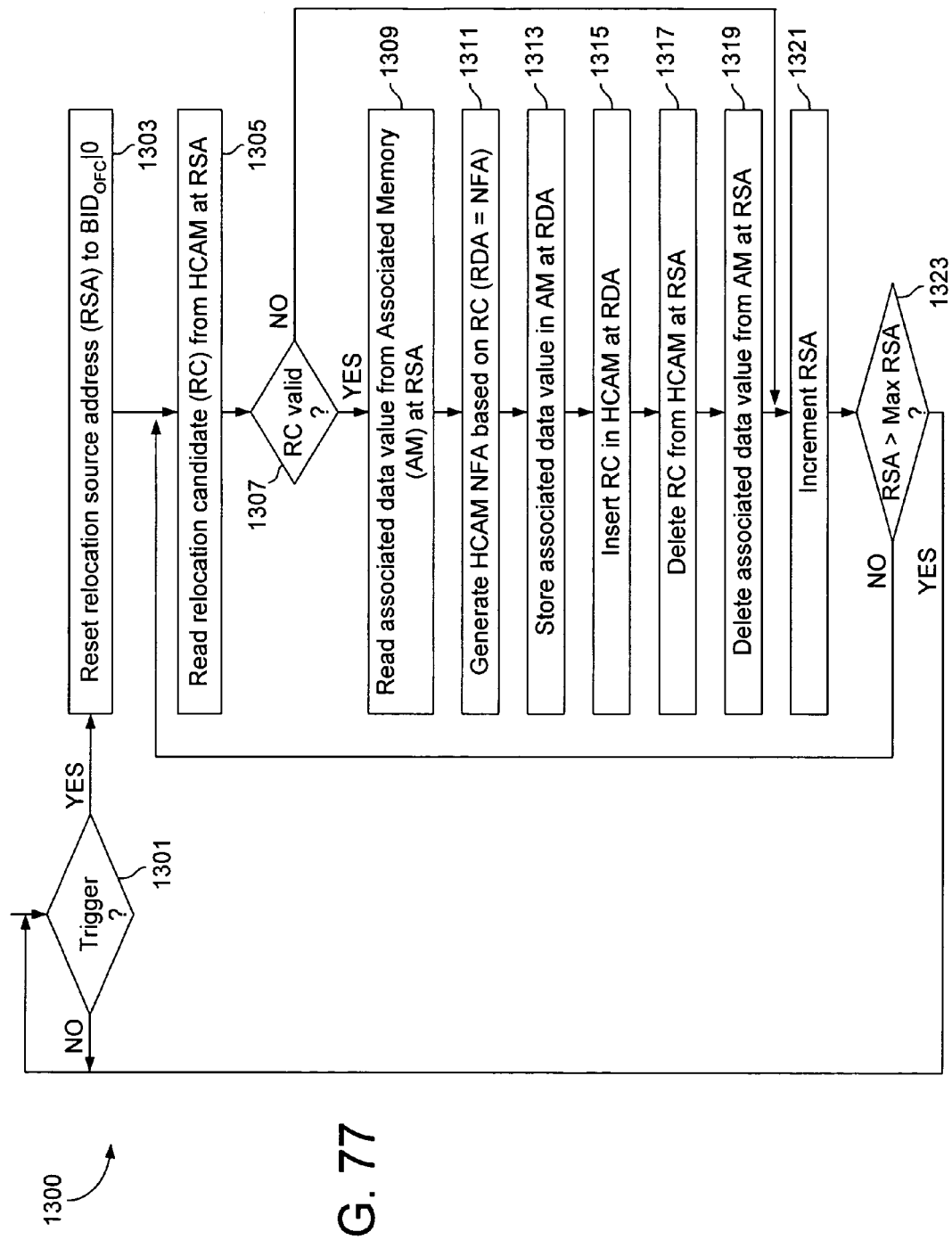
FIG. 77 illustrates a relocation procedure performed by a host processor.

FIG. 77 illustrates a relocation procedure 1300 performed by a host processor. The relocation procedure is initiated at 1301 when the host processor detects a triggering event. The trigger event may include, without limitation and in any combination, determining (or being notified) that a threshold amount of time has elapsed since the last execution of the relocation procedure 1300, determining that the overflow CAM block has reached a threshold fill level, detecting an idle state within the host processor, and so forth. Also, the trigger detection at 1301 may be omitted from the relocation procedure 1300 so that relocation procedure cycles continuously. In any case, once initiated, the relocation procedure 1300 may be executed, for example, as a background task by the host processor.

After the relocation procedure has been triggered, a relocation source address (RSA) is reset at 1303 to point to starting row and segment within the overflow CAM block. That is, the block ID component of the relocation source address is set to the block ID of the overflow CAM block, and the row and segment index components of the relocation source address are set, for example, to zero. At 1305, a relocation candidate is read from the hash CAM at the relocation source address. The validity bit of the relocation candidate is evaluated at 1307 to determine whether the entry is valid. If so, then at 1309 an associated data value is read from the associated memory at the relocation source address. At 1311, the relocation candidate is issued to the hash CAM (e.g., written to the NFA write register 1081 of FIG. 69) to initiate an NFA operation, thereby generating an NFA value based on the relocation candidate. If the device flag component of the NFA value is set, the device index component of the NFA value represents a relocation destination address (RDA). At 1313, the associated data value is stored within the associated memory at the relocation destination address, and at 1315 the relocation candidate is inserted within the hash CAM at the relocation destination address, thereby completing the reinsertion operation begun at 1311. At 1317, the relocation candidate is deleted from the hash CAM at the relocation source address to complete the relocation operation within the hash CAM, and at 1319 the associated data value is deleted from relocation source address within the associated memory to complete a cycle of the relocation procedure 1300. At 1321, the relocation source address is incremented in preparation for an attempted relocation at the next overflow CAM address (i.e., a subsequent cycle of the relocation procedure). At 1323, the relocation source address is compared with a maximum value to determine whether the relocation procedure has cycled through all the storage locations within the overflow CAM block and, if so, the relocation procedure 1300 is completed and is not restarted until the next trigger event is detected at 1301. If the relocation procedure has not cycled through all the storage locations within the overflow CAM block, a new cycle of the relocation procedure is begun at 1305.

As discussed above, a shadow database may be maintained by the control processor (or other processor). In such an embodiment, the operations at 1305, 1307 and 1309 may be omitted with the relocation candidate and associated data value at the relocation source address being obtained from the shadow database rather than the hash CAM and associated memory. Also, if the shadow database indicates the storage locations of valid entries within the overflow CAM block of the hash CAM, then the RSA increment operation at 1321 may instead be a jump from a given relocation source address to the next valid relocation source address.

Still referring to FIG. 77, it should be noted that illustrated operations may be reordered in a number of ways in alternative embodiments. For example, due to the reinsertion of the relocation candidate within the hash CAM prior to the deletion of the relocation candidate within the hash CAM, if the reinsertion operation is unsuccessful and the overflow CAM block is full, the hash CAM will be not generate a valid relocation destination address. To avoid this result, the relocation candidate may be deleted from the hash CAM prior to reinsertion of the relocation candidate. Alternatively, an extra storage location may be reserved within the overflow CAM block for relocation purposes so that a valid relocation destination address will always be generated. In general, reinsertion within the hash CAM (1315) is performed after storage of the associated data value at the relocation destination address (1313), and deletion of the relocation candidate within the hash CAM (1317) is performed before deletion of the associated data value (1319) to prevent premature matches. The order of these operations may be reversed in alternative embodiments.

As discussed above, entries stored within the hash CAM block may span a variable number of segments, so that incrementing the relocation source address at 1321 may involve incrementing the relocation source address by different amounts according to the size of the relocation candidate. In one embodiment, the size of each entry within the overflow CAM block is maintained within the shadow database, enabling the relocation source address to be incremented accordingly. Alternatively, a table ID value (stored, for example, in the tag segment of each row of the overflow CAM block) may be read each time the segment index portion of the relocation source address rolls to zero (i.e., for each new row). By this arrangement, the host processor may determine the number of segments spanned by each relocation candidate within a given row of the overflow CAM block and increment the relocation source address accordingly. In the event that an invalid table ID is read for a given row, the control processor may increment the row component of the relocation source address to point to the next row. This may be accomplished, for example, by adding the number of segments per row of the overflow CAM block (e.g., four, in the embodiment of FIG. 52) to the relocation source address.

Figure 78:
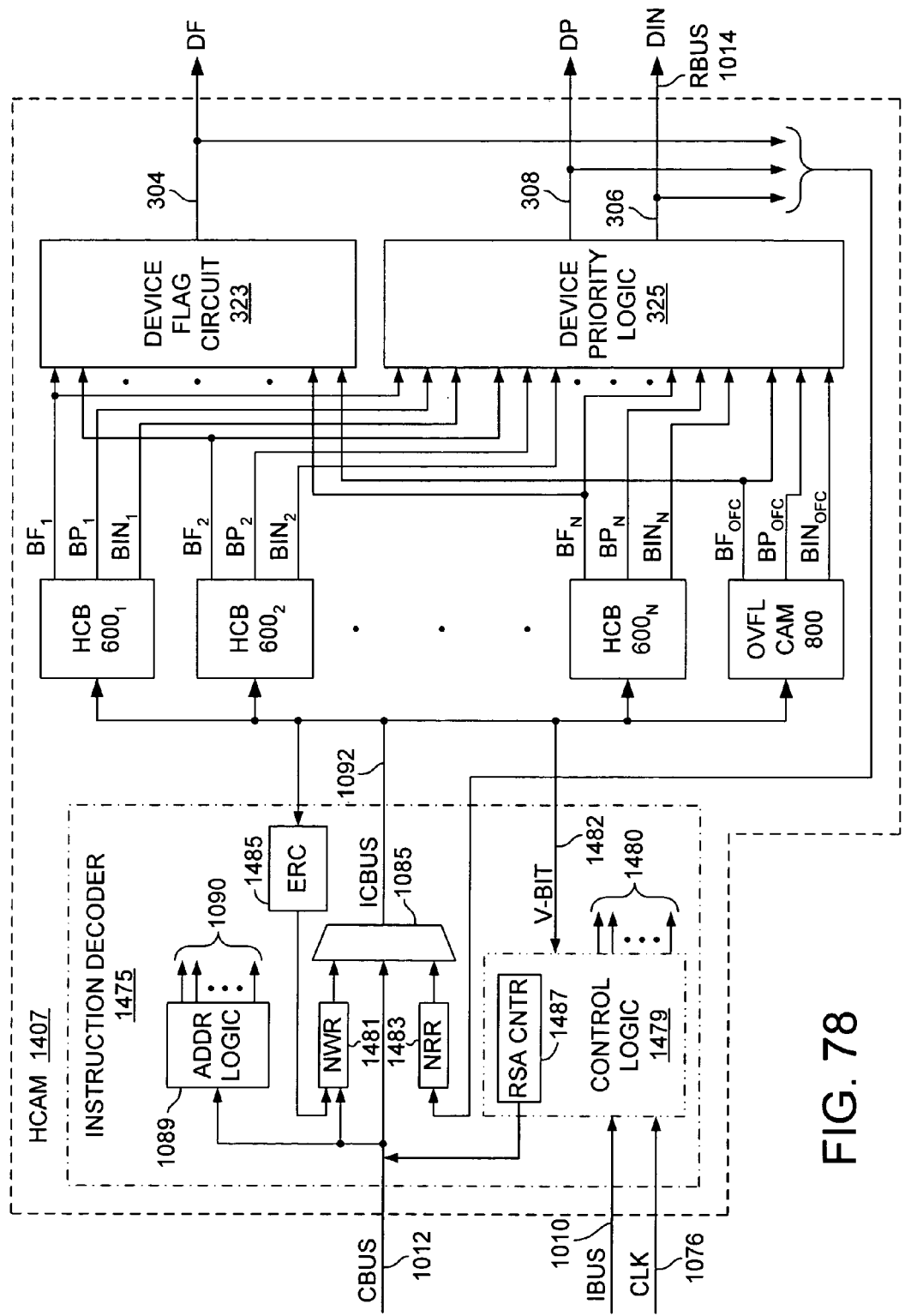
FIG. 78 illustrates an embodiment of a hash CAM that includes circuitry to perform background reinsertion operations.

FIG. 78 illustrates an embodiment of a hash CAM 1407 that includes circuitry to perform background reinsertion operations. The hash CAM 1407 includes hash CAM blocks $600_1$-$600_N$, overflow CAM block 800, device flag circuit 323, and device priority logic 325, all of which operate generally as described above in reference to FIG. 69. The hash CAM also includes an instruction decoder 1475 having control logic 1479, address logic 1089, NFA write register 1481 (NWR), NFA result register 1483 (NRR), multiplexer 1085 and, optionally, an entry reordering circuit 1485 (ERC). The instruction decoder 1475 operates generally as described above in reference to instruction decoder 1075 FIG. 69 to execute commands received via the instruction bus 1010 in conjunction with search values, entry candidates and configuration values received via the comparand bus 1012. Though not shown, the instruction decoder 1475 may additionally include the NRR FIFO 1087 and associated circuitry described in reference to FIGS. 69 and 71 to support block insertion operations, and block NFA read operations. Also, the component circuit blocks depicted within the instruction decoder 1475 may alternatively be disposed elsewhere within the hash CAM 1407.

The control logic circuit 1479 operates generally as described above in reference to the control logic 1079 of FIG. 69 to generate control signals 1480 (which may include substantially the same signals as control signals 1080 of FIG. 69), and additionally includes a relocation source address counter 1487 (RSA counter). Also, the control logic 1479 is coupled to at least one line of the internal comparand bus 1092 as shown by 1482 to receive the validity bit for entries read from the overflow CAM block 800. In alternative embodiments, the control logic 1479 may receive the validity bit from an alternative source, such as a status register. Also, the control logic 1479 may be coupled to additional lines of the internal comparand bus 1092 to receive entry size information from a tag value or other value read from the overflow CAM block 800.

Figure 79:
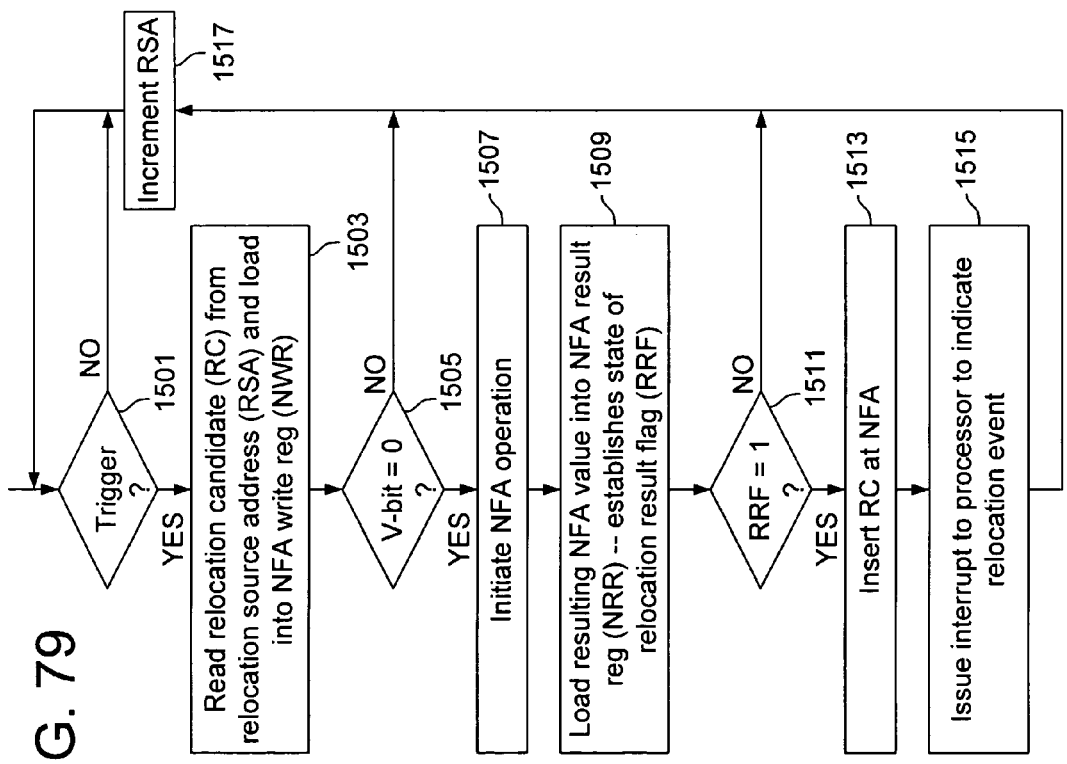
FIG. 79 is a flow diagram of a reinsertion operation performed within the hash CAM of FIG. 78.

Referring to both the flow diagram of FIG. 79 and the hash CAM of FIG. 78, the control logic 1475 initiates reinsertion operations within the CAM blocks $600_1$-$600_N$ and 800 in response to detecting a triggering event at 1501. In one embodiment, the triggering event is an idle state of the instruction bus; the control logic detects a temporary cessation of incoming commands and initiates a reinsertion operation. In alternative embodiments, the trigger event may be filling the overflow CAM block 800 to a threshold level (an overflow CAM block fill counter may be maintained within the control logic 1479 or elsewhere in the hash CAM 1407 for this purpose; the fill counter being incremented and decremented in response to insertions and deletions within the overflow CAM block 800), a threshold number of deletion operations within the hash CAM blocks $600_1$-$600_N$, a predetermined time interval, and so forth.

In response to the trigger event, the control logic outputs the content of the RSA counter 1487 onto the internal comparand bus 1092 during an address-phase of a multi-phase transfer, and asserts control signals 1480 as necessary to carry out a read operation at the indicated address. This operation is indicated at 1503 at FIG. 79. The overflow CAM block 800 responds to the control signals 1480 by outputting the RSA-counter-indicated relocation candidate onto the internal command bus 1092, with the validity bit of the relocation candidate being supplied via path 1482 to the control logic 1479. The control logic evaluates the validity bit at 1505 to determine whether a valid entry has been read. If not, the count value within the RSA counter 1487 is incremented at 1517 to point to the next relocation source address.

In one embodiment the relocation candidate read from the overflow CAM block 800 is stored within the NFA write register 1481, and therefore is available to be output onto the internal comparand bus 1092 in a subsequent NFA operation. That is, if a valid relocation candidate has been read and stored within the NFA write register 1481, the control logic 1479 initiates an NFA operation at 1507 to determine a reinsertion address for the relocation candidate. The entry reordering circuit 1485 is provided to restore the order of bits within the relocation candidate to the format used within an NFA operation. The entry reordering circuit may be omitted if the entry storage format and NFA format are the same. In an alternative embodiment, a register other than the NFA write register 1481 may be used to store the relocation candidate (and source the relocation candidate in the NFA operation at 1507) to avoid resource conflict in the event that a subsequent host request to write to the NFA write register 1481 is received. After the NFA operation initiated at 1507 is completed, the resulting NFA value is loaded into the NFA result register 1483 and selected bits of the NFA value are output from the NFA result register 1483 to generate a relocation result flag. This operation is illustrated in FIG. 79 at 1509. The relocation result flag is asserted if the NFA value indicates a valid relocation destination address within a hash CAM block 600 (i.e., one of hash CAM blocks $600_1$-$600_N$ is able to store the relocation candidate). Thus, at 1511, the control logic 1479 determines whether the relocation result flag is asserted and, if so, inserts the relocation candidate stored within the NFA write register 1481 at the relocation destination address indicated by the NFA value within the NFA result register 1483. This operation is indicated in FIG. 79 at 1513. After the relocation candidate has been inserted at the relocation destination address (or during the insertion of the relocation candidate), the hash CAM 1407 signals the completion of a successful reinsertion operation. In the embodiment of FIG. 79, the hash CAM signals a successful reinsertion by issuing an interrupt signal to the host processor, as shown at 1515. The host processor may then complete the relocation operation by performing a relocation within the associated memory, then issuing delete instructions to delete the relocation candidate from the overflow CAM block and to delete the associated data value from the relocation source address within the associated memory. In an alternative embodiment, the hash CAM may signal a successful reinsertion operation by setting one or more bits within a status register. The host processor may poll the hash CAM status from time to time to determine whether successful reinsertion operation has been completed.

Figure 80:
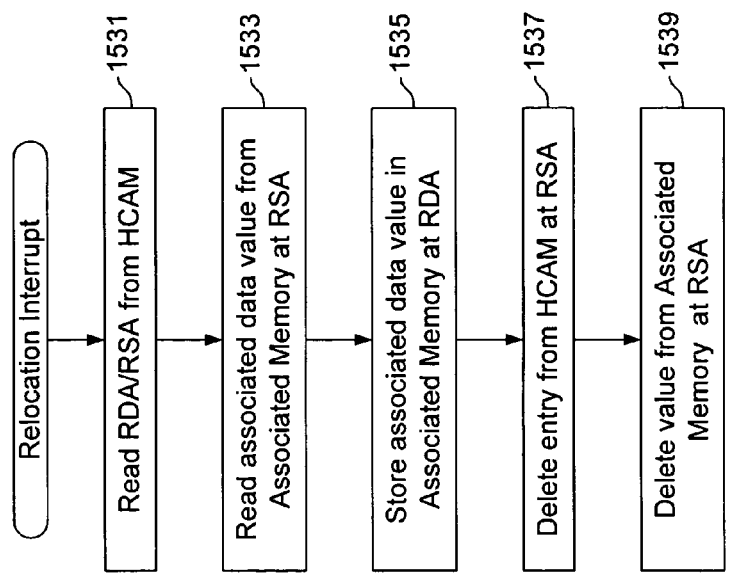
FIG. 80 illustrates an exemplary procedure carried out by the host processor in response to a relocation interrupt or other signal from the hash CAM of FIG. 78.

FIG. 80 illustrates an exemplary procedure carried out by the host processor in response to a relocation interrupt or other indication from the hash CAM (e.g., status value) that a successful reinsertion operation has been performed. At 1531, the host processor reads the relocation destination address and relocation source address from the hash CAM. In one embodiment, the contents of the RSA counter and the NFA result register are output onto respective portions of the comparand bus so that the relocation source and destination addresses may be obtained by the host processor in a single read operation. Alternatively, the relocation source and destination addresses may be obtained in successive reads from the hash CAM. In either case, at 1533, the processor reads the associated data value from the associated memory at the relocation source address. As discussed above, if a shadow database is maintained, the associated data read at 1533 may be omitted and the associated data value obtained from the shadow database. At 1535, the processor stores the associated data value within the associated memory at the relocation destination address, and at 1537 the processor issues a command to the hash CAM to delete the entry at the relocation source address (i.e., the entry within the overflow CAM block). Finally, at 1539, the processor deletes the corresponding associated data value from the associated memory at the relocation source address to conclude the relocation operation. Alternatively, the processor may simply update a shadow database to indicate that the associated data value is no longer part of the database. As with the relocation procedure described in reference to FIG. 77, the operations within the procedure of FIG. 80 may be reordered in a number of ways in different embodiments.

Reflecting on the operations described in reference to FIGS. 79 and 80, it should be noted that the insertion of the relocation candidate within the hash CAM at 1513 of FIG. 79 presents the opportunity for a premature match (i.e., a match that yields an index to an unoccupied location within the associated memory). This circumstance may be avoided, for example, by inserting the relocation candidate within the hash CAM in a reserve operation (i.e., reserve bit set as discussed above in reference to FIGS. 73-75), followed by an activation operation directed to the relocation destination address after the corresponding associated data value has been stored within the associated memory. In an alternative embodiment, a validity bit (or validity code) may be stored within unoccupied locations within the associated memory, thereby enabling the host processor to determine when a data value has been output from the associated memory in response to a premature match. Also, as discussed above, occasional premature matches may be tolerated in some systems.

Figure 81:
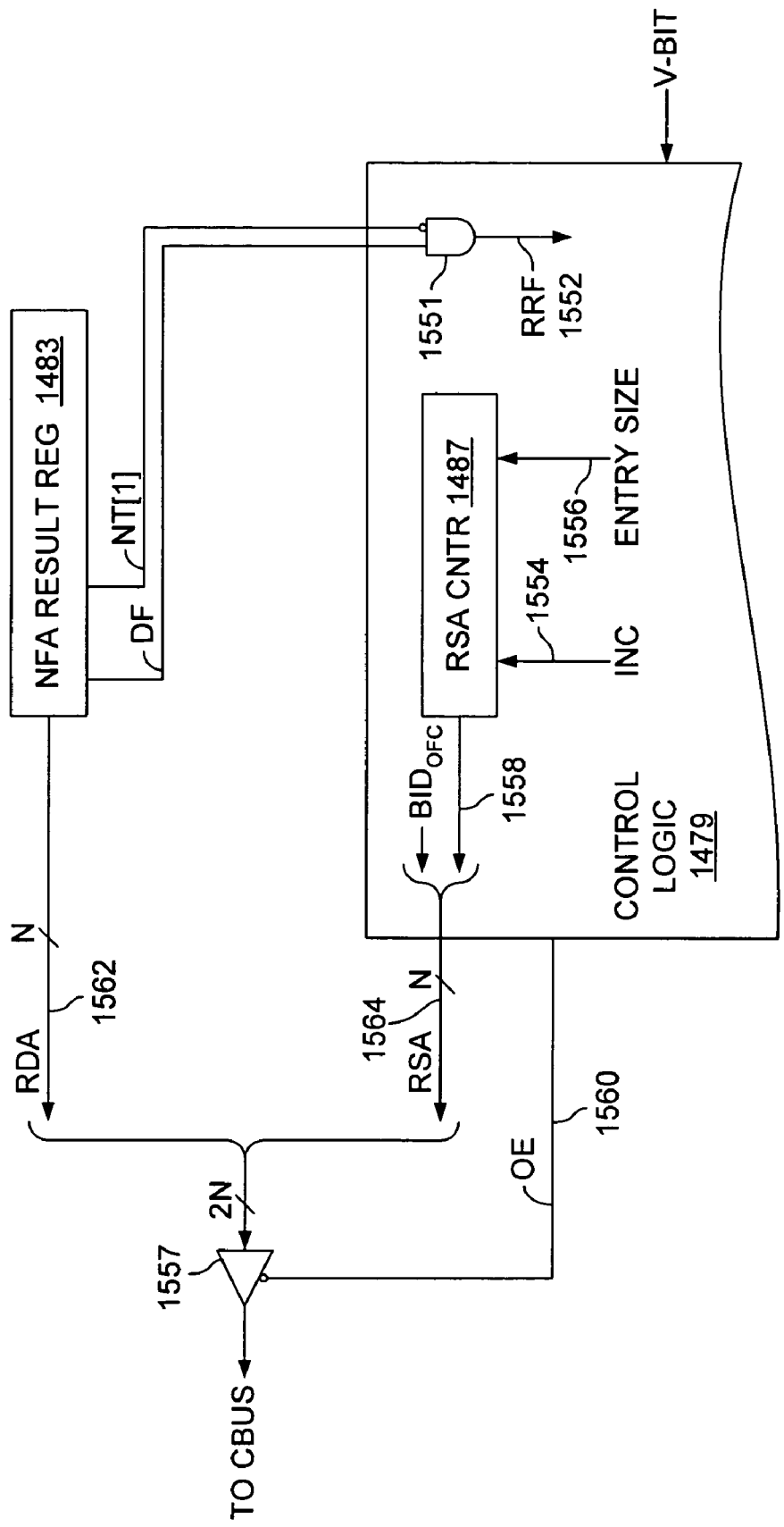
FIG. 81 illustrates selected components of the instruction decoder of FIG. 78.

FIG. 81 illustrates selected components of the instruction decoder 1475 of FIG. 78 according to an embodiment of the invention, including the NFA result register 1483 and a portion of the control logic 1479. The illustrated portion of the control register 1479 includes an RSA counter 1487 and logic AND gate 1551. The NFA result register 1483 operates generally as described above in reference to FIGS. 69 and 70 to store an NFA value that includes a device flag, NFA type value and device index. In one embodiment, the device flag (DF) is input to a non-inverting input of the logic AND gate 1551, and the most significant bit of the NFA type value, NT[1], is input to an inverting input of the logic AND gate 1551. By this arrangement, the logic AND gate 1551 will assert the above-described relocation result flag 1552 if the device flag is high, indicating a valid relocation destination address within the NFA result register, and NT[1] is low, indicating that the relocation destination address corresponds to a storage location within a hash CAM block.

In one embodiment, the RSA counter 1487 is a modulo counter that counts from zero up to the highest numbered row and segment within the overflow CAM block, then rolls back to zero. The count value within the RSA counter 1487 is incremented in response to an increment signal (generated, for example, by a state machine within the control logic 1479) and by an amount indicated by an entry size value 1556. Referring to step 1505 of FIG. 79, for example, if the validity bit for a table ID value read from the overflow CAM block indicates an unoccupied row, the entry size value 1556 is set to indicate the number of segments per row (e.g., 4) so that the RSA count is advanced to the next row of the overflow CAM at the next assertion of the increment signal 1554. As another example, if the entry size of a relocation candidate is determined (e.g., based on a value within the relocation candidate or by a separate read to obtain a table ID value) to be a single segment, then the entry size value 1556 is set to indicate a single segment, thereby causing the RSA counter 1487 to be incremented by one at the next assertion of the increment signal 1554. Similarly, if a relocation candidate is determined to span two segments within the overflow CAM, then the entry size value is set to indicate two segments so that the RSA counter 1487 will be incremented by two.

Still referring to FIG. 81, the device index component of the NFA value within the NFA result register 1483 forms a relocation destination address 1562. The RSA count 1558 within the RSA counter 1487, which represents a row and segment address value, is combined with a block ID value for the overflow CAM block ($BID_{OFC}$) to form a relocation source address 1564. The relocation source and destination addresses 1564 and 1562 are supplied to respective inputs of a tri-state, multi-bit output driver circuit 1557 coupled to the comparand bus. When a command to read the relocation source and destination addresses is received, the control logic 1479 asserts an output enable signal 1560 to the output driver circuit 1557 enable the relocation source and destination addresses onto respective signal lines of the comparand bus.

The section headings provided in this detailed description are for convenience of reference only, and in no way define, limit, construe or describe the scope or extent of such sections. Also, while the invention has been described with reference to specific exemplary embodiments thereof, it will be evident that various modifications and changes may be made thereto without departing from the broader spirit and scope of the invention. The specification and drawings are, accordingly, to be regarded in an illustrative rather than restrictive sense.

What is claimed is:

1. A method of operation within an integrated circuit device, the method comprising:
   receiving a plurality of values to be stored within the integrated circuit device;
   determining, for each of the plurality of values, whether a storage location is available for storage of the value within the integrated circuit device; and
   storing, for each of the plurality of values, an indication of whether a storage location is available for storage of the value.

2. The method of claim 1 wherein determining, for each of the plurality of values, whether a storage location is available for storage of the value comprises generating a storage address based on constituent bits of the value.

3. The method of claim 2 wherein generating a storage address based on constituent bits of the value comprises generating a hash index based on at least a subset of the constituent bits of the value.

4. The method of claim 2 wherein determining whether a storage location is available for storage of the value further comprises determining whether a storage location indicated by the storage address is occupied by a valid, previously stored value.

5. The method of claim 4 wherein determining whether the storage location indicated by the storage address is occupied by a valid, previously stored value comprises outputting a value from the storage location indicated by the storage address and determining whether a validity indicator within the value output from the storage location is in a first state.

6. The method of claim 1 wherein storing, for each of the plurality of values, an indication of whether a storage location is available for storage of the value comprises storing a plurality of flag values in a buffer, each flag value corresponding to a respective one of the plurality of values.

7. The method of claim 6 wherein each of the flag values has either a first state or a second state according to whether a storage location is available for storage of the corresponding one of the plurality of values.

8. The method of claim 6 wherein storing the plurality of flag values in a buffer comprises storing the plurality of flag values one after another in an ordered-entry storage circuit.

9. The method of claim 8 wherein storing the plurality of flag values one after another in an ordered-entry storage circuit comprises storing the plurality of flag values in a first-in-first-out storage buffer.

10. The method of claim 6 further comprising outputting the plurality of flag values from the integrated circuit device in response to one or more buffer read requests from an external device.

11. The method of claim 1 further comprising storing, for each of the plurality of values for which a storage location is available, an address of the storage location.

12. An integrated circuit device comprising:
    a memory;
    an external interface to receive a plurality of values to be stored within the memory;
    control circuitry to determine, for each of the plurality of values, whether a storage location within the memory is available to store the value; and
    a storage buffer to store, for each of the plurality of values, an indication of whether a storage location within the memory is available to store the value.

13. The integrated circuit device of claim 12 wherein the control circuitry comprises address generation circuitry to generate, for each of the plurality of values, a memory address based on constituent bits of the value.

14. The integrated circuit device of claim 13 wherein the address generation circuitry comprises a hash index generator to generate a hash index based on at least a subset of the constituent bits of the value.

15. The integrated circuit device of claim 13 wherein the control circuitry further comprises circuitry to read a value from the memory at the memory address generated by the address generating circuitry and to determine whether the memory address is occupied by a valid, previously stored value.

16. The integrated circuit device of claim 15 wherein the circuitry to determine whether the memory address is occupied by a valid, previously stored value comprises a circuit to determine whether a set of one or more validity bits within a value retrieved from the memory at the memory address is in a first state.

17. The integrated circuit device of claim 12 wherein the storage buffer comprises an ordered-entry storage circuit.

18. The integrated circuit device of claim 17 wherein the ordered-entry storage circuit is a first-in-first-out storage buffer.

19. The integrated circuit device of claim 12 wherein the storage buffer is coupled to the external interface to output, for each of the plurality of values, the indication of whether a storage location within the memory is available to store the value.

20. An integrated circuit device comprising:
    storage means;
    means for receiving a plurality of values to be stored within the storage means;
    means for determining, for each of the plurality of values, whether a storage location within the storage means is available to store the value; and
    means for storing, for each of the plurality of values, an indication of whether a storage location within the storage means is available to store the value.

* * * * *